United States Patent
Hatakeyama et al.

(10) Patent No.: US 11,281,103 B2
(45) Date of Patent: Mar. 22, 2022

(54) COMPOSITION FOR FORMING UPPER LAYER FILM, PATTERN FORMING METHOD, RESIST PATTERN, AND METHOD FOR MANUFACTURING ELECTRONIC DEVICE

(71) Applicant: FUJIFILM Corporation, Tokyo (JP)

(72) Inventors: Naoya Hatakeyama, Haibara-gun (JP); Naoki Inoue, Haibara-gun (JP); Naohiro Tango, Haibara-gun (JP); Michihiro Shirakawa, Haibara-gun (JP); Akiyoshi Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 41 days.

(21) Appl. No.: 15/700,518

(22) Filed: Sep. 11, 2017

(65) Prior Publication Data

US 2017/0371244 A1    Dec. 28, 2017

Related U.S. Application Data

(63) Continuation of application No. PCT/JP2016/052985, filed on Feb. 2, 2016.

(30) Foreign Application Priority Data

Mar. 31, 2015 (JP) .............................. JP2015-071831
Jul. 2, 2015 (JP) .............................. JP2015-133265

(51) Int. Cl.
| | | |
|---|---|---|
| *G03F 7/11* | (2006.01) | |
| *G03F 7/20* | (2006.01) | |
| *C08F 20/36* | (2006.01) | |
| *C08K 5/32* | (2006.01) | |
| *C08L 33/10* | (2006.01) | |
| *C08L 33/16* | (2006.01) | |
| *C08L 101/00* | (2006.01) | |
| *C08F 26/02* | (2006.01) | |
| *G03F 7/32* | (2006.01) | |
| *C09D 133/04* | (2006.01) | |
| *H01L 21/027* | (2006.01) | |
| *G03F 7/38* | (2006.01) | |
| *G03F 7/039* | (2006.01) | |
| *C08K 5/33* | (2006.01) | |

(52) U.S. Cl.
CPC ............... *G03F 7/11* (2013.01); *C08F 20/36* (2013.01); *C08F 26/02* (2013.01); *C08K 5/32* (2013.01); *C08L 33/10* (2013.01); *C08L 33/16* (2013.01); *C08L 101/00* (2013.01); *C09D 133/04* (2013.01); *G03F 7/2041* (2013.01); *G03F 7/32* (2013.01); *G03F 7/325* (2013.01); *H01L 21/027* (2013.01); *C08K 5/33* (2013.01); *G03F 7/0397* (2013.01)

(58) Field of Classification Search
CPC . G03F 7/11; G03F 7/2041; G03F 7/38; G03F 7/0397

USPC ....................................................... 430/273.1
See application file for complete search history.

(56) References Cited

U.S. PATENT DOCUMENTS

| | | | | |
|---|---|---|---|---|
| 5,472,823 A | * | 12/1995 | Hagiwara | ............. C07C 275/40 430/195 |
| 5,599,650 A | | 2/1997 | Bi et al. | |
| 5,658,706 A | * | 8/1997 | Niki | ...................... G03F 7/0045 430/176 |
| 8,048,607 B2 | * | 11/2011 | Iwai | ..................... C09B 23/0066 430/270.1 |
| 2005/0158662 A1 | * | 7/2005 | Furukawa | ............. G03F 7/0397 430/281.1 |
| 2006/0051699 A1 | * | 3/2006 | Baumann | ............... B41C 1/1008 430/270.1 |
| 2007/0224546 A1 | | 9/2007 | Suganaga et al. | |
| 2009/0047601 A1 | * | 2/2009 | Iwai | ...................... B41C 1/1008 430/285.1 |
| 2009/0197205 A1 | * | 8/2009 | Iwai | ...................... B41C 1/1008 430/286.1 |
| 2009/0202945 A1 | | 8/2009 | Nakagawa et al. | |
| 2009/0208867 A1 | * | 8/2009 | Harada | .................. G03F 7/0045 430/271.1 |
| 2009/0246696 A1 | * | 10/2009 | Iwai | ...................... B41C 1/1008 430/287.1 |

(Continued)

FOREIGN PATENT DOCUMENTS

| | | |
|---|---|---|
| CN | 101013265 A | 8/2007 |
| CN | 101395189 A | 3/2009 |

(Continued)

OTHER PUBLICATIONS

Communication dated Mar. 20, 2018 from the Japanese Patent Office in counterpart application No. 2017-509335.

(Continued)

*Primary Examiner* — John S Chu
(74) *Attorney, Agent, or Firm* — Sughrue Mion, PLLC

(57) ABSTRACT

A composition for forming an upper layer film is applied onto a resist film formed using an actinic ray-sensitive or radiation-sensitive resin composition, and includes a resin X and a compound A having a radical trapping group. A pattern forming method includes applying an actinic ray-sensitive or radiation-sensitive resin composition onto a substrate to form a resist film, applying the composition for forming an upper layer film onto the resist film to form an upper layer film on the resist film, exposing the resist film having the upper layer film formed thereon, and developing the exposed resist film using a developer including an organic solvent to form a pattern.

13 Claims, No Drawings

(56) References Cited

U.S. PATENT DOCUMENTS

| | | |
|---|---|---|
| 2013/0209940 A1 | 8/2013 | Sakamoto et al. |
| 2013/0244438 A1 | 9/2013 | Bae et al. |
| 2013/0323647 A1 | 12/2013 | Ohashi et al. |
| 2014/0212816 A1 | 7/2014 | Bae et al. |
| 2015/0192852 A1 | 7/2015 | Sato et al. |
| 2015/0338743 A1 | 11/2015 | Iwato |
| 2016/0041467 A1 | 2/2016 | Bae et al. |
| 2017/0176862 A1* | 6/2017 | Inoue ................ G03F 7/038 |

FOREIGN PATENT DOCUMENTS

| | | |
|---|---|---|
| CN | 103168274 A | 6/2013 |
| CN | 106605174 A | 4/2017 |
| JP | 7-140668 A | 6/1995 |
| JP | 2003-233172 A | 8/2003 |
| JP | 2005-266817 A | 9/2005 |
| JP | 2009-229773 A | 10/2009 |
| JP | 2011-180385 A | 9/2011 |
| JP | 2012-88387 A | 5/2012 |
| JP | 2013-61647 A | 4/2013 |
| JP | 2014-12815 A | 1/2014 |
| TW | 201307458 A1 | 2/2013 |
| TW | 201438058 A | 10/2014 |
| WO | 2014/045783 A1 | 3/2014 |

OTHER PUBLICATIONS

International Search Report of PCT/JP2016/052985 dated May 17, 2016 [PCT/ISA/210].

Written Opinion of PCT/JP2016/052985 dated May 17, 2016 [PCT/ISA/237].

International Preliminary Report on Patentability with the translation of Written Opinion dated Oct. 3, 2017 issued by the International Bureau in International application No. PCT/JP2016/052985.

Notification of Reasons for Refusal, dated Oct. 2, 2018, in corresponding Korean Application No. 10-2017-7026747, 9 pages in English and Korean.

Reasons for rejection decision dated Apr. 12, 2019 issued by the Korean Intellectual Property Office in Translation corresponding Korean Application No. 10-2017-7026747.

Communication dated Oct. 5, 2019, from the Taiwanese Intellectual Property Office in application No. 105103643.

Communication dated Jul. 2, 2019, from the Intellectual Property Office of Taiwan in counterpart English application No. 105103643.

Communication dated Mar. 10, 2020, from The State Intellectual Property Office of the P.R. of China in Chinese Application No. 201680017158.7.

Communication dated Aug. 12, 2020, from The State Intellectual Property Office of the P.R. of China in Chinese Application No. 201680017158.7.

* cited by examiner

COMPOSITION FOR FORMING UPPER LAYER FILM, PATTERN FORMING METHOD, RESIST PATTERN, AND METHOD FOR MANUFACTURING ELECTRONIC DEVICE

This application is a Continuation of PCT International Application No. PCT/JP2016/052985 filed on Feb. 2, 2016, which claims priority under 35 U.S.C § 119(a) to Japanese Patent Application No. 2015-071831 filed on Mar. 31, 2015, and Japanese Patent Application No. 2015-133265 filed on Jul. 2, 2015. Each of the above application(s) is hereby expressly incorporated by reference, in its entirety, into the present application.

BACKGROUND OF THE INVENTION

1. Field of the Invention

The present invention relates to a composition for forming an upper layer film, a pattern forming method using the composition for forming an upper layer film, a resist pattern formed by the pattern forming method, and a method for manufacturing an electronic device, including the pattern forming method.

2. Description of the Related Art

In processes for manufacturing semiconductor devices such as an IC in the related art, microfabrication by means of lithography using various resist compositions has been carried out. For example, JP2013-061647A describes "a method for forming an electronic device, including (a) providing a semiconductor base including one or more layers on which a pattern is formed; (b) forming a photoresist layer on the one or more layers on which a pattern is formed; (c) applying a photoresist topcoat composition onto the photoresist layer, in which the topcoat composition includes a basic quencher, a polymer, and an organic solvent; (d) exposing the layer with chemical rays; and (e) developing the exposed film with an organic solvent developer".

SUMMARY OF THE INVENTION

The present inventors have formed a resist pattern by forming an upper layer film (topcoat) onto a resist film using a composition including the "basic quencher" described in JP2013-061647A, and subjecting the film to exposure and development. As a result, they have found that exposure latitude (EL), focus latitude (DOF: Depth Of Focus), and sensitivity may be insufficient in some cases.

The present invention has been made taking consideration of the above aspects, and thus has objects to provide a composition for forming an upper layer film, capable of providing good EL, DOF, and sensitivity, a pattern forming method using the composition for forming an upper layer film, a resist pattern formed by the pattern forming method, and a method for manufacturing an electronic device, including the pattern forming method.

The present inventors have found that the objects are accomplished by adopting the following configurations. That is, the present invention provides [1] to [8] below.

[1] A composition for forming an upper layer film, which is applied onto a resist film formed using an actinic ray-sensitive or radiation-sensitive resin composition, the composition for forming an upper layer film comprising: a resin X; and a compound A having a radical trapping group.

[2] The composition for forming an upper layer film as described in [1], in which the compound A having a radical trapping group is a compound having at least one group selected from the group consisting of a hindered phenol group, a hydroquinone group, an N-oxyl-free radical group, a nitroso group, and a nitrone group.

[3] The composition for forming an upper layer film as described in [1] or [2], in which the compound A having a radical trapping group is a compound having a nitrogen-oxygen bond.

[4] The composition for forming an upper layer film as described in any one of [1] to [3], in which the compound A having a radical trapping group is a compound represented by any one of General Formulae (1) to (3).

(1)

(2)

(3)

In General Formulae (1) to (3), $R_1$ to $R_6$ each independently represent an alkyl group, a cycloalkyl group, or an aryl group. In Formula (1), $R_1$ and $R_2$ may be bonded to each other to form a ring, and in Formula (3), at least two of $R_4, \ldots,$ or $R_6$ may be bonded to each other to form a ring.

[5] The composition for forming an upper layer film as described in any one of [1] to [4], in which the resin X includes a repeating unit having at least three $CH_3$ partial structures in the side chain moiety.

[6] A pattern forming method comprising: applying an actinic ray-sensitive or radiation-sensitive resin composition onto a substrate to form a resist film; applying the composition for forming an upper layer film as described in any one of [1] to [5] onto the resist film to form an upper layer film on the resist film; exposing the resist film having the upper layer film formed thereon; and developing the exposed resist film using a developer including an organic solvent to form a pattern.

[7] A resist pattern formed by the pattern forming method as described in [6].

[8] A method for manufacturing an electronic device, comprising: the pattern forming method as described in [6].

According to the present invention, it is possible to provide a composition for forming an upper layer film, capable of providing good EL, DOF, and sensitivity, a pattern forming method using the composition for forming an upper layer film, a resist pattern formed by the pattern forming method, and a method for manufacturing an electronic device, including the pattern forming method.

DESCRIPTION OF THE PREFERRED EMBODIMENTS

Hereinafter, specific aspects for carrying out the present invention will be described.

Moreover, in citations for a group (atomic group) in the present specification, in a case where the group is denoted without specifying whether it is substituted or unsubstituted, the group includes both a group not having a substituent and a group having a substituent. For example, an "alkyl group" includes not only an alkyl group not having a substituent (unsubstituted alkyl group), but also an alkyl group having a substituent (substituted alkyl group).

"Actinic rays" or "radiation" in the present specification means, for example, a bright line spectrum of a mercury lamp, far ultraviolet rays represented by an excimer laser, extreme ultraviolet rays (EUV light), X-rays, electron beams, or the like. In addition, in the present invention, light means actinic rays or radiation. Furthermore, unless otherwise specified, "exposure" in the present specification includes not only exposure by a bright line spectrum of a mercury lamp, far ultraviolet rays represented by an excimer laser, X-rays, EUV light, or the like, but also writing by particle rays such as electron beams and ion beams.

The composition (hereinafter also referred to as a "topcoat composition") for forming an upper layer film of the present invention is a composition for forming an upper layer film, which is applied onto a resist film using formed using an actinic ray-sensitive or radiation-sensitive resin composition, to form an upper layer film, in which the composition includes a resin X and a compound A having a radical trapping group.

It is presumed that good exposure latitude (EL), focus latitude (DOF), and sensitivity are obtained by using such the topcoat composition of the present invention.

First, in a so-called negative tone pattern forming method, in which the unexposed area of a resist film is dissolved in a developer including an organic solvent (hereinafter also referred to as an "organic developer"), the area remaining as the resist pattern is defined as the exposed area. Here, since the exposure is carried out on the side opposite to the substrate side of the resist film, the exposure dose is relatively higher around the surface of the side opposite to the substrate side of the resist film rather than the substrate side part and the central part. In such a case, an excess acid is generated in the vicinity of the surface of the resist film, the acid is diffused to the near unexposed areas, and as a result, the cross-section of the resist pattern after the development is not rectangular, but may be T-top shaped in some cases.

However, by forming an upper layer film (hereinafter also referred to as a "topcoat") on the resist film using the topcoat composition of the present invention, the compound A having a radical trapping group in the topcoat moves to the vicinity of the surface of the resist film. Thus, the generation and/or the diffusion of the acid in the vicinity of the surface of the resist film is/are suppressed, and as a result, the cross-section of the resist pattern after the development is suppressed from being T-top shaped. Thus, good EL is obtained.

Furthermore, the resist film may include a basic compound as a quencher in some cases, but in this case, the acid is in the state where it is hardly diffused in the vicinity of the boundary with the unexposed area of the resist film. This is thought to be caused by the acid generated in the exposed area of the resist which hardly moves toward the unexposed area due to the presence of a quencher in the unexposed area of the resist film.

However, in a case of forming a topcoat on the resist film using the topcoat composition of the present invention, the quencher in the unexposed area of the resist film is withdrawn to the compound A having a radical trapping group in the topcoat, and the amount of the quencher to be present is decreased. As a result, the acid is in the state where it is easily diffused even in the vicinity of the boundary between the exposed area and the unexposed area of the resist film. Thus, good DOF is obtained.

Furthermore, in a case of forming a topcoat on a resist film using a composition including a "basic quencher" described in JP2013-061647A, there is a possibility that the "basic quencher" excessively moves into the resist film from the topcoat, and thus, the diffusion into the exposed area of the resist film can be excessively inhibited.

However, in a case of forming a topcoat using the topcoat composition of the present invention, similarly in this case, the compound A having a radical trapping group moves into the resist film and the movement only reaches the vicinity of the surface of the resist film, and as a result, the diffusion in the exposed area of the resist film is suppressed from being excessively inhibited. Thus, good sensitivity is obtained.

Hereinafter, the pattern forming method of the present invention will be first described, and thereafter, the actinic ray-sensitive or radiation-sensitive resin composition (hereinafter also conveniently referred to as "the resist composition of the present invention"), and then the composition for forming an upper layer film of the present invention ("the topcoat composition of the present invention"), each of which is used in the pattern forming method of the present invention, will be described.

[Pattern Forming Method]

The pattern forming method of the present invention is a pattern forming method including a step a of applying an actinic ray-sensitive or radiation-sensitive resin composition onto a substrate to form a resist film, a step b of applying the composition for forming an upper layer film, which will be described later, onto the resist film to form an upper layer film on the resist film, a step c of exposing the resist film having the upper layer film formed thereon, and a step d of developing the exposed resist film using a developer including an organic solvent to form a pattern.

<Step a>

In the step a, the resist composition of the present invention is applied onto a substrate to form a resist film (actinic ray-sensitive or radiation-sensitive film). The application method is not particularly limited, and a spin coating method, a spray method, a roll coating method, a dip method, or the like, which is known in the related art, can be used, with the spin coating method being preferable.

After applying the resist composition of the present invention, the substrate may be heated (prebaked), as desired. Thus, a film from which insoluble residual solvents have been removed can be uniformly formed. The temperature for prebake is not particularly limited, but is preferably 50° C. to 160° C., and more preferably 60° C. to 140° C.

The substrate on which the resist film is formed is not particularly limited, and it is possible to use a substrate generally used in a process for manufacturing a semiconductor such as an IC, a process for manufacturing a circuit board for a liquid crystal, a thermal head, or the like, and other lithographic processes of photofabrication, and examples thereof include inorganic substrates such as silicon, $SiO_2$, and SiN, and coating type inorganic substrates such as SOG.

Prior to forming the resist film, an antireflection film may be applied onto the substrate in advance.

As the antireflection film, any type of an inorganic film type such as titanium, titanium dioxide, titanium nitride, chromium oxide, carbon, and amorphous silicon, and an organic film type formed of a light absorber and a polymer material can be used. In addition, as the organic antireflection film, a commercially available organic antireflection film such as DUV-30 series or DUV-40 series manufactured by Brewer Science, Inc., AR-2, AR-3, or AR-5 manufactured by Shipley Company, L.L.C., or ARC series such as ARC29A manufactured by Nissan Chemical Industries, Ltd. can also be used.

<Step b>

In the step b, the topcoat composition of the present invention which will be described later is applied onto the resist film formed in the step a, and then heated (prebaked (PB)), as desired, to form an upper layer film (hereinafter also referred to as a "topcoat") on the resist film.

For the reason that the effect of the present invention is more excellent, the temperature for prebaking in the step b (hereinafter also referred to as a "PB temperature") is, for example, 80° C. or higher, preferably 100° C. or higher, more preferably 105° C. or higher, and still more preferably 110° C. or higher.

The upper limit value of the PB temperature is not particularly limited, but is, for example, 200° C. or lower, preferably 170° C. or lower, more preferably 160° C. or lower, and still more preferably 150° C. or lower.

In a case where the exposure of the step c which will be described later is liquid immersion exposure, the topcoat is arranged between the resist film and the immersion liquid, and the resist film functions as a layer which is not brought into direct contact with the immersion liquid. In this case, preferred characteristics required for the topcoat (topcoat composition) are coating suitability onto the resist film, radiation, transparency, particularly to light at 193 nm, and poor solubility in an immersion liquid (preferably water). Further, it is preferable that the topcoat is not mixed with the resist film, and can be uniformly applied onto the surface of the resist film.

Moreover, in order to uniformly apply the topcoat composition onto the surface of the resist film while not dissolving the resist film, it is preferable that the topcoat composition contains a solvent in which the resist film is not dissolved. It is more preferable that as the solvent in which the resist film is not dissolved, a solvent of components other than an organic developer which will be described later. A method for applying the topcoat composition is not particularly limited, and a spin coating method, a spray method, a roll coating method, a dip method, or the like known in the related art can be used.

From the viewpoint of the transparency to 193 nm of the topcoat composition, it is preferable that the topcoat composition contains a resin substantially not having aromatics. Specifically, examples of the resin include a resin having at least one of a fluorine atom or a silicon atom, which will be described later, and a resin having a repeating unit having a $CH_3$ partial structure in the side chain moiety, but is not particularly limited as long as it is dissolved in a solvent in which the resist film is not dissolved.

The film thickness of the topcoat is not particularly limited, but from the viewpoint of transparency to an exposure light source, the topcoat with a thickness of usually 5 nm to 300 nm, preferably 10 nm to 300 nm, more preferably 20 nm to 200 nm, and still more preferably 30 nm to 100 nm is formed.

After forming the topcoat, the substrate is heated, as desired.

From the viewpoint of resolution, it is preferable that the refractive index of the topcoat is close to that of the resist film.

The topcoat is preferably insoluble in an immersion liquid, and more preferably insoluble in water.

A receding contact angle of water on a surface (the surface on the side opposite to the resist film in the topcoat) of the film (topcoat) formed by the topcoat composition of the present invention is 70° or more, more preferably 80° or more, and still more preferably 80° to 100° from the viewpoints of immersion liquid followability and the like.

Furthermore, an advancing contact angle of water on a surface of the topcoat is not particularly limited, but is preferably 90° to 1200, and more preferably 90° to 1100°.

In the present invention, the receding contact angle and the advancing contact angle of water on a surface of the topcoat are measured as follows.

The topcoat composition is coated on a silicon wafer by spin coating, and dried at 100° C. for 60 seconds to form a film (with a film thickness of 120 nm), and the advancing contact angle and the receding contact angle of water droplets are measured by an expansion/contraction method, using a dynamic contact angle meter (for example, manufactured by Kyowa Interface Science Co. Ltd.).

That is, liquid droplets (initial liquid droplet size of 35 µL) were added dropwise onto the surface of a film (topcoat), and then discharged or sucked at a rate of 6 µL/sec for 5 seconds, and the advancing contact angle at which the dynamic contact angle during the discharge is stabilized, and the receding contact angle at which the dynamic contact angle during the suction is stabilized are determined. The measurement environment is at 23° C.±3° C. and the relative humidity is 45%±5%.

In the liquid immersion exposure, in a view that the immersion liquid needs to move on a wafer following the movement of an exposure head that is scanning the wafer at a high speed and forming an exposure pattern, the contact angle of the immersion liquid with respect to the resist film in a dynamic state is important, and in order to obtain better resist performance, the immersion liquid preferably has a receding contact angle in the above range.

In a case where the topcoat is released, an organic developer which will be described later may be used, and another release agent may also be used. As the release agent, a solvent hardly permeating the resist film is preferable. In a view that the release of the topcoat can be carried out simultaneously with the development of the resist film, the topcoat is preferably releasable with an organic developer. The organic developer used for the release is not particularly limited as long as it makes it possible to dissolve and remove a less exposed area of the resist film. The organic developer can be selected from developers including a polar solvent such as a ketone-based solvent, an ester-based solvent, an alcohol-based solvent, an amide-based solvent, and an ether-based solvent, and a hydrocarbon-based solvent, which will be described later. A developer including a ketone-based solvent, an ester-based solvent, an alcohol-based solvent, or an ether-based solvent is preferable, a developer including an ester-based solvent is more preferable, and a developer including butyl acetate is still more preferable. The release of the topcoat may be carried out simultaneously with the development of the resist film, and it is preferable that the release of the topcoat using an organic developer and the development of the resist film are carried out simultaneously.

From the viewpoint of the release using an organic developer, the dissolution rate of the topcoat in the organic developer is preferably 1 to 300 nm/sec, and more preferably 10 to 100 nm/sec.

Here, the dissolution rate of a topcoat in the organic developer refers to a film thickness decreasing rate in a case where the topcoat is exposed to a developer after film formation, and is a rate in a case where the topcoat is immersed in a butyl acetate solution at 23° C. in the present invention.

An effect of reducing development defects after developing a resist film is accomplished by setting the dissolution rate of a topcoat in the organic developer to 1 nm/sec or more, and preferably 10 nm/sec or more. Further, an effect that the line edge roughness of a pattern after the development of the resist film becomes better is accomplished as an effect of reducing the exposure unevenness during liquid immersion exposure by setting the dissolution rate to 300 nm/sec or less, and preferably 100 nm/sec.

The topcoat may also be removed using other known developers, for example, an aqueous alkali solution. Specific examples of the usable aqueous alkali solution include an aqueous tetramethylammonium hydroxide solution.

A step of applying a pre-wetting solvent on the resist film may be included between the step a and the step b. Thus, the coatability of the topcoat composition is improved, and thus, it can be accomplished to save the liquid.

The pre-wetting solvent is not particularly limited as long as it is less soluble in a resist film, but for example, a pre-wetting solvent for a topcoat, containing at least one selected from the group consisting of an alcohol-based solvent, a fluorine-based solvent, an ether-based solvent, a hydrocarbon-based solvent, and an ester-based solvent.

From the viewpoint of coatability, the alcohol-based solvent is preferably a monohydric alcohol, and more preferably a monohydric alcohol having 4 to 8 carbon atoms.

As the monohydric alcohol having 4 to 8 carbon atoms, a linear, branched, or cyclic alcohol can be used, but a linear or branched alcohol is preferable. As such an alcohol-based solvent, for example, alcohols such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycols such as ethylene glycol, propylene glycol, diethylene glycol, and triethylene glycol; glycol ethers such as ethylene glycol monomethyl ether, propylene glycol monomethyl ether, diethylene glycol monomethyl ether, triethylene glycol monoethyl ether, and methoxymethylbutanol; or the like can be used. Among those, alcohol and glycol ether are preferable, and 1-butanol, 1-hexanol, 1-pentanol, 3-methyl-1-butanol, 4-methyl-1-pentanol, 4-methyl-2-pentanol, and propylene glycol monomethyl ether are more preferable.

Examples of the ether-based solvent include dipropyl ether, diisopropyl ether, butylmethyl ether, butylethyl ether, butylpropyl ether, dibutyl ether, diisobutyl ether, tert-butylmethyl ether, tert-butylethyl ether, tert-butylpropyl ether, di-tert-butyl ether, dipentyl ether, diisoamyl ether, cyclopentylmethyl ether, cyclohexylmethyl ether, cyclopentylethyl ether, cyclohexylethyl ether, cyclopentylpropyl ether, cyclopentyl-2-propyl ether, cyclohexylpropyl ether, cyclohexyl-2-propyl ether, cyclopentylbutyl ether, cyclopentyl-tert-butyl ether, cyclohexylbutyl ether, and cyclohexyl-tert-butyl ether.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine.

Among these, a fluorinated alcohol and a fluorinated hydrocarbon-based solvent can be suitably used.

Examples of the hydrocarbon-based solvent include aromatic hydrocarbon-based solvents such as toluene, xylene, and anisole; and aliphatic hydrocarbon-based solvents such as n-heptane, n-nonane, n-octane, n-decane, 2-methylheptane, 3-methylheptane, 3,3-dimethylhexane, and 2,3,4-trimethylpentane.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, and butyl propionate.

These solvents are used singly or as a mixture of a plurality of kinds thereof.

By mixing a solvent other than the above-mentioned solvents, the solubility for the resist film, the solubility of the resin in the topcoat composition, the elution characteristics from the resist film, or the like can be appropriately adjusted.

<Step c>

The exposure in the step c can be carried out by a generally known method, and for example, a resist film having a topcoat formed thereon is irradiated with actinic rays or radiation through a predetermined mask. Here, the resist film is preferably irradiated with actinic rays or radiation through an immersion liquid, but are not limited thereto. The exposure dose can be appropriately set, but is usually 1 to 100 mJ/cm$^2$.

The wavelength of the light source used in the exposure device in the present invention is not particularly limited, but light at a wavelength of 250 nm or less is preferably used, and examples of include KrF excimer laser light (248 nm), ArF excimer laser light (193 nm), F$_2$ excimer laser light (157 nm), EUV light (13.5 nm), and electron beams. Among these, ArF excimer laser light (193 nm) is preferably used.

In a case of carrying out liquid immersion exposure, before the exposure and/or after the exposure, the surface of the film may be washed with a water-based chemical before carrying out the heating which will be described later.

The immersion liquid is preferably a liquid which is transparent to exposure wavelength and has a minimum temperature coefficient of a refractive index so as to minimize the distortion of an optical image projected on the film. In particular, in a case where the exposure light source is an ArF excimer laser light (wavelength; 193 nm), water is preferably used in terms of easy availability and easy handling, in addition to the above-mentioned viewpoints.

In a case of using water, an additive (liquid) that decreases the surface tension of water while increasing the interfacial activity may be added at a slight proportion. It is preferable that this additive does not dissolve the resist film on a substrate, and has a negligible effect on the optical coat at the undersurface of a lens element. Water to be used is preferably distilled water. Further, pure water which has been subjected to filtration through an ion exchange filter or the like may also be used. Thus, it is possible to suppress the distortion of an optical image projected on the resist film by the incorporation of impurities.

In addition, in a view of further improving the refractive index, a medium having a refractive index of 1.5 or more can also be used. This medium may be an aqueous solution or an organic solvent.

The pattern forming method of the present invention may also have the step c (exposing step) carried out plural times. In the case, exposure to be carried out plural times may use the same light source or different light sources, but for the first exposure, ArF excimer laser light (wavelength; 193 nm) is preferably used.

After the exposure, it is preferable to perform heating (baked, hereinafter also referred to as "PEB": Post Exposure Bake) and development (preferably further rinsing). Thus, a good pattern can be obtained. The temperature for PEB is not particularly limited as long as a good resist pattern is obtained, and is usually 40° C. to 160° C., preferably 60° C. to 130° C., and more preferably 70° C. to 110° C. PEB may be carried out once or plural times. The time for one run of PEB is, for example, 30 seconds to 120 seconds.

<Step d>

The pattern forming method of the present invention includes a developing step. A developer is not particularly limited, and examples thereof include an alkali developer and a developer including an organic solvent.

For the alkali developer, an aqueous alkali solution including an alkali is preferably used. The type of the aqueous alkali solution is not particularly limited, but examples thereof include aqueous alkali solutions including a quaternary ammonium salt typically such as tetramethyl-ammonium hydroxide, an inorganic alkali, primary amine, secondary amine, tertiary amine, alcoholamine, cyclic amine, and the like. Among these, an aqueous solution of a quaternary ammonium salt, typically such as tetramethyl-ammonium hydroxide (TMAH), is preferable.

From the viewpoint that the release and the development of a topcoat can be carried out simultaneously, it is preferable to carry out development using a developer including an organic solvent.

In the step d, a negative tone resist pattern is formed by carrying out development using a developer including an organic solvent. The step d is preferably a step of removing soluble areas of the resist film simultaneously.

Examples of the developer including an organic solvent, which is used in the step d, include developers containing a polar solvent such as a ketone-based solvent, an ester-based solvent, an alcohol-based solvent, an amide-based solvent, and an ether-based solvent, and a hydrocarbon-based solvent.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, butyl butanoate, isobutyl isobutyrate, and butyl propionate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, propylene glycol, diethylene glycol, and triethylene glycol; and glycol ether-based solvents such as ethylene glycol monomethyl ether, propylene glycol monomethyl ether, diethylene glycol monomethyl ether, triethylene glycol monoethyl ether, and methoxymethylbutanol.

Examples of the ether-based solvent include, in addition to the glycol ether-based solvents above, dioxane, and tetrahydrofuran. Further, the ether-based solvents described as the above-mentioned pre-wetting solvent can also be suitably used.

As the amide-based solvent, for example, N-methyl-2-pyrrolidone, N,N-dimethylacetamide, N,N-dimethylformamide, hexamethylphosphoric triamide, and 1,3-dimethyl-2-imidazolidinone can be used.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed and used, or the solvent may be mixed with a solvent other than those described above or with water, and used. However, in order to sufficiently bring out the effect of the present invention, the moisture content in the entire developer is preferably less than 10% by mass, and it is more preferable that the developer contains substantially no moisture.

That is, the content of the organic solvent with respect to the organic developer is preferably from 90% by mass to 100% by mass, and more preferably from 95% by mass to 100% by mass, with respect to the total amount of the developer.

Among these, as the organic developer, a developer containing at least one organic solvent selected from the group consisting of a ketone-based solvent, an ester-based solvent, an alcohol-based solvent, an amide-based solvent, and an ether-based solvent is preferable, a developer including a ketone-based solvent or an ester-based solvent is more preferable, and a developer including butyl acetate, butyl propionate, or 2-heptanone is still more preferable.

The vapor pressure of the organic developer is preferably 5 kPa or less, more preferably 3 kPa or less, and still more preferably 2 kPa or less, at 20° C. By setting the vapor pressure of the organic developer to 5 kPa or less, the evaporation on a substrate or in a development cup of the developer is suppressed, and the temperature evenness within a wafer plane is improved, whereby the dimensional evenness within a wafer plane is enhanced.

Specific examples of the solvent having a vapor pressure of 5 kPa or less (2 kPa or less) include the solvents described in paragraph <0165> of JP2014-71304A.

An appropriate amount of a surfactant may be added to the organic developer, as desired.

The surfactant is not particularly limited, and for example, an ionic or nonionic, fluorine- and/or silicon-based surfactant can be used. Examples of such a fluorine- and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP- S63-34540A), JP1995-230165A (JP-H07-230165A), JP1996-62834A (JP-H08-62834A), JP1997-54432A (JP-H09-54432A), JP1997-5988A (JP-H09-5988A), and U.S. Pat. Nos. 5,405,720A, 5,360,692A, 5,529,881A, 5,296,330A, 5,436,098A, 5,576,143A, 5,294,511A, and U.S. Pat. No. 5,824,451A, with the nonionic surfactant being preferable. The nonionic surfactant is not particularly limited, but the fluorine-based surfactant or the silicon-based surfactant is more preferably used.

The amount of the surfactant to be used is usually 0.001% to 5% by mass, preferably 0.005% to 2% by mass, and more preferably 0.01% to 0.5% by mass, with respect to the total amount of the developer.

The organic developer may also include a basic compound. Specific and preferred examples of the basic compound which can be included in the organic developer used in the present invention include those which will be described as the basic compounds which can be included in the actinic ray-sensitive or radiation-sensitive resin composition.

Examples of the developing method include a method in which a substrate is immersed in a tank filled with a developer for a certain period of time (a dip method), a method in which a developer is heaped up to the surface of a substrate by surface tension and developed by stopping for a certain period of time (a paddle method), a method in which a developer is sprayed on the surface of a substrate (a spray method), and a method in which a developer is continuously discharged on a substrate rotated at a constant rate while scanning a developer discharging nozzle at a constant rate (a dynamic dispense method).

In addition, after the step of carrying out development using a developer including an organic solvent, a step of stopping the development while replacing the solvent with another solvent may also be included.

A washing step using a rinsing liquid may be included after the step of carrying out development using a developer including an organic solvent.

The rinsing liquid is not particularly limited as long as it does not dissolve the resist pattern, and a solution including a general organic solvent can be used. As the rinsing liquid, for example, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent, described above as the organic solvent included in the organic developer is preferably used. More preferably, a step of carrying out washing using a rinsing liquid containing at least one organic solvent selected from the group consisting of a hydrocarbon-based solvent, a ketone-based solvent, an ester-based solvent, an alcohol-based solvent, and an amide-based solvent is carried out. Still more preferably, a step of carrying out washing using a rinsing liquid containing a hydrocarbon-based solvent, an alcohol-based solvent, or an ester-based solvent is carried out. Particularly preferably, a step of carrying out washing using a rinsing liquid containing a monohydric alcohol is carried out. In addition, hydrocarbon-based solvents such as decane and undecane are also preferable.

Here, examples of the monohydric alcohol used in the rinsing step include linear, branched, or cyclic monohydric alcohols, and specifically, 1-butanol, 2-butanol, 3-methyl-1-butanol, 3-methyl-2-butanol, tert-butyl alcohol, 1-pentanol, 2-pentanol, 3-methyl-2-pentanol, 4-methyl-2-pentanol, 1-hexanol, 2-hexanol, 3-hexanol, 4-methyl-2-hexanol, 5-methyl-2-hexanol, 1-heptanol, 2-heptanol, 3-heptanol, 4-methyl-2-heptanol, 5-methyl-2-heptanol, 1-octanol, 2-octanol, 3-octanol, 4-octanol, 4-methyl-2-octanol, 5-methyl-2-octanol, 6-methyl-2-octanol, 2-nonanol, 4-methyl-2-nonanol, 5-methyl-2-nonanol, 6-methyl-2-nonanol, 7-methyl-2-nonanol, 2-decanol, or the like can be used, with 1-hexanol, 2-hexanol, 1-pentanol, 3-methyl-1-butanol, or 4-methyl-2-heptanol being preferable.

Furthermore, examples of the hydrocarbon-based solvent used in the rinsing step include aromatic hydrocarbon-based solvents such as toluene and xylene; and aliphatic hydrocarbon-based solvents such as pentane, hexane, octane, decane (n-decane), and undecane.

In a case where an ester-based solvent is used as the rinsing liquid, a glycol ether-based solvent may be used, in addition to the ester-based solvent (one kind, or two or more kinds). As a specific example thereof in this case, an ester-based solvent (preferably butyl acetate) may be used as a main component, and a glycol ether-based solvent (preferably propylene glycol monomethyl ether (PGME)) may be used as a side component. Thus, residue defects are suppressed.

The respective components in plural numbers may be mixed and used, or the components may be mixed with an organic solvent other than the above solvents, and used.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure of the rinsing liquid is preferably 0.05 to 5 kPa, more preferably 0.1 to 5 kPa, and still more preferably 0.12 to 3 kPa, at 20° C. By setting the vapor pressure of the rinsing liquid to a range from 0.05 to 5 kPa, the temperature evenness within a wafer plane is improved, and further, the dimensional evenness within a wafer plane is enhanced by inhibition of swelling due to the permeation of the rinsing liquid.

The rinsing liquid can also be used after adding an appropriate amount of a surfactant thereto.

In the rinsing step, the wafer which has been subjected to development using a developer including an organic solvent is subjected to a washing treatment using the rinsing liquid including the organic solvent. A method for the washing treatment is not particularly limited, and for example, a method in which a rinsing liquid is continuously discharged on a substrate rotated at a constant rate (a spin coating method), a method in which a substrate is immersed in a tank filled with a rinsing liquid for a certain period of time (a dip method), a method in which a rinsing liquid is sprayed onto a substrate surface (a spray method), or the like, can be applied. Among these, a method in which a washing treatment is carried out using the spin coating method, and a substrate is rotated at a rotation speed of 2,000 rpm to 4,000 rpm after washing, and then the rinsing liquid is removed from the substrate, is preferable. Further, it is preferable that a heating step (Post Bake) is included after the rinsing step. The residual developer and the rinsing liquid between and inside the patterns are removed by the baking. The heating step after the rinsing step is carried out at typically 40° C. to 160° C., and preferably at 70° C. to 95° C., and typically for 10 seconds to 3 minutes, and preferably for 30 seconds to 90 seconds.

Moreover, in the pattern forming method of the present invention, development using an alkali developer may also be carried out after the development using an organic developer. A portion having weak exposure intensity is removed by development using an organic solvent, and a portion having strong exposure intensity is also removed by carrying out development using an alkali developer. Since pattern formation is carried out without dissolving only a region having intermediate exposure intensity by a multiple development process in which such development is carried out plural times in this manner, a finer pattern than usual can be formed (the same mechanism as that in paragraph <0077> of JP2008-292975A).

As the alkali developer, for example, alkali aqueous solutions of inorganic alkali such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethyl ethanolamine and triethanolamine, quaternary ammonium salts such as tetramethylammonium hydroxide and tetraethylammonium hydroxide; and cyclic amines such as pyrrole and piperidine, or the like can be used. Among these, an aqueous tetraethylammonium hydroxide solution is preferably used.

Moreover, an appropriate amount of alcohols or a surfactant can also be added to the alkali developer and used.

The alkali concentration of the alkali developer is usually 0.01% to 20% by mass.

The pH of the alkali developer is usually 10.0 to 15.0.

The time for carrying out development using an alkali developer is usually 10 to 300 seconds.

The alkali concentration (and the pH) of the alkali developer and the developing time can be appropriately adjusted depending on the patterns formed.

Washing may be carried out using a rinsing liquid after the development using an alkali developer, and as the rinsing liquid, pure water is used, or an appropriate amount of a surfactant may be added thereto before the use.

Furthermore, after the developing treatment or the rinsing treatment, a treatment for removing the developer or rinsing liquid adhering on the pattern by a supercritical fluid may be carried out.

In addition, a heating treatment can be carried out in order to remove moisture content remaining in the pattern after the rinsing treatment or the treatment using a supercritical fluid.

It is preferable that various materials (for example, a resist solvent, a developer, a rinsing liquid, a composition for forming an antireflection film, and the topcoat composition) used in the pattern forming method of the present invention include no impurities such as a metal and a peroxide. The content of the impurities included in these materials is preferably 1 ppm or less, more preferably 10 ppb or less, still more preferably 100 ppt or less, and particularly preferably 10 ppt or less, and most preferably, metal components are substantially not contained (no higher than the detection limit of a measurement apparatus).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. The filter may be formed of a composite material formed by combining this material with an ion exchange medium. The filter which has been washed with an organic solvent in advance may also be used. In the step of filtration using a filter, a plurality of kinds of filters may be connected in series or in parallel, and used. In the case of using a plurality of kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method of selecting raw materials having a small content of metals as raw materials constituting various materials, a method of subjecting raw materials constituting various materials to filtration using a filter, and a method of performing distillation under the condition for suppressing the contamination as much as possible by, for example, lining the inside of a device with TEFLON (trademark). The preferred conditions for filtration using a filter, which is carried out for raw materials constituting various materials, are the same as described above.

In addition to the filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used.

An electrically conductive compound may be added to the organic treatment liquid (a developer, a rinsing liquid, or the like) of the present invention in order to prevent failure of chemical liquid pipe and various parts (a filter, an O-ring, a tube, or the like) due to electrostatic charge, and subsequently generated electrostatic discharge. The electrically conductive compound is not particularly limited and examples thereof include methanol. The addition amount is not particularly limited, but from the viewpoint of maintaining preferred rinsing characteristics, it is preferably 10% by mass or less, and more preferably 5% by mass or less. For members of the chemical liquid pipe, various pipes coated with stainless steel (SUS), or a polyethylene, polypropylene, or fluorine resin (a polytetrafluoroethylene or perfluoroalkoxy resin, or the like) that has been subjected to an antistatic treatment can be used. In the same manner, for the filter or the O-ring, polyethylene, polypropylene, or fluorine resin (a polytetrafluoroethylene or perfluoroalkoxy resin, or the like) that has been subjected to an antistatic treatment can be used.

Furthermore, a mold for imprints may be manufactured using the resist composition of the present invention, and with regard to the details thereof, refer to JP4109085B and JP2008-162101A, for example.

The pattern forming method of the present invention can also be used in formation of a guide pattern (see, for example, ACS Nano Vol. 4 No. 8 Pages 4815-4823) in Directed Self-Assembly (DSA).

In addition, the resist pattern formed by the method can be used as a core material (core) in the spacer process disclosed in, for example, JP1991-270227A (JP-H03-270227A) and JP2013-164509A.

A method for improving the surface roughness of the pattern may also be applied to the pattern formed by the pattern forming method of the present invention. Examples of the method for improving the surface roughness of the pattern include a method for treating a resist pattern by plasma of a hydrogen-containing gas disclosed in WO2014/002808A. In addition, known methods as described in JP2004-235468A, US2010/0020297A, JP2008-83384A, Proc. of SPIE Vol. 8328 83280N-1 "EUV Resist Curing Technique for LWR Reduction and Etch Selectivity Enhancement" can also be applied.

[Actinic Ray-Sensitive or Radiation-Sensitive Resin Composition]

Next, the actinic ray-sensitive or radiation-sensitive resin composition for use in the pattern forming method of the present invention (the resist composition of the present invention) will be described.

(A) Resin

The resist composition of the present invention contains a resin capable of increasing the polarity by the action of an acid (a resin capable of decreasing the solubility in a developer including an organic solvent due to an increase in the polarity by the action of an acid).

The resin capable of decreasing the solubility in a developer including an organic solvent due to an increase in the polarity by the action of an acid (hereinafter also referred to as a "resin (A)") is preferably a resin (hereinafter also referred to as an "acid-decomposable resin" or an "acid-decomposable resin (A)") having a group (hereinafter also referred to as an "acid-decomposable group") capable of decomposing by the action of an acid to generate an alkali-soluble group at either the main chain or the side chain of the resin, or at both the main chain and the side chain.

Furthermore, the resin (A) is more preferably a resin having an alicyclic hydrocarbon structure which is monocyclic or polycyclic (hereinafter also referred to as an "alicyclic hydrocarbon-based acid-decomposable resin"). It is thought that the resin having an alicyclic hydrocarbon structure which is monocyclic or polycyclic has high hydrophobicity and has improved developability in a case of developing an area of the resist film having a weak light irradiation intensity by an organic developer.

The resist composition of the present invention, which contains the resin (A), can be suitably used in a case of irradiation with ArF excimer laser light.

Examples of the alkali-soluble group included in the resin (A) include a group having a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the alkali-soluble group include a carboxylic acid group, a fluorinated alcohol group (preferably hexafluoroisopropanol), and a sulfonic acid group.

A preferred group capable of decomposing by an acid (acid-decomposable group) is a group obtained by substituting a hydrogen atom of these alkali-soluble groups with a group capable of leaving with an acid.

Furthermore, the repeating unit having the acid-decomposable group is also referred to as an acid-decomposable repeating unit.

Examples of the group (acid-leaving group) that leaves by an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the acid-decomposable group, a cumyl ester group, an enol ester group, an acetal ester group, a tertiary alkyl ester group, and the like are preferable, and a tertiary alkyl ester group is more preferable.

The content of the repeating unit containing an acid-decomposable group in the resin (A) is preferably 10% by mole or more, preferably 20% by mole or more, and still more preferably 30% by mole or more, in all the repeating units. Further, the content of the repeating unit containing an acid-decomposable group in the resin (A) is preferably 80% by mole or less, more preferably 70% by mole or less, still more preferably 60% by mole or less, and particularly preferably 50% by mole or less, in all the repeating units.

The resin (A) is preferably a resin containing at least one selected from the group consisting of repeating units having partial structures represented by General Formulae (pI) to (pV), and a repeating unit represented by General Formula (II-AB).

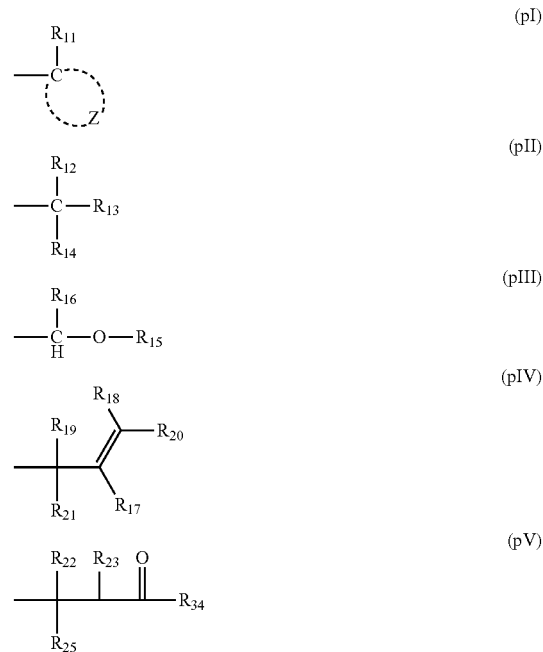

In General Formulae (pI) to (pV), $R_{11}$ represents a methyl group, an ethyl group, an n-propyl group, an isopropyl group, an n-butyl group, an isobutyl group, or a sec-butyl group, and Z represents an atomic group which is necessary for forming a cycloalkyl group together with carbon atoms.

$R_{12}$ to $R_{16}$ each independently represent a cycloalkyl group or a linear or branched alkyl group having 1 to 4 carbon atoms, provided that at least one of $R_{12}$, ..., or $R_{14}$, or any one of $R_{15}$ and $R_{16}$ is a cycloalkyl group.

$R_{17}$ to $R_{21}$ each independently represent a hydrogen atom, a cycloalkyl group, or a linear or branched alkyl group having 1 to 4 carbon atoms, provided that at least one of $R_{17}$, ..., or $R_{21}$ is a cycloalkyl group. Further, any one of $R_{19}$ and $R_{21}$ is a linear or branched alkyl group or cycloalkyl group, having 1 to 4 carbon atoms.

$R_{22}$ to $R_{25}$ each independently represent a hydrogen atom, a cycloalkyl group, or a linear or branched alkyl group having 1 to 4 carbon atoms, provided that at least one of $R_{22}, \ldots,$ or $R_{25}$ represents a cycloalkyl group. Further, $R_{23}$ and $R_{24}$ may be bonded to each other to form a ring.

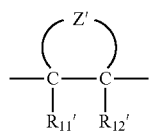
(II-AB)

In General Formula (II-AB), $R_{11}'$ and $R_{12}'$ each independently represent a hydrogen atom, cyano group, a halogen atom, or an alkyl group.

Z' represents an atomic group for forming an alicyclic structure, which contains two carbon atoms bonded to each other (C—C).

Furthermore, it is more preferable that General Formula (II-AB) is General Formula (II-AB1) or (II-AB2).

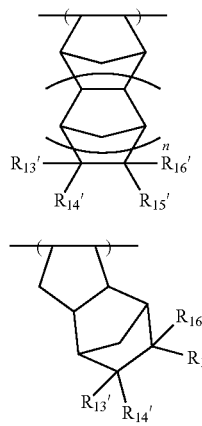

In Formulae (II-AB1) and (II-AB2), $R_{13}'$ to $R_{16}'$ each independently represent a hydrogen atom, a halogen atom, a cyano group, —COOH, —COOR$_5$, a group capable of decomposing by the action of an acid, —C(=O)—X—A'—R$_{17}'$, an alkyl group, or a cycloalkyl group, provided that at least two of $R_{13}', \ldots,$ or $R_{16}'$ may be bonded to each other to form a ring.

Here, $R_5$ represents an alkyl group, a cycloalkyl group, or a group having a lactone structure.

X represents an oxygen atom, a sulfur atom, —NH—, —NHSO$_2$—, or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$, or a group having a lactone structure.

$R_6$ represents an alkyl group or a cycloalkyl group.

n represents 0 or 1.

In General Formulae (pI) to (pV), the alkyl group in one of $R_{12}$ to $R_{25}$ is a linear or branched alkyl group having 1 to 4 carbon atoms.

The cycloalkyl group in one of $R_{11}$ to $R_{25}$ or the cycloalkyl group formed by Z together with carbon atoms may be monocyclic or polycyclic. Specific examples thereof include a group having 5 or more carbon atoms and having a monocyclo, bicyclo, tricyclo, or tetracyclo structure. These cycloalkyl groups preferably have 6 to 30 carbon atoms, and particularly preferably 7 to 25 carbon atoms. These cycloalkyl groups may have a substituent.

Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group. More preferred examples thereof include an adamantyl group, a norbornyl group, a cyclohexyl group, a cyclopentyl group, a tetracyclododecanyl group, and a tricyclodecanyl group.

Examples of a substituent which may further be included in these alkyl groups and cycloalkyl groups include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). Examples of the substituent which may further be included in the alkyl group, the alkoxy group, the alkoxycarbonyl group, or the like include a hydroxyl group, a halogen atom, and an alkoxy group.

The structures represented by General Formulae (pI) to (pV) in the resin can be used in the protection of the alkali-soluble group. Examples of the alkali-soluble group include various groups that have been known in the technical field.

Specific examples of the structure include a structure in which a hydrogen atom in a carboxylic acid group, a sulfonic acid group, a phenol group, or a thiol group is substituted with a structure represented by any one of General Formulae (pI) to (pV), with a structure in which a hydrogen atom in a carboxylic acid group or a sulfonic acid group is substituted with a structure represented by any one of General Formulae (pI) to (pV) being preferable.

As the repeating unit having an alkali-soluble group protected by the structure represented by one of General Formulae (pI) to (pV), a repeating unit represented by General Formula (pA) is preferable.

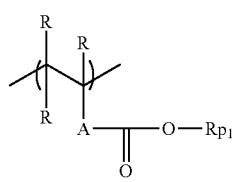
(pA)

Here, R represents a hydrogen atom, a halogen atom, or a linear or branched alkyl group having 1 to 4 carbon atoms, and a plurality of R's may be the same as or different from each other.

A is a single bond, or one group or a combination of two or more groups selected from the group consisting of an alkylene group, an ether group, a thioether group, a carbonyl group, an ester group, an amido group, a sulfonamido group, a urethane group, or a urea group, with a single bond being preferable.

Rp$_1$ is a group of any one of Formulae (pI) to (pV).

The repeating unit represented by General Formula (pA) is particularly preferably a repeating unit derived from 2-alkyl-2-adamantyl (meth)acrylate or dialkyl (1-adamantyl)methyl (meth)acrylate.

Specific examples of the repeating unit represented by General Formula (pA) are shown below, but the present invention is not limited thereto.

(in the following formulae, Rx represents H, CH3, or CH2OH; and Rxa and Rxb each represent an alkyl group having 1 to 4 carbon atoms)
1
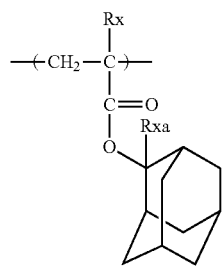
2
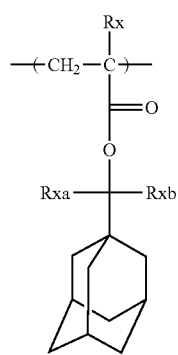
3
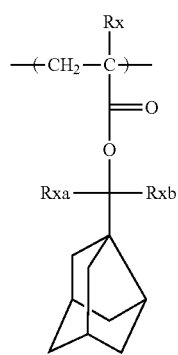
4
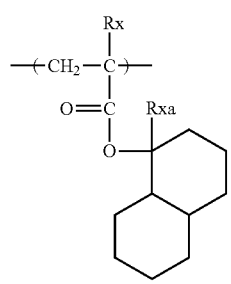
5
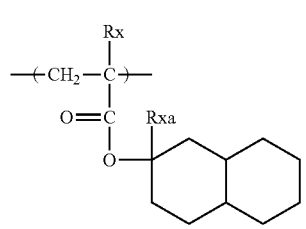
6
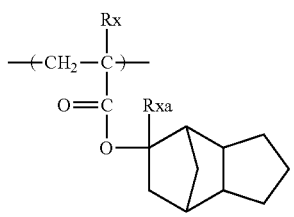
7
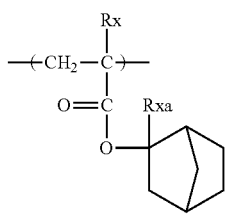
8
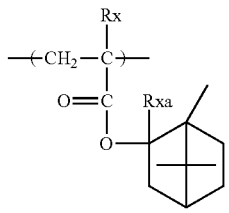
9
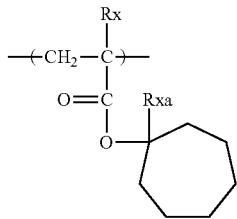
10
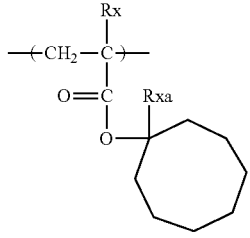
11
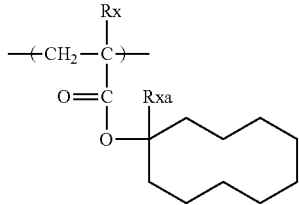
12
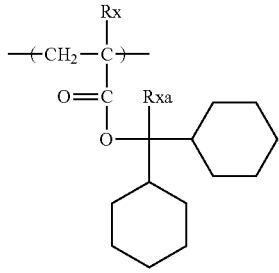

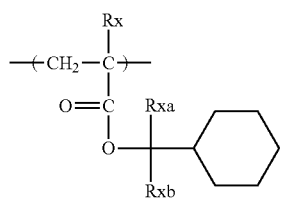
13
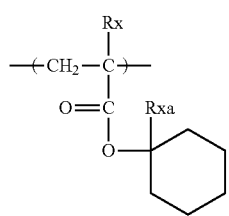
14
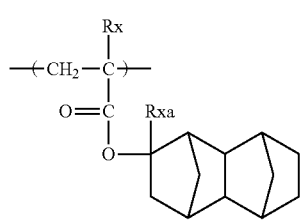
15
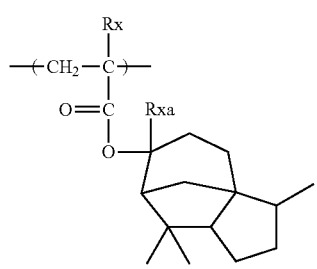
16
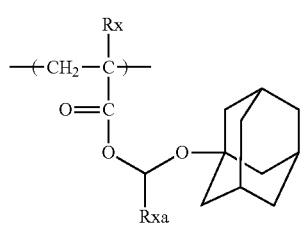
17
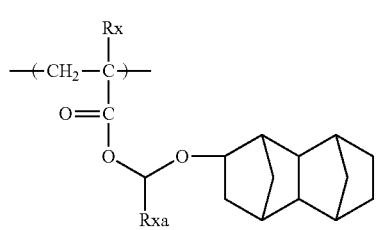
18
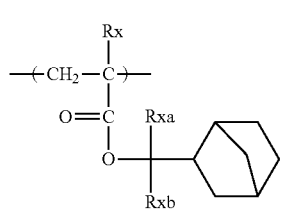
19
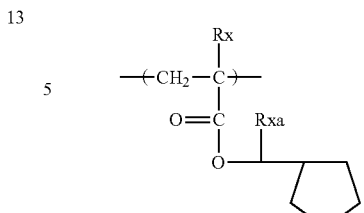
20
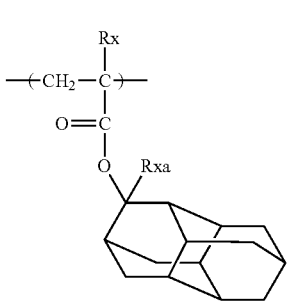
21
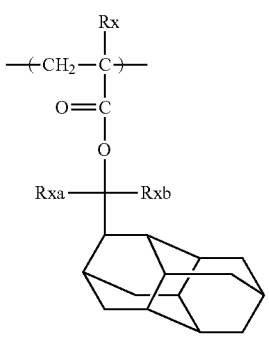
22
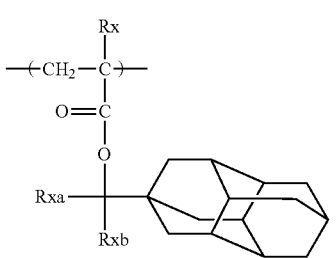
23
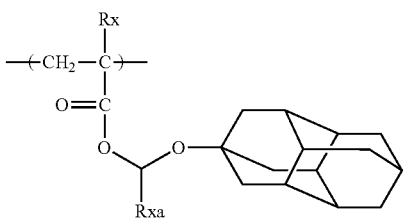
24
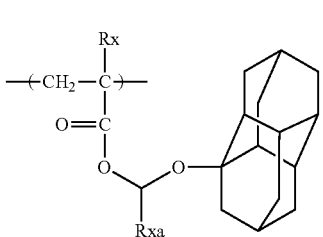
25

-continued

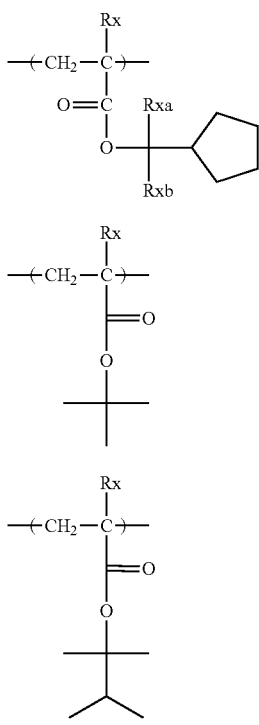

In General Formula (II-AB), examples of the halogen atoms in $R_{11}'$ and $R_{12}'$ include a chlorine atom, a bromine atom, a fluorine atom, and an iodine atom.

Examples of the alkyl group in one of $R_{11}'$ and $R_{12}'$ include a linear or branched alkyl group having 1 to 10 carbon atoms.

The atomic group for forming the alicyclic structure of Z' is an atomic group that forms a repeating unit of an alicyclic hydrocarbon, which may have a substituent, in the resin. Above all, an atomic group for forming a crosslinked alicyclic structure that forms a crosslinked alicyclic hydrocarbon repeating unit is preferable.

Examples of the skeleton of the alicyclic hydrocarbon thus formed include the same ones as the alicyclic hydrocarbon groups represented by one of $R_{12}$ to $R_{25}$ in General Formulae (pI) to (pV).

The skeleton of the alicyclic hydrocarbon may have a substituent. Examples of the substituent include $R_{13}'$ to $R_{16}'$ in General Formula (II-AB1) or (II-AB2).

In the resin (A), the group capable of decomposing by the action of an acid is included in at least one repeating unit of a repeating unit having a partial structure represented by any one of General Formulae (pI) to (pV), a repeating unit represented by General Formula (II-AB), or a repeating unit of a copolymerizable component which will be described later. It is preferable that the group capable of decomposing by the action of an acid is included in a repeating unit having a partial structure represented by one of General Formulae (pI) to (pV).

Various substituents of $R_{13}'$ to $R_{16}'$ in General Formula (II-AB1) or (II-AB2) may each be a substituent of the atomic group for forming an alicyclic structure or the atomic group Z for forming a crosslinked alicyclic structure in General Formula (II-AB).

In the resin (A), the content of the repeating units having partial structures represented by General Formulae (pI) to (pV) is preferably 20% to 70% by mole, more preferably 20% to 50% by mole, and still more preferably 25% to 40% by mole, with respect to all the repeating units.

In the resin (A), the content of the repeating unit represented by General Formula (II-AB) is preferably 10% to 60% by mole, more preferably 15% to 55% by mole, and still more preferably 20% to 50% by mole, with respect to all the repeating units.

It is preferable that the resin (A) contains, for example, a repeating unit represented by General Formula (3).

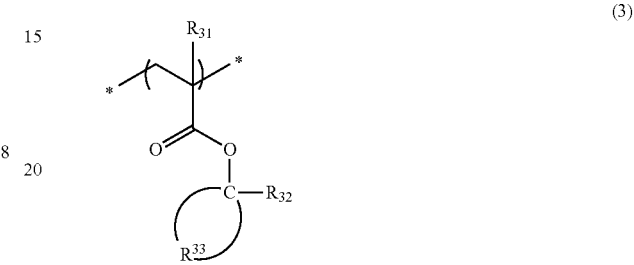

(3)

In General Formula (3), $R_{31}$ represents a hydrogen atom or an alkyl group.

$R_{32}$ represents an alkyl group or a cycloalkyl group, and specific examples thereof include a methyl group, an ethyl group, an n-propyl group, an isopropyl group, an n-butyl group, an isobutyl group, a sec-butyl group, a tert-butyl group, and a cyclohexyl group.

$R_{33}$ represents an atomic group required for forming a monocyclic alicyclic hydrocarbon structure together with carbon atoms to which $R_{32}$ is bonded. In the alicyclic hydrocarbon structure, a part of carbon atoms constituting a ring may be substituted with a heteroatom, or a group having a heteroatom.

The alkyl group of $R_{31}$ may have a substituent and examples of the substituent include a fluorine atom and a hydroxyl group. $R_{31}$ preferably represents a hydrogen atom, a methyl group, a trifluoromethyl group, or a hydroxymethyl group.

$R_{32}$ is preferably a methyl group, an ethyl group, an n-propyl group, an isopropyl group, a tert-butyl group, or a cyclohexyl group, and more preferably a methyl group, an ethyl group, an isopropyl group, or a tert-butyl group.

The monocyclic alicyclic hydrocarbon structure formed by $R_{33}$ together with carbon atoms is preferably a 3- to 8-membered ring, and more preferably a 5- or 6-membered ring.

In the monocyclic alicyclic hydrocarbon structure formed by $R_{33}$ together with carbon atoms, examples of the heteroatom which can constitute a ring include an oxygen atom and a sulfur atom, and examples of the group having a heteroatom include a carbonyl group. However, it is preferable that the group having a heteroatom is not an ester group (ester bond).

The monocyclic alicyclic hydrocarbon structure formed by $R_{33}$ together with carbon atoms is preferably formed with only carbon atoms and hydrogen atoms.

The repeating unit represented by General Formula (3) is preferably a repeating unit represented by General Formula (3').

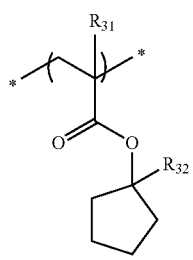
(3')
In General Formula (3'), $R_{31}$ and $R_{32}$ have the same definitions as those in General Formula (3), respectively.
Specific examples of the repeating unit having the structure represented by General Formula (3) are shown below, but are not limited thereto.
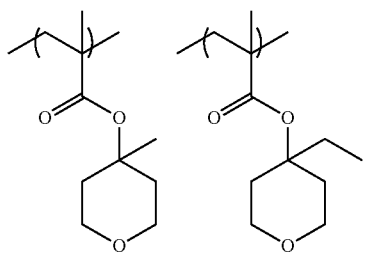
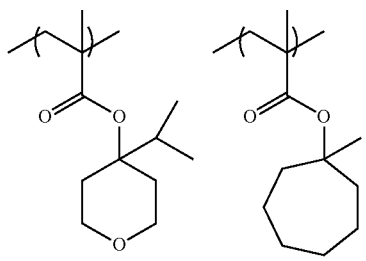
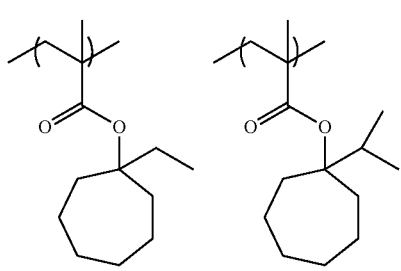
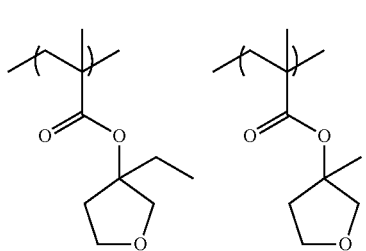
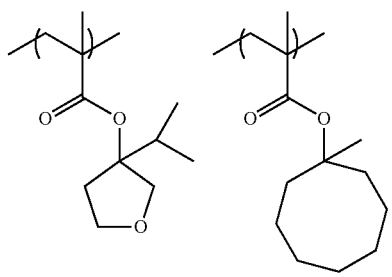
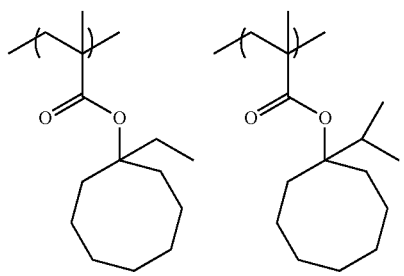
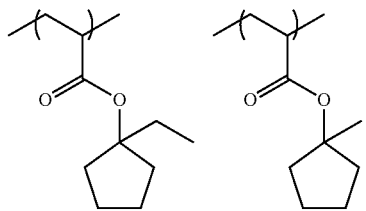
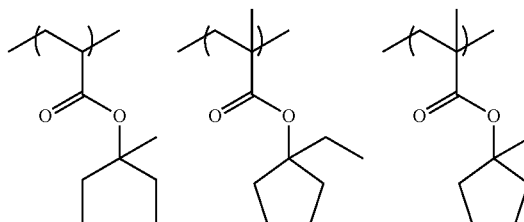
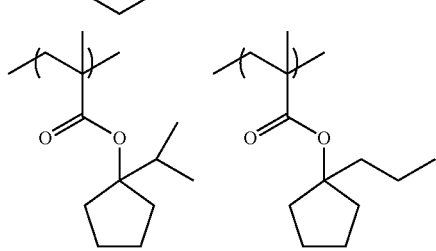
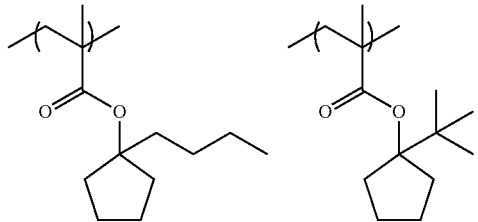
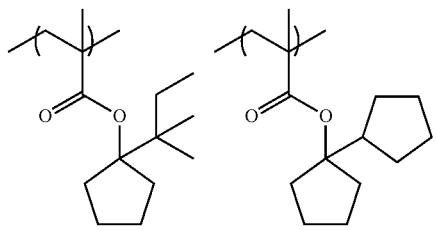

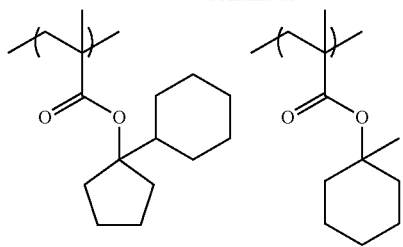
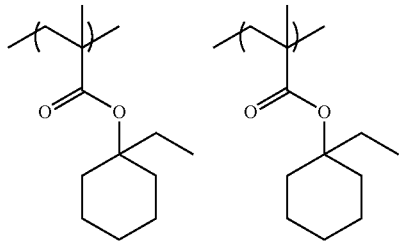
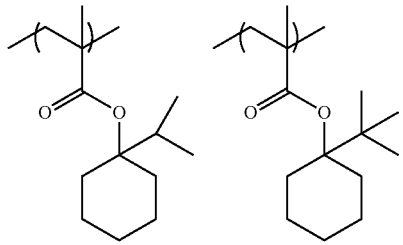
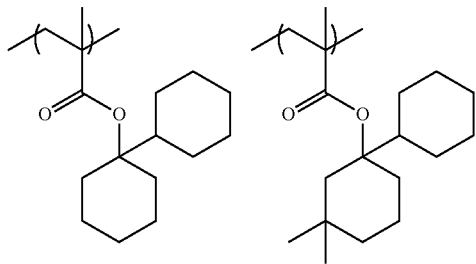
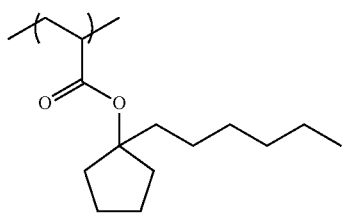
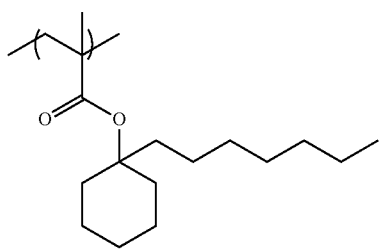

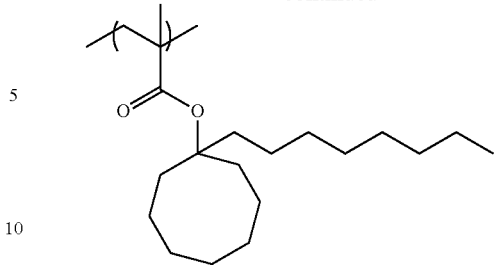

The content of the repeating unit having a structure represented by General Formula (3) is preferably 20% to 80% by mole, more preferably 25% to 75% by mole, and still more preferably 30% to 70% by mole, with respect to all the repeating units of the resin (A).

The resin (A) preferably has at least one of the repeating unit represented by General Formula (I) or the repeating unit represented by General Formula (II).

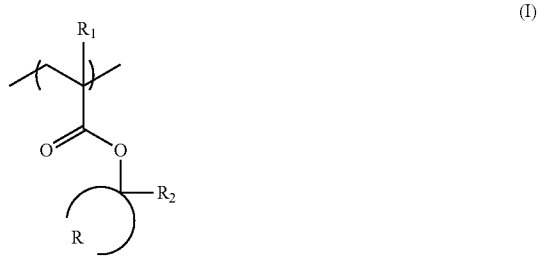

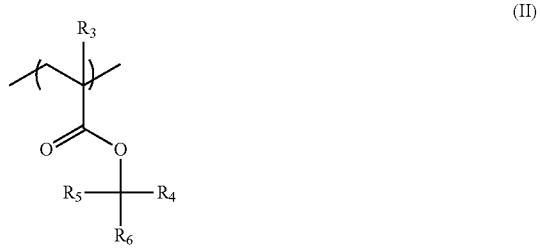

In Formulae (I) and (II), $R_1$ and $R_3$ each independently represent a hydrogen atom, a methyl group which may have a substituent, or a group represented by —$CH_2$—$R_{11}$. $R_{11}$ represents a monovalent organic group.

$R_2$, $R_4$, $R_5$, and $R_6$ each independently represent an alkyl group or a cycloalkyl group.

R represents an atomic group required for forming an alicyclic structure together with a carbon atom to which $R_2$ is bonded.

$R_1$ and $R_3$ each preferably represent a hydrogen atom, a methyl group, a trifluoromethyl group, or a hydroxymethyl group. $R_{11}$ represents a halogen atom (a fluorine atom and the like), a hydroxyl group, or a monovalent organic group, and examples thereof include an alkyl group having 5 or less carbon atoms and an acyl group having 5 or less carbon atoms, among which an alkyl group having 3 or less carbon atoms is preferable, and a methyl group is more preferable.

The alkyl group in $R_2$ may be linear or branched, and may have a substituent.

The cycloalkyl group in $R_2$ monocyclic or polycyclic, and may have a substituent.

$R_2$ is preferably an alkyl group, more preferably an alkyl group having 1 to 10 carbon atoms, and still more preferably an alkyl group having 1 to 5 carbon atoms, and examples thereof include a methyl group, an ethyl group, an n-propyl group, an i-propyl group, and a t-butyl group. As the alkyl group in $R_2$, a methyl group, an ethyl group, an i-propyl group, and a t-butyl group are preferable.

R represents an atomic group required to form an alicyclic structure together with a carbon atom. The alicyclic structure formed by R together with the carbon atom is preferably a monocyclic alicyclic structure, and the number of carbon atoms is preferably 3 to 7, and more preferably 5 or 6.

$R_3$ is preferably a hydrogen atom or a methyl group, and more preferably a methyl group.

The alkyl group in $R_4$, $R_5$, or $R_6$ may be linear or branched, and may have a substituent. Preferred examples of the alkyl group include alkyl groups having 1 to 4 carbon atoms, such as a methyl group, an ethyl group, an n-propyl group, an isopropyl group, an n-butyl group, an isobutyl group, and a t-butyl group.

The cycloalkyl group in $R_4$, $R_5$, or $R_6$ may be monocyclic or polycyclic, and may have a substituent. Preferred examples of the cycloalkyl group include monocyclic cycloalkyl groups such as a cyclopentyl group and a cyclohexyl group, and polycyclic cycloalkyl group such as a norbornyl group, a tetracyclodecanyl group, a tetracyclododecanyl group, and an adamantyl group.

Examples of the substituent which may be contained in each of the groups include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), preferably having 8 or less carbon atoms.

In General Formula (II), $R_4$, $R_5$, and $R_6$ are preferably an alkyl group, and the sum of the numbers of carbon atoms of $R_4$, $R_5$, and $R_6$ is preferably 5 or more, preferably 6 or more, and still more preferably 7 or more.

The resin (A) is more preferably a resin including the repeating unit represented by General Formula (I) and the repeating unit represented by General Formula (II).

Moreover, in another aspect, a resin including at least two kinds of the repeating unit represented by General Formula (I) is more preferable. In the case where the resin contains at least two kinds of the repeating unit represented by General Formula (I), it is preferable that the resin contains both of a repeating unit in which an alicyclic structure formed by R together with a carbon atom is a monocyclic alicyclic structure and a repeating unit in which an alicyclic structure formed by R together with a carbon atom is a polycyclic alicyclic structure. The monocyclic alicyclic structure preferably has 5 to 8 carbon atoms, more preferably 5 or 6 carbon atoms, and particularly preferably 5 carbon atoms. As the polycyclic alicyclic structure, a norbornyl group, a tetracyclodecanyl group, a tetracyclododecanyl group, and an adamantyl group are preferable.

The repeating unit having an acid-decomposable group which the resin (A) contains may be used alone or in combination of two or more kinds thereof.

The content of at least one repeating unit of the repeating unit represented by General Formula (I) or the repeating unit represented by General Formula (II) is preferably 20% to 80% by mole, more preferably 25% to 75% by mole, and still more preferably 30% to 70% by mole, with respect to all the repeating units in the resin (A).

It is preferable that the resin (A) contains a repeating unit having a lactone structure or a sultone (cyclic sulfonic acid ester) structure.

As the lactone group or the sultone group, any group may be used as long as it has a lactone structure or a sultone structure, but the structure is preferably a 5- to 7-membered ring lactone structure or sultone structure, and more preferably a 5- to 7-membered ring lactone structure or sultone structure to which another ring structure is fused in the form of forming a bicyclo structure or a spiro structure. The resin (A) still more preferably has a repeating unit having a lactone structure or a sultone structure represented by any one of General Formulae (LC1-1) to (LC1-17), (SL1-1), and (SL1-2). Further, the lactone structure or the sultone structure may be bonded directly to the main chain. The lactone structures or the sultone structures are preferably (LC1-1), (LC1-4), (LC1-5), and (LC1-8), and more preferably (LC1-4). By using such a specific lactone structure or sultone structure, LWR and development defects are relieved.

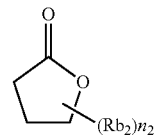

LC1-1

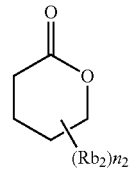

LC1-2

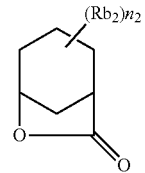

LC1-3

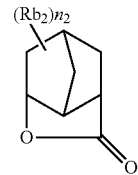

LC1-4

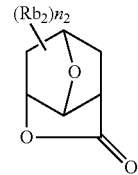

LC1-5

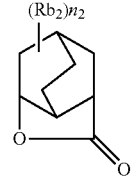

LC1-6

LC1-7 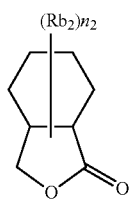

LC1-8 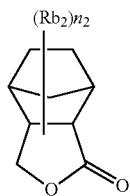

LC1-9 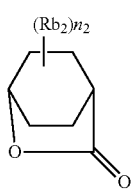

LC1-10 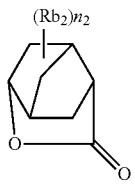

LC1-11 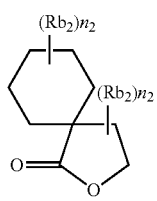

LC1-12 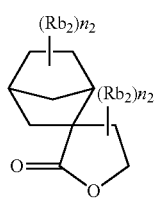

LC1-13 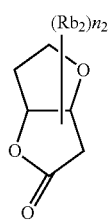

LC1-14 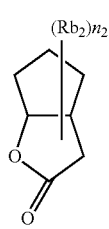

LC1-15 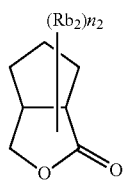

LC1-16 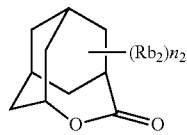

LC1-17 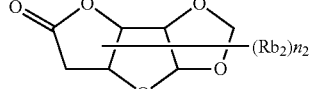

SL1-1 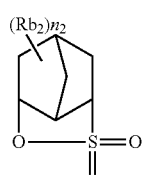

SL1-2 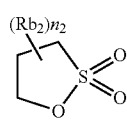

The lactone structure moiety or the sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable. $n_2$ represents an integer of 0 to 4. In a case where $n_2$ is 2 or more, the substituents ($Rb_2$) which are present in plural numbers may be the same as or different from each other, and further, the substituents ($Rb_2$) which are present in plural numbers may be bonded to each other to form a ring.

It is preferable that the resin (A) contains a repeating unit having a lactone structure or a sultone structure, represented by General Formula (III).

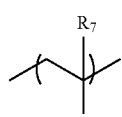

(III)

In Formula (III), $R_8$ represents a monovalent organic group having a lactone structure or a sultone structure.

n is the repetition number of the structure represented by —$R_0$—Z—, and represents an integer of 0 to 2.

In the case where R₀'s are present in plural numbers, they each independently represent an alkylene group, a cycloalkylene group, or a combination thereof.

In the case where Z's are present in plural numbers, they each independently represent a single bond, an ether bond, an ester bond, an amide bond, a urethane bond (a group represented by

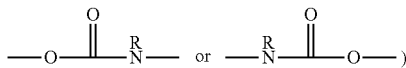

or a urea bond
(a group represented by

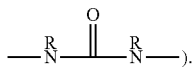

Here, R's each independently represent a hydrogen atom, an alkyl group, a cycloalkyl group, or an aryl group.

A represents an ester bond (a group represented by —COO—) or an amide bond (a group represented by —CONH—).

$R_7$ represents a hydrogen atom, a halogen atom, or an alkyl group.

The alkylene group and the cycloalkylene group of $R_0$ may have a substituent.

Z is preferably an ether bond or an ester bond, and particularly preferably an ester bond.

The alkyl group of $R_7$ is preferably an alkyl group having 1 to 4 carbon atoms, more preferably a methyl group or an ethyl group, and particularly preferably a methyl group. The alkylene group and the cycloalkylene group of $R_0$, and the alkyl group in $R_7$ may be each substituted, and examples of the substituent include a halogen atom such as a fluorine atom, a chlorine atom, and a bromine atom, a mercapto group, a hydroxy group, an alkoxy group such as a methoxy group, an ethoxy group, an isopropoxy group, a t-butoxy group, and a benzyloxy group, and an acyloxy group such as an acetyloxy group and a propionyloxy group. $R_7$ is preferably a hydrogen atom, a methyl group, a trifluoromethyl group, or a hydroxymethyl group.

The preferred chained alkylene group in $R_0$ is chained alkylene group, preferably having 1 to 10 carbon atoms, and more preferably having 1 to 5 carbon atoms, and examples thereof include a methylene group, an ethylene group, and a propylene group. Preferred examples of the cycloalkylene group include a cycloalkylene group having 3 to 20 carbon atoms, and examples thereof include a cyclohexylene group, a cyclopentylene group, a norbornylene group, and an adamantylene group. In order to express the effect of the present invention, a chained alkylene group is more preferable, and a methylene group is particularly preferable.

The monovalent organic group having a lactone structure or sultone structure represented by $R_8$ is not limited as long as it has the lactone structure or sultone structure, specific examples thereof include the above-mentioned lactone structures or sultone structures represented by General Formula (LC1-1) to (LC1-17), (SL1-1), and (SL1-2), and among these, the structure represented by (LC1-4) is particularly preferable. Further, $n_2$ in (LC1-1) to (LC1-17), (SL1-1), and (SL1-2) is more preferably 2 or less.

Furthermore, $R_8$ is preferably a monovalent organic group having an unsubstituted lactone structure or sultone structure, or a monovalent organic group having a lactone structure or a sultone structure having a methyl group, a cyano group, or an alkoxycarbonyl group as a substituent, and more preferably a monovalent organic group having a lactone structure having a cyano group as a substituent (cyanolactone) or a sultone structure having a cyano group as a substituent (cyanosultone).

In General Formula (III), n is preferably 0 or 1.

In the case where the repeating units are present in a plurality of kinds, the content of the repeating units represented by General Formula (III) is preferably 15% to 60% by mole, more preferably 20% to 60% by mole, and still more preferably 30% to 50% by mole, with respect to all the repeating units in the resin (A).

The resin (A) may further contain the aforementioned repeating unit having a lactone structure or a sultone structure, in addition to the unit represented by General Formula (III).

The repeating unit having a lactone group or a sultone group usually has an optical isomer, and any optical isomer may be used. Further, one kind of optical isomer may be used alone or a plurality of optical isomers may be mixed and used. In the case of mainly using one kind of optical isomer, the optical purity (ee) thereof is preferably 90% or more, and more preferably 95% or more.

The content of the repeating unit having a lactone structure or a sultone structure, other than the repeating unit represented by General Formula (III), is preferably 15% to 60% by mole, more preferably 20% to 50% by mole, and still more preferably 30% to 50% by mole, with respect to all the repeating units in the resin in the case where the repeating units are contained in a plurality of kinds.

In order to enhance the effect of the present invention, it is also possible to use two or more kinds of the repeating units having a lactone structure or a sultone structure selected from General Formula (III) in combination. In the case of using them in combination, it is preferable to use two or more selected from the lactone or sultone repeating units of General Formula (III) in which n is 0 in combination.

The resin (A) preferably has a repeating unit containing an organic group having a polar group, in particular, a repeating unit having an alicyclic hydrocarbon structure substituted with a polar group. Thus, the substrate adhesiveness and the developer affinity are improved. As the alicyclic hydrocarbon structure of the alicyclic hydrocarbon structure substituted with a polar group, an adamantyl group, a diamantyl group, or a norbornane group is preferable. As the polar group, a hydroxyl group or a cyano group is preferable.

Preferred examples of the alicyclic hydrocarbon structure substituted with a polar group include partial structures represented by General Formulae (VIIa) to (VIId).

(VIIa)

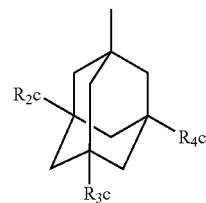

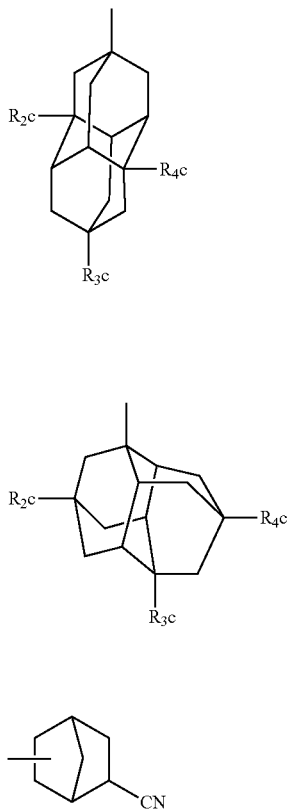

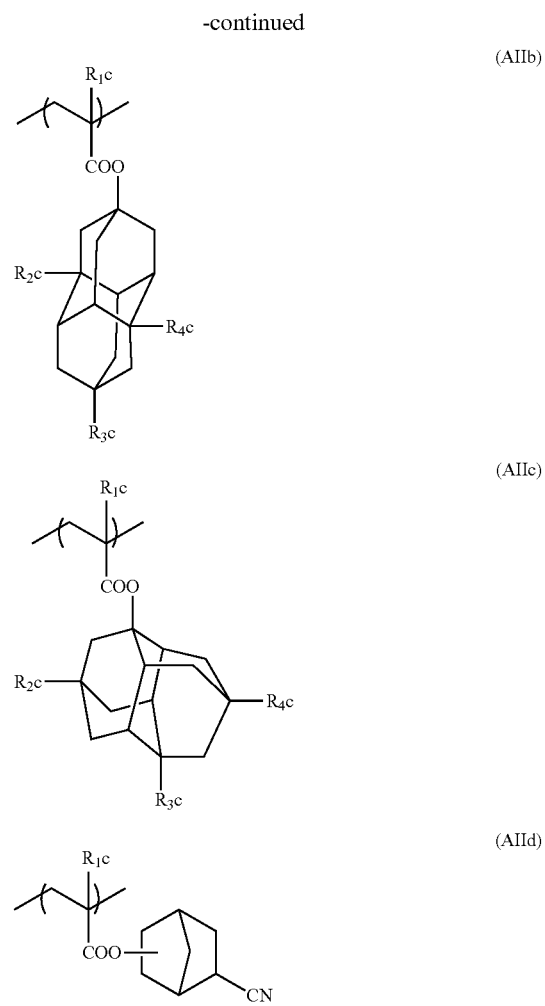

In General Formulae (VIIa) to (VIIc),

R₂c to R₄c each independently represent a hydrogen atom, a hydroxyl group, or a cyano group, provided that at least one of R₂c, R₁c or R₄c represents a hydroxyl group or a cyano group. It is preferable that one or two of R₂c to R₄c are hydroxyl group(s) and the remainders are hydrogen atoms.

In General Formula (VIIa), it is more preferable that two of R₂c to R₄c are hydroxyl groups and the remainders are hydrogen atoms.

Examples of the repeating unit having a group represented by any one of General Formulae (VIIa) to (VIId) include those in which at least one of R₁₃' to R₁₆' in General Formula (II-AB1) or (II-AB2) has a group represented by one of General Formula (VIIa) to (VIId) (for example, R₁₃' to R₁₆' in Formula (II-AB) or (II-AB2) are —COOR₅ in which R₅ represents a group represented by one of General Formulae (VIIa) to (VIId)), and repeating units represented by General Formulae (AIIa) to (AIId).

In General Formulae (AIIa) to (AIId),

R₁c represents a hydrogen atom, a methyl group, a trifluoromethyl group, or a hydroxymethyl group.

R₂c to R₄c have the same definitions as R₂c to R₄c in General Formulae (VIIa) to (VIIc).

Specific examples of the repeating unit having a structure represented by any one of General Formulae (AIIa) to (AIId) will be shown below, but the present invention is not limited thereto.

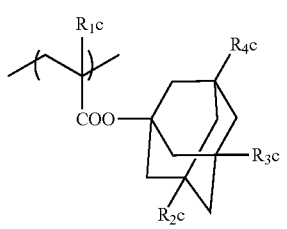

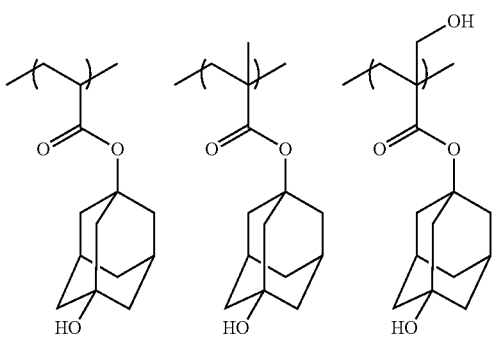

-continued

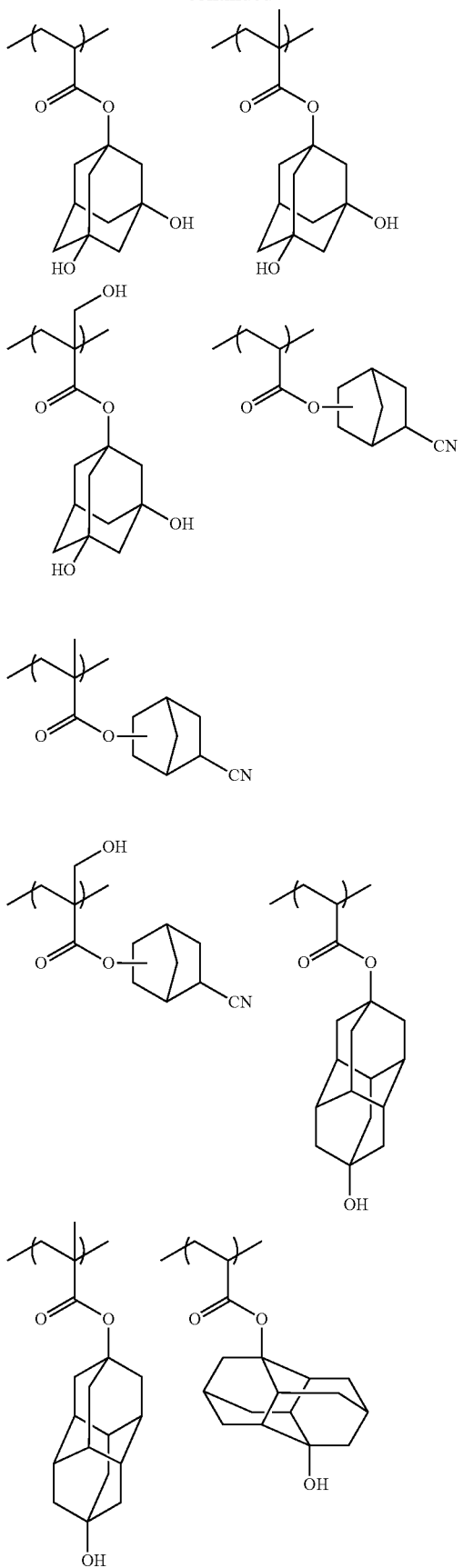

-continued

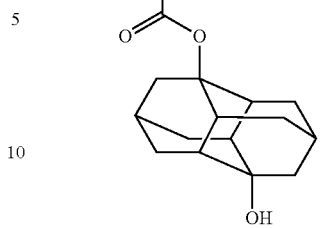

In the resin (A), the content of the repeating unit having an organic group with a polar group is preferably 1% to 40% by mole, more preferably 5% to 30% by mole, and still more preferably 5% to 20% by mole, with respect to all the repeating units.

The resin (A) may also have a repeating unit further having an alicyclic hydrocarbon structure and not exhibiting acid decomposability. Thus, it is possible to reduce elution of the low molecular components from the resist film to the immersion liquid upon liquid immersion exposure. Examples of such a repeating unit include 1-adamantyl (meth)acrylate, tricyclodecanyl (meth)acrylate, and cyclohexyl (meth)acrylate.

In the resin (A), the content of the repeating unit having an alicyclic hydrocarbon structure and not exhibiting acid decomposability is preferably 1% to 40% by mole, more preferably 5% to 30% by mole, and still more preferably 5% to 20% by mole, with respect to all the repeating units.

The resin (A) may contain, in addition to the above-described repeating units, repeating units derived from various monomers for the purpose of controlling various characteristics. Examples of such a monomer include a compound having one addition-polymerizable unsaturated bond selected from acrylic acid esters, methacrylic acid esters, acrylamides, methacrylamides, allyl compounds, vinyl ethers, and vinyl esters.

In addition, addition-polymerizable unsaturated compounds which are copolymerizable with monomers corresponding to various repeating units above may be copolymerized.

Furthermore, the content of the repeating units derived from the monomers in the resin (A) can be appropriately set, but generally, it is preferably 99% by mole or less, more preferably 90% by mole or less, and still more preferably 80% by mole or less, with respect to sum of the total moles of the repeating units having partial structures represented by General Formulae (pI) to (pV) and the repeating unit represented by General Formula (II-AB).

In a case where the resist composition of the present invention is to be used for ArF exposure, from the viewpoint of the transparency to the ArF light, it is preferable that the resin (A) is free of an aromatic group.

As the resin (A), resins in which all of the repeating units are constituted with (meth)acrylate-based repeating units are preferable. In this case, any one of a resin in which all of the repeating units are methacrylate-based repeating units, a resin in which all of the repeating units are acrylate-based repeating units, and a resin in which all of the repeating units are mixtures of methacrylate-based repeating units/acrylate-based repeating units can be used, and the proportion of the acrylate-based repeating units is preferably 50% by mole or less with respect to all the repeating units.

The resin (A) is preferably a copolymer at least having three kinds of repeating units, that is, a (meth)acrylate-based repeating unit having a lactone ring, a (meth)acrylate-based repeating unit having an organic group substituted with any one of a hydroxyl group and a cyano group, and a (meth) acrylate-based repeating unit having an acid-decomposable group.

The resin (A) is preferably a ternary copolymerization polymer including 20% to 50% by mole of repeating units having partial structures represented by General Formulae (pI) to (pV), 20% to 50% by mole of repeating units having lactone structures, and 5% to 30% by mole of repeating units having alicyclic hydrocarbon structures substituted with polar groups, or a quaternary copolymerization polymer including the above repeating units and 0% to 20% by mole of other repeating units.

Preferred examples of the resin (A) include the resins described in paragraphs <0152> to <0158> of JP2008-309878A, but the present invention is not limited thereto.

The resin (A) can be synthesized by an ordinary method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethyl formamide and dimethyl acetamide; and solvents which dissolve the resist composition of the present invention, such as propylene glycol monomethyl ether acetate, propylene glycol monomethyl ether, and cyclohexanone, which will be described later. It is more preferable to carry out polymerization using the same solvent as the solvent used in the resist composition of the present invention. Thus, generation of the particles during storage can be suppressed.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferred examples of the initiators include azobisisobutyronitrile, azobisdimethylvaleronitrile, and dimethyl 2,2'-azobis(2-methyl propionate). The initiator is added or added in portionwise, depending on the purposes, and after completion of the reaction, the reaction mixture is poured into a solvent, and then a desired polymer is recovered by a method such as powder and solid recovery. The concentration of the reactant is 5% to 50% by mass, and preferably 10% to 30% by mass. The reaction temperature is usually 10° C. to 150° C., preferably 30° C. to 120° C., and more preferably 60° C. to 100° C.

For the purification, an ordinary method such as a liquid-liquid extraction method of applying water washing or combining it with an appropriate solvent to remove the residual monomers or oligomer components; a purification method in a solution state, such as ultrafiltration of extracting and removing only the polymers having a molecular weight no more than a specific molecular weight; a re-precipitation method of dropwise adding a resin solution into a poor solvent to solidify the resin in the poor solvent, thereby removing the residual monomers and the like; and a purification method in a solid state, such as washing of a resin slurry with a poor solvent after separation of the slurry by filtration can be applied.

The weight-average molecular weight (Mw) of the resin (A) is preferably 1,000 to 200,000, more preferably 1,000 to 20,000, and still more preferably 1,000 to 15,000.

The dispersity (molecular weight distribution) which is a ratio (Mw/Mn) of the weight-average molecular weight (Mw) to the number-average molecular weight (Mn) in the resin (A) is in a range of usually 1 to 5, preferably 1 to 3, more preferably 1.2 to 3.0, and particularly preferably 1.2 to 2.0 is used.

The weight-average molecular weight (Mw) and the number-average molecular weight (Mn) in the present specification are values in terms of polystyrene, determined by a gel permeation chromatography (GPC) method, using HLC-8120 (manufactured by Tosoh Corporation). Further, TSK gel Multipore HXL-M (manufactured by Tosoh Corporation, 7.8 mmID×30.0 cm) is used as a column, and tetrahydrofuran (THF) is used as an eluent.

The blend amount of the resin (A) in the entire resist composition of the present invention is preferably 50% to 99.9% by mass, and more preferably 60% to 99.0% by mass, with respect to the total solid content.

Furthermore, in the present invention, the resin (A) may be used singly or in combination of a plurality of kinds thereof.

It is preferable that the resin (A) contains neither a fluorine atom nor a silicon atom from the viewpoint of the compatibility with a topcoat composition.

It is preferable that the resin (A) contains neither a fluorine atom nor a silicon atom from the viewpoint of the compatibility with the hydrophobic resin which will be described later.

(B) Compound Capable of Generating Acid Upon Irradiation with Actinic Rays or Radiation The resist composition of the present invention contains a compound capable of generating an acid upon irradiation with actinic rays or radiation (also referred to as an "acid generator", a "photoacid generator," or a "component (B)").

As such a photoacid generator, a compound may be appropriately selected from known compounds capable of generating an acid upon irradiation with actinic rays or radiation which are used for a photoinitiator for cationic photopolymerization, a photoinitiator for radical photopolymerization, a photodecoloring agent for coloring agents, a photodiscoloring agent, a microresist, or the like, and a mixture thereof, and used.

Examples of the compound include a diazonium salt, a phosphonium salt, a sulfonium salt, an iodonium salt, imidosulfonate, oxime sulfonate, diazodisulfone, disulfone, and o-nitrobenzyl sulfonate.

In addition, as a compound in which a group or compound capable of generating an acid upon irradiation with actinic rays or radiation is introduced into the main or side chain of the polymer, for example, the compounds described in U.S. Pat. No. 3,849,137A, GE3914407A, JP1988-26653A (JP-S63-26653A), JP1980-164824A (JPS55-164824A), JP1987-69263A (JP-S62-69263A), JP1988-146038A (JP-S63-146038A), JP1988-163452A (JP-S63-163452A), JP1987-153853A (JP-S62-153853A), JP1988-146029A (JP-S63-146029A), and the like can be used.

In addition, the compounds capable of generating an acid by light described in U.S. Pat. No. 3,779,778A, EP126712B, and the like can also be used.

The acid generator contained in the composition of the present invention is preferably a compound capable of generating an acid having a cyclic structure upon irradiation with actinic rays or radiation. As the cyclic structure, a monocyclic or polycyclic alicyclic group is preferable, and a polycyclic alicyclic group is more preferable. It is preferable that carbonyl carbon is not included as a carbon atom constituting the ring skeleton of the alicyclic group.

Suitable examples of the acid generator contained in the composition of the present invention include a compound (a specific acid generator) capable of generating an acid upon irradiation with actinic rays or radiation represented by General Formula (3).

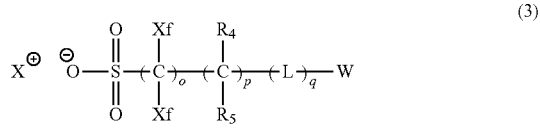

(Anion)

In General Formula (3),

Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and in a case where $R_4$ and $R_5$ are present in plural numbers, they may be the same as or different from each other.

L represents a divalent linking group, and in a case where L's are present in plural numbers, they may be the same as or different from each other.

W represents an organic group including a cyclic structure.

o represents an integer of 1 to 3. p represents an integer of 0 to 10. q represents an integer of 0 to 10.

Xf represents a fluorine atom or an alkyl group substituted with at least one fluorine atom. The number of carbon atoms in the alkyl group is preferably 1 to 10, and more preferably 1 to 4. Further, the alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. It is particularly preferable that both Xf's are fluorine atoms.

$R_4$ and $R_5$ each independently represent a hydrogen atom, a fluorine atom, an alkyl group, or an alkyl group substituted with at least one fluorine atom, and in a case where $R_4$ and $R_5$ are present in plural numbers, they may be the same as or different from each other.

The alkyl group as $R_4$ and $R_5$ may have a substituent, and preferably has 1 to 4 carbon atoms. $R_4$ and $R_5$ are each preferably a hydrogen atom.

Specific examples and suitable aspects of the alkyl group substituted with at least one fluorine atom of $R_4$ and $R_5$ are the same as the specific examples and suitable aspects of Xf in General Formula (3).

L represents a divalent linking group, and in a case where L's are present in plural numbers, they may be the same as or different from each other.

Examples of the divalent linking group include —COO—(—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), or a divalent linking group formed by combination of these plurality of groups. Among these, —COO—, —OCO—, —CONH—, —NHCO—, —CO—, —O—, —SO$_2$—, —COO-alkylene group-, —OCO-alkylene group-, —CONH-alkylene group-, or —NHCO-alkylene group- is preferable, and —COO—, —OCO—, —CONH—, —SO$_2$—, —COO-alkylene group-, or —OCO-alkylene group-is more preferable.

W represents an organic group including a cyclic structure. Above all, it is preferably a cyclic organic group.

Examples of the cyclic organic group include an alicyclic group, an aryl group, and a heterocyclic group.

The alicyclic group may be monocyclic or polycyclic, and examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure having 7 or more carbon atoms, such as a norbornyl group, a tricyclodecanyl group, a tetracyclodecanyl group, a tetracyclododecanyl group, a diamantyl group, and an adamantyl group is preferable from the viewpoints of inhibiting diffusivity into the film during post exposure baking (PEB) process and improving Mask Error Enhancement Factor (MEEF).

The aryl group may be monocyclic or polycyclic. Examples of the aryl group include a phenyl group, a naphthyl group, a phenanthryl group, and an anthryl group. Among these, a naphthyl group showing a relatively low light absorbance at 193 nm is preferable.

The heterocyclic group may be monocyclic or polycyclic, but a polycyclic heterocyclic group can further suppress diffusion of the acid. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle having no aromaticity include a tetrahydropyran ring, a lactone ring, a sultone ring, and a decahydroisoquinoline ring. As a heterocycle in the heterocyclic group, a furan ring, a thiophene ring, a pyridine ring, or a decahydroisoquinoline ring is particularly preferable. Further, examples of the lactone ring and the sultone ring include the lactone structures and sultone structures exemplified in the above-mentioned resin.

The cyclic organic group may have a substituent. Examples of the substituent include, an alkyl group (which may be either linear or branched, and preferably has 1 to 12 carbon atoms), a cycloalkyl group (which may be any one of monocyclic, polycyclic, and spiro rings, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

o represents an integer of 1 to 3. p represents an integer of 0 to 10. q represents an integer of 0 to 10.

In one aspect, it is preferable that in General Formula (3), o is an integer of 1 to 3, p is an integer of 1 to 10, and q is 0. Xf is preferably a fluorine atom, $R_4$ and $R_5$ are preferably both hydrogen atoms, and W is preferably a polycyclic hydrocarbon group. o is more preferably 1 or 2, and still more preferably 1. p is more preferably an integer of 1 to 3, still more preferably 1 or 2, and particularly preferably 1. W is more preferably a polycyclic cycloalkyl group, and still more preferably an adamantyl group or a diamantyl group.

(Cation)

In General Formula (3), $X^+$ represents a cation.

$X^+$ is not particularly limited as long as it is a cation, but suitable aspects thereof include cations (moieties other than Z) in General Formula (ZI), (ZII), or (ZIII) which will be described later.

(Suitable Aspects)

Suitable aspects of the specific acid generator include a compound represented by General Formula (ZI), (ZII), or (ZIII).

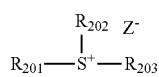
(ZI)

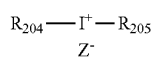
(ZII)

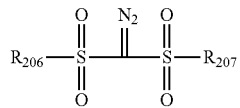
(ZIII)

In General Formula (ZI), $R_{201}$, $R_{202}$, and $R_{203}$ each independently represent an organic group.

The number of carbon atoms in the organic group as $R_{201}$, $R_{202}$, and $R_{203}$ is generally 1 to 30, and preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two of $R_{201}$ to $R_{203}$ include an alkylene group (for example, a butylene group and a pentylene group).

$Z^-$ represents an anion in General Formula (3), and specifically represents the following anion.

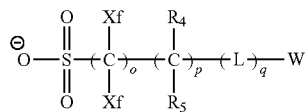

Examples of the organic group represented by $R_{201}$, $R_{202}$, and $R_{203}$ include groups corresponding to the compounds (ZI-1), (ZI-2), (ZI-3), and (ZI-4), which will be described later.

Incidentally, the specific acid generator may be a compound having a plurality of structures represented by General Formula (ZI). For example, it may be a compound having a structure in which at least one of $R_{201}$, . . . , or $R_{203}$ in the compound represented by General Formula (ZI) is bonded to at least one of $R_{201}$, . . . , or $R_{203}$ of another compound represented by General Formula (ZI) through a single bond or a linking group.

More preferred examples of the component (ZI) include the compounds (ZI-1), (ZI-2), (ZI-3), and (ZI-4) described below.

First, the compound (ZI-1) will be described.

The compound (ZI-1) is an arylsulfonium compound, that is, a compound having arylsulfonium as a cation, in which at least one of $R_{201}$, . . . , or $R_{203}$ in General Formula (ZI) is an aryl group.

In the arylsulfonium compound, all of $R_{201}$ to $R_{203}$ may be an aryl group, or a part of $R_{201}$ to $R_{203}$ may be an aryl group, with the remainder being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained, as desired, in the arylsulfonium compound, is preferably a linear or branched alkyl group having 1 to 15 carbon atoms or a cycloalkyl group having 3 to 15 carbon atoms, for example, a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as the substituent.

Next, the compound (ZI-2) will be described.

The compound (ZI-2) is a compound in which $R_{201}$ to $R_{203}$ in Formula (ZI) each independently represent an organic group not having an aromatic ring. Here, the aromatic ring also encompasses an aromatic ring containing a heteroatom.

The organic group not containing an aromatic ring as $R_{201}$ to $R_{203}$ has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

Preferred examples of the alkyl group and the cycloalkyl group of $R_{201}$ to $R_{203}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

$R_{201}$ to $R_{203}$ may further be substituted with a halogen atom, an alkoxy group (for example, an alkoxy group having 1 to 5 carbon atoms), a hydroxyl group, a cyano group, or a nitro group.

Next, the compound (ZI-3) will be described.

The compound (ZI-3) is a compound represented by General Formula (ZI-3), which is a compound having a phenacylsulfonium salt structure.

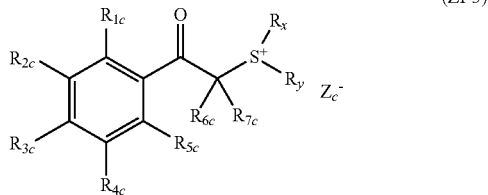

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Among any two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$, each may be bonded to each other to form a ring structure, and the ring structure may contain an oxygen atom, a sulfur atom, a ketone group, an ester bond, or an amide bond.

Examples of the ring structure include an aromatic or non-aromatic hydrocarbon ring, an aromatic or non-aromatic heterocycle, or a polycyclic fused ring formed of two or more of these rings. Examples of the ring structure include 3- to 10-membered rings, and the ring structures are preferably 4- to 8-membered ring, and more preferably 5- or 6-membered rings.

Examples of groups formed by the bonding of any two or more of $R_{1c}$ to $R_{5c}$, $R_{6c}$ and $R_{7c}$, and $R_x$ and $R_y$ include a butylene group and a pentylene group.

As groups formed by the bonding of $R_{5c}$ and $R_{6c}$, and $R_{5c}$ and $R_x$, a single bond or alkylene group is preferable, and examples of the alkylene group include a methylene group and an ethylene group.

$Zc^-$ represents an anion in General Formula (3), and specifically, is the same as described above.

Specific examples of the alkoxy group in the alkoxycarbonyl group as $R_{1c}$ to $R_{5c}$ are the same as the specific examples of the alkoxy group as $R_{1c}$ to $R_{5c}$.

Specific examples of the alkyl group in the alkylcarbonyloxy group and the alkylthio group as $R_{1c}$ to $R_{5c}$ are the same as the specific examples of the alkyl group as $R_{1c}$ to $R_{5c}$.

Specific examples of the cycloalkyl group in the cycloalkylcarbonyloxy group as $R_{1c}$ to $R_{5c}$ are the same as the specific examples of the cycloalkyl group as $R_{1c}$ to $R_{5c}$.

Specific examples of the aryl group in the aryloxy group and the arylthio group as $R_{1c}$ to $R_{5c}$ are the same as the specific examples of the aryl group as $R_{1c}$ to $R_{5c}$.

Examples of the cation in the compound (ZI-2) or (ZI-3) in the present invention include the cations described after paragraph <0036> of the specification of US2012/0076996A.

Next, the compound (ZI-4) will be described.

The compound (ZI-4) is represented by General Formula (ZI-4).

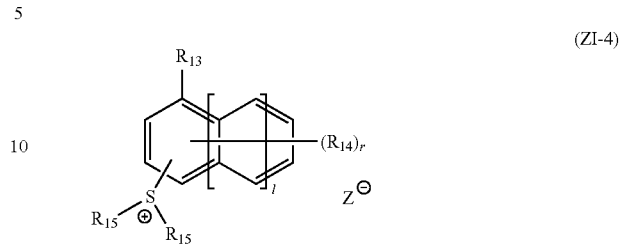

(ZI-4)

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

In a case where $R_{14}$'s are present in plural numbers, they each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to form a ring, the ring skeleton may include a heteroatom such as an oxygen atom and a nitrogen atom. In one aspect, it is preferable that two $R_{15}$'s are alkylene groups, and are bonded to each other to form a ring structure.

l represents an integer of 0 to 2.

r represents an integer of 0 to 8.

$Z^-$ represents an anion in General Formula (3), and specifically, is as described above.

In General Formula (ZI-4), as the alkyl group of $R_{13}$, $R_{14}$, and $R_{15}$, an alkyl which is linear or branched and has 1 to 10 carbon atoms is preferable, and preferred examples thereof include a methyl group, an ethyl group, an n-butyl group, and a t-butyl group.

Examples of the cation of the compound represented by General Formula (ZI-4) in the present invention include the cations described in paragraphs <0121>, <0123>, and <0124> of JP2010-256842A, paragraphs <0127>, <0129>, and <0130> of JP2011-76056A, and the like.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group of one of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group in $R_{204}$ to $R_{207}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

The aryl group, the alkyl group, or the cycloalkyl group of $R_{204}$ to $R_{207}$ may have a substituent. Examples of the substituent which the aryl group, the alkyl group, or the cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion in General Formula (3), and specifically, is as described above.

The acid generators may be used singly or in combination of two or more kinds thereof.

The content of the acid generator (a total sum of contents in a case where the acid generators are present in a plurality of kinds; hereinafter, the same shall be applied) in the resist composition of the present invention is preferably 5% to 35% by mass, more preferably 8% to 30% by mass, and still more preferably 8% to 25% by mass, with respect to the total solid content of the resist composition of the present invention.

(C) Solvent

Examples of the solvent which can be used in a case where the respective components are dissolved to prepare a resist composition include organic solvents such as alkylene glycol monoalkyl ether carboxylate, alkylene glycol monoalkyl ether, alkyl lactate ester, alkyl alkoxypropionate, a cyclic lactone having 4 to 10 carbon atoms, a monoketone compound having 4 to 10 carbon atoms, which may have a ring, alkylene carbonate, alkyl alkoxyacetate, and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl lactate ester include methyl lactate, ethyl lactate, propyl lactate, and butyl lactate.

Preferred examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Preferred examples of the monoketone compound having 4 to 10 carbon atoms, which may contain a ring, include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

Examples of the solvent that can be preferably used include solvents having a boiling point of 130° C. or higher under the conditions of normal temperature and normal pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, propylene carbonate, butyl butanoate, isoamyl acetate, and methyl 2-hydroxyisobutyrate.

In the present invention, the solvents may be used singly or in combination of two or more kinds thereof.

In the present invention, a mixed solvent obtained by mixing a solvent containing a hydroxyl group in its structure with a solvent not containing a hydroxyl group in its structure may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate, and among these, propylene glycol monomethyl ether and ethyl lactate are particularly preferable.

Examples of the solvent not containing a hydroxyl group include propylene glycol monomethyl ether acetate, ethylethoxypropionate, 2-heptanone, γ-butyrolactone, cyclohexanone, butyl acetate, N-methylpyrrolidone, N,N-dimethylacetamide, and dimethylsulfoxide, and among these, propylene glycol monomethyl ether acetate, ethylethoxypropionate, 2-heptanone, γ-butyrolactone, cyclohexanone, and butyl acetate are particularly preferable, and propylene glycol monomethyl ether acetate, ethylethoxypropionate, and 2-heptanone are most preferable.

The mixing ratio (mass ratio) of the solvent containing a hydroxyl group to the solvent not containing a hydroxyl group is 1/99 to 99/1, preferably 10/90 to 90/10, and more preferably 20/80 to 60/40. A mixed solvent including the solvent not containing a hydroxyl group in the amount of 50% by mass or more is particularly preferable from the viewpoint of coating evenness.

The solvent is preferably a mixed solvent of two or more kinds of solvents containing propylene glycol monomethyl ether acetate.

(D) Hydrophobic Resin

The resist composition of the present invention may contain a hydrophobic resin (D). As the hydrophobic resin, for example, a resin (X) which will be described later, which can be contained in a topcoat composition, can be suitably used. Further, other suitable examples of the hydrophobic resin include "[4] Hydrophobic Resin (D)" described in paragraphs <0389> to <0474> of JP2014-149409A.

The weight-average molecular weight of the hydrophobic resin (D) in terms of standard polystyrene is preferably 1,000 to 100,000, more preferably 1,000 to 50,000, and still more preferably 2,000 to 15,000.

Furthermore, the hydrophobic resin (D) may be used singly or in combination of a plurality of kinds thereof.

The content of the hydrophobic resin (D) in the resist composition is preferably 0.01% to 10% by mass, more preferably 0.05% to 8% by mass, and still more preferably 0.1% to 7% by mass, with respect to the total solid content of the resist composition of the present invention.

(E) Basic Compound

The resist composition of the present invention preferably contains a basic compound (E) in order to reduce a change in performance over time from exposure to heating.

Preferred examples of the basic compound include compounds having structures represented by Formulae (A) to (E).

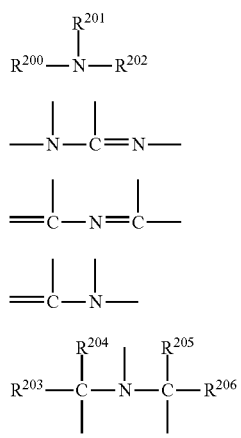

In General Formulae (A) to (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (having 6 to 20 carbon atoms), in which $R^{201}$ and $R^{202}$ may be bonded to each other to form a ring.

With respect to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other, and each represent an alkyl group having 1 to 20 carbon atoms.

The alkyl group in General Formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Furthermore, as the basic compound, a basic compound which may be contained in the composition (topcoat composition) for forming an upper layer film which will be described later can be suitably used.

These basic compounds may be used singly or in combination of two or more kinds thereof.

The amount of the basic compound to be used is usually 0.001% to 10% by mass, and preferably 0.01% to 5% by mass, with respect to the solid content of the resist composition of the present invention.

The ratio between the photoacid generator to the basic compound to be used in the resist composition is preferably the photoacid generator/basic compound (molar ratio)=2.5 to 300. That is, the molar ratio is preferably 2.5 or more in view of sensitivity and resolution, and is preferably 300 or less in view of suppressing the reduction in resolution due to thickening of the resist pattern with aging after exposure until the heat treatment. The photoacid generator/basic compound (molar ratio) is more preferably 5.0 to 200, and still more preferably 7.0 to 150.

(F) Surfactant

The resist composition of the present invention preferably further contains a surfactant (F), and more preferably contains either one or two or more of fluorine- and/or silicon-based surfactants (a fluorine-based surfactant, a silicon-based surfactant, or a surfactant containing both a fluorine atom and a silicon atom).

By incorporating the surfactant (F) into the resist composition of the present invention, it becomes possible to form a resist pattern which is decreased in adhesiveness and development defects with good sensitivity and resolution at the time of using an exposure light source of 250 nm or less, and particularly 220 nm or less.

Examples of the fluorine- and/or silicon-based surfactants include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-

62834A), JP1997-54432A (JP-H09-54432A), JP1997-5988A (JP-H09-5988A), JP2002-277862A, U.S. Pat. Nos. 5,405,720A, 5,360,692A, 5,529,881A, 5,296,330A, 5,436,098A, 5,576,143A, 5,294,511A, and U.S. Pat. No. 5,824,451A, and the following commercially available surfactants may be used as they are.

Examples of the commercially available surfactants that can be used include fluorine-based surfactants or silicon-based surfactants such as EFTOP EF301 and EF303 (manufactured by Shin-Akita Kasei K. K.); FLORAD FC430, 431, and 4430 (manufactured by Sumitomo 3M Inc.); MEGA-FACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.); TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); and FTX-204G, 208G, 218G, 230G, 204D, 208D, 212D, 218, and 222D (manufactured by NEOS COMPANY LIMITED). In addition, Polysiloxane Polymer KP-341 (manufactured by Shin-Etsu Chemical Co., Ltd.) can also be used as the silicon-based surfactant.

Furthermore, in addition to those known surfactants as described above, a surfactant using a polymer having a fluoroaliphatic group derived from a fluoroaliphatic compound which is produced by a telomerization method (also referred to as a telomer method) or an oligomerization method (also referred to as an oligomer method), can be used as the surfactant. The fluoroaliphatic compound can be synthesized in accordance with the method described in JP2002-90991A.

As the polymer having a fluoroaliphatic group, copolymer of monomers having fluoroaliphatic groups and (poly(oxyalkylene)) acrylate and/or (poly(oxyalkylene)) methacrylate are preferable, and they may be distributed at random or may be block copolymerized. Further, examples of the poly(oxyalkylene) group include a poly(oxyethylene) group, a poly(oxypropylene) group, and a poly(oxybutylene) group. Incidentally, the polymers may be units having alkylenes different in chain length in the same chain length, such as a poly(block combination of oxyethylene, oxypropylene, and oxybutylene), and poly(block combination of oxyethylene and oxypropylene). In addition, the copolymers of monomers having fluoroaliphatic groups and (poly(oxyalkylene)) acrylate (or methacrylate) may not be only binary copolymers but also ternary or higher copolymers obtained by copolymerization of monomers having different two or more kinds of fluoroaliphatic groups or different two or more kinds of (poly(oxyalkylene)) acrylates (or methacrylates) or the like at the same time.

Examples of the commercially available surfactant include MEGAFACE F178, F-470, F-473, F-475, F-476, and F-472 (manufactured by DIC Corp.); a copolymer of an acrylate (or methacrylate) having a $C_6F_{13}$ group with a (poly(oxyalkylene)) acrylate (or methacrylate); and a copolymer of an acrylate (or methacrylate) having a $C_3F_7$ group with a (poly(oxyethylene)) acrylate (or methacrylate) and a (poly(oxypropylene)) acrylate (or methacrylate).

Moreover, in the present invention, surfactants other than fluorine- and/or silicon-based surfactants can also be used. Specific examples thereof include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

These surfactants may be used singly or in combination of some kinds thereof.

The amount of the surfactant (F) to be used is preferably 0.01% to 10% by mass, and more preferably 0.1% to 5% by mass, with respect to the total amount (excluding the solvent) of the resist composition.

(G) Onium Carboxylate Salt

The resist composition of the present invention may contain an onium carboxylate salt (G). Examples of the onium carboxylate salt include a sulfonium carboxylate salt, an iodonium carboxylate salt, and an ammonium carboxylate salt. In particular, as the onium carboxylate salt (G), an iodonium salt and a sulfonium salt are preferable. Further, it is preferable that the carboxylate residue of the onium carboxylate salt (G) does not contain an aromatic group and a carbon-carbon double bond. As a particularly preferred anionic moiety, a linear, branched, or cyclic (monocyclic or polycyclic) alkylcarboxylate anion having 1 to 30 carbon atoms is preferable. Further, a carboxylate anion in which a part or all of the alkyl groups are substituted with fluorine is more preferable. An oxygen atom may be contained in the alkyl chain, by which the transparency to the light at 220 nm or less is ensured, thus, sensitivity and resolving power are enhanced, and density dependency and exposure margin are improved.

Examples of the fluorine-substituted carboxylate anion include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid.

These onium carboxylate salts (G) can be synthesized by reacting sulfonium hydroxide, iodonium hydroxide, or ammonium hydroxide and carboxylic acid with silver oxide in an appropriate solvent.

The content of the onium carboxylate salt (G) in the composition is generally 0.1% to 20% by mass, preferably 0.5% to 10% by mass, and more preferably 1% to 7% by mass, with respect to the total solid contents of the resist composition.

(H) Other Additives

The resist composition of the present invention can further contain a dye, a plasticizer, a light sensitizer, a light absorbent, an alkali-soluble resin, a dissolution inhibitor, a compound that promotes solubility in a developer (for example, a phenol compound with a molecular weight of 1,000 or less, an alicyclic or aliphatic compound having a carboxyl group), and the like, as desired.

Such a phenol compound having a molecular weight of 1,000 or less may be easily synthesized by those skilled in the art with reference to the method described in, for example, JP1992-122938A (JP-H04-122938A), JP1990-28531A (JP-H02-28531A), U.S. Pat. No. 4,916,210A, EP219294B, and the like.

Specific examples of the alicyclic or aliphatic compound having a carboxyl group include, but not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

[Composition (Topcoat Composition) for Forming Upper Layer Film]

Next, a composition (topcoat composition) of the present invention for forming an upper layer film of the present invention will be described.

Furthermore, the topcoat composition is a composition which is used to form an upper layer film (topcoat) on a resist film. In a case of carrying out liquid immersion exposure in the pattern forming method of the present invention, it is possible to prevent an immersion liquid from being in direct contact with the resist film by forming a topcoat on the resist film. Thus, it is possible to expect effects that deterioration of the resist performance due to permeation of the immersion liquid into the resist film and elution of the resist film components into the immersion liquid is suppressed, and contamination of a lens in an exposure device by elution of the elution components into the immersion liquid is prevented.

The topcoat composition of the present invention includes a resin X (hereinafter also referred to as a "resin (X)") and a compound A having a radical trapping group. Hereinafter, the respective components included in the topcoat composition of the present invention will be described.

[Resin (X)]

The resin (X) in the topcoat composition is preferably transparent to an exposure light source to be used, for the light to reach a resist film through a topcoat upon exposure. In a case where the resin (X) is used for ArF liquid immersion exposure, it is preferable that the resin (X) does not have an aromatic group in view of transparency to ArF light.

The resin (X) preferably has any one or more of a "fluorine atom," a "silicon atom," or a "$CH_3$ partial structure which is contained in a side chain moiety of a resin", and preferably has two or more of the atom or structure. The resin (X) is preferably a hydrophobic resin (water-insoluble resin).

In a case where the resin (X) has a fluorine atom and/or a silicon atom, the fluorine atom and/or the silicon atom may be bonded in the main chain or bonded in the side chain of the resin (X).

In a case where the resin (X) has a fluorine atom, it is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have another substituent.

The cycloalkyl group having a fluorine atom is a monocyclic or polycyclic cycloalkyl group in which at least one hydrogen atom is substituted with a fluorine atom, and they may further have another substituent.

The aryl group having a fluorine atom is an aryl group in which at least one hydrogen atom is substituted with a fluorine atom, such as a phenyl group and a naphthyl group, and they may further have another substituent.

Specific examples of the alkyl group having a fluorine atom, the cycloalkyl group having a fluorine atom, and the aryl group having a fluorine atom are shown below, but the present invention is not limited thereto.

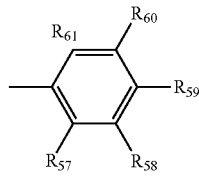

(F2)

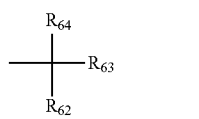

(F3)

In General Formulae (F2) to (F3), $R_{57}$ to $R_{64}$ each independently represent a hydrogen atom, a fluorine atom, or an alkyl group, provided that at least one of $R_{57}$, ..., or $R_{61}$ or of $R_{62}$, ..., or $R_{64}$ is a fluorine atom or an alkyl group (preferably having 1 to 4 carbon atoms) in which at least one hydrogen atom is substituted for by a fluorine atom. It is preferable that all of $R_{57}$ to $R_{61}$ are a fluorine atom. $R_{62}$ and $R_{63}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include a trifluoroethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl) hexyl group, a 2,2,3,3-tetrafluorocyclobutyl group, and a perfluorocyclohexyl group. A hexafluoroisopropyl group, a heptafluoroisopropyl group, a hexafluoro(2-methyl)isopropyl group, an octafluoroisobutyl group, a nonafluoro-t-butyl group, or a perfluoroisopentyl group is preferable, and a hexafluoroisopropyl group or a heptafluoroisopropyl group is more preferable.

In a case where the resin (X) has a silicon atom, it is preferably a resin having an alkylsilyl structure (preferably a trialkylsilyl group) or a cyclic siloxane structure as a partial structure having a silicon atom.

Examples of the resin (X) include a resin having at least one selected from the group of the repeating units represented by General Formulae (C-I) to (C-V).

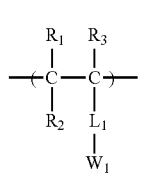

(C-I)

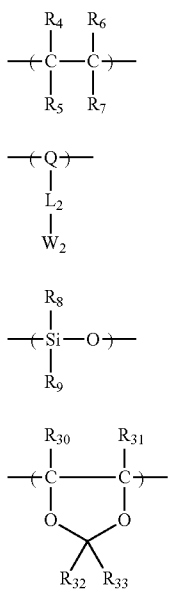

(C-II)

(C-III)

(C-IV)

(C-V)

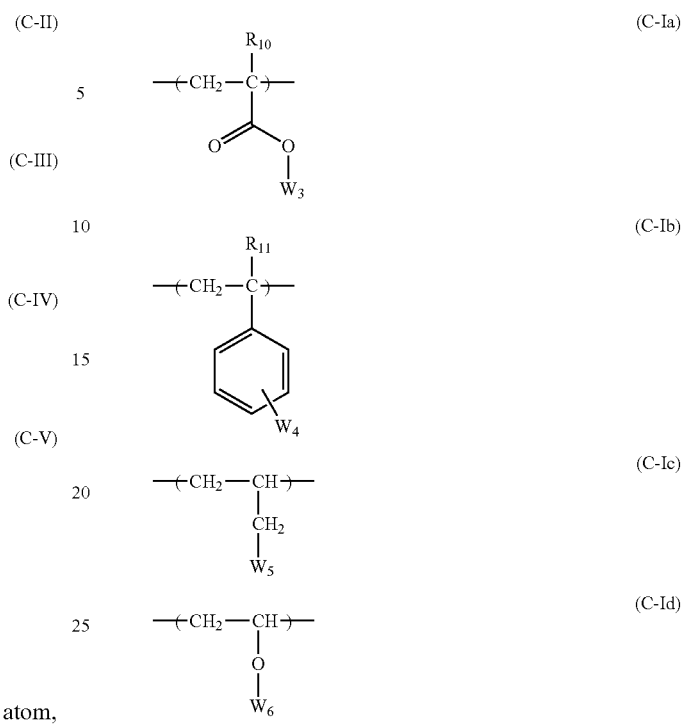

(C-Ia)

(C-Ib)

(C-Ic)

(C-Id)

In General Formulae (C-I) to (C-V), $R_1$ to $R_3$ each independently represent a hydrogen atom, a fluorine atom, a linear or branched alkyl group having 1 to 4 carbon atoms, or a linear or branched fluorinated alkyl group having 1 to 4 carbon atoms.

$W_1$ and $W_2$ each represent an organic group having at least one of a fluorine atom or a silicon atom.

$R_4$ to $R_7$ each independently represent a hydrogen atom, a fluorine atom, a linear or branched alkyl group having 1 to 4 carbon atoms, or a linear or branched fluorinated alkyl group having 1 to 4 carbon atoms, provided that at least one of $R_4, \ldots,$ or $R_7$ represents a fluorine atom. $R_4$ and $R_5$, or $R_6$ and $R_7$ may be combined to form a ring.

$R_8$ represents a hydrogen atom or a linear or branched alkyl group having 1 to 4 carbon atoms.

$R_9$ represents a linear or branched alkyl group having 1 to 4 carbon atoms or a linear or branched fluorinated alkyl group having 1 to 4 carbon atoms.

$L_1$ and $L_2$ each represent a single bond or a divalent linking group.

Q represents a monocyclic or polycyclic aliphatic group. That is, it represents an atomic group containing two carbon atoms (C—C) bonded to each other for forming an alicyclic structure.

$R_{30}$ and $R_{31}$ each independently represent a hydrogen atom or a fluorine atom.

$R_{32}$ and $R_{33}$ each independently represent an alkyl group, a cycloalkyl group, a fluorinated alkyl group, or a fluorinated cycloalkyl group.

It is to be noted that the repeating unit represented by General Formula (C-V) has at least one fluorine atom in at least one of $R_{30}$, $R_{31}$, $R_{32}$, or $R_{33}$.

The resin (X) preferably has a repeating unit represented by General Formula (C-I), and more preferably a repeating unit represented by one of General Formulae (C-Ia) to (C-Id).

In General Formulae (C-Ia) to (C-Id), $R_{10}$ and $R_{11}$ each represents a hydrogen atom, a fluorine atom, a linear or branched alkyl group having 1 to 4 carbon atoms, or a linear or branched fluorinated alkyl group having 1 to 4 carbon atoms.

$W_3$ to $W_6$ are each an organic group having one or more of at least one of a fluorine atom or a silicon atom.

In a case where $W_3$ to $W_6$ are each an organic group having a fluorine atom, they are each preferably a fluorinated, linear or branched alkyl group or cycloalkyl group having 1 to 20 carbon atoms, or a linear, branched, or cyclic fluorinated alkyl ether group having 1 to 20 carbon atoms.

Examples of the fluorinated alkyl group represented by one of $W_3$ to $W_6$ include a trifluoroethyl group, a pentafluoropropyl group, a hexafluoroisopropyl group, a hexafluoro (2-methyl)isopropyl group, a heptafluorobutyl group, a heptafluoroisopropyl group, an octafluoroisobutyl group, a nonafluorohexyl group, a nonafluoro-t-butyl group, a perfluoroisopentyl group, a perfluorooctyl group, and a perfluoro(trimethyl)hexyl group.

Specific examples of the repeating unit represented by General Formula (C-I) are shown below, but are not limited thereto. X represents a hydrogen atom, —CH$_3$, —F, or —CF$_3$.

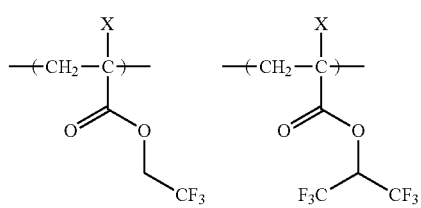

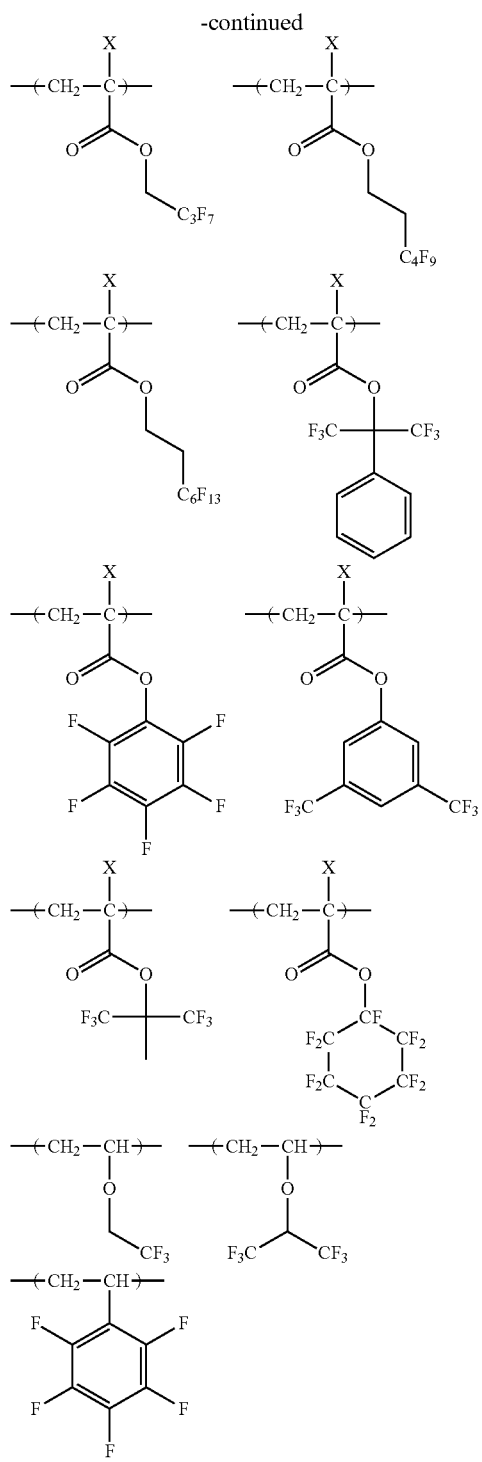

Furthermore, it is also preferable that the resin (X) includes a CH₃ partial structure in the side chain moiety, as described above. The resin (X) preferably includes a repeating unit having at least one CH₃ partial structure in the side chain moiety, more preferably includes a repeating unit having at least two CH₃ partial structures in the side chain moiety, and still more preferably includes a repeating unit having at least three CH₃ partial structures in the side chain moiety.

Here, the CH₃ partial structure (hereinafter also simply referred to as a "side chain CH₃ partial structure") contained in the side chain moiety in the resin (X) includes a CH₃ partial structure contained in an ethyl group, a propyl group, or the like.

On the other hand, a methyl group bonded directly to the main chain of the resin (X) (for example, an α-methyl group in the repeating unit having a methacrylic acid structure) makes only a small contribution of uneven distribution to the surface of the resin (X) due to the effect of the main chain, and it is therefore not included in the CH₃ partial structure in the present invention.

More specifically, in a case where the resin (X) contains a repeating unit derived from a monomer having a polymerizable moiety with a carbon-carbon double bond, such as a repeating unit represented by General Formula (M), and in addition, $R_{11}$ to $R_{14}$ are CH₃ "themselves", such CH₃ is not included in the CH₃ partial structure contained in the side chain moiety in the present invention.

On the other hand, a CH₃ partial structure which is present via a certain atom from a C—C main chain corresponds to the CH₃ partial structure in the present invention. For example, in a case where $R_{11}$ is an ethyl group (CH₂CH₃), the resin (X) has "one" CH₃ partial structure in the present invention.

(M)

$$\begin{array}{c} R_{11} \;\; R_{13} \\ | \;\;\;\; | \\ -(C-C)- \\ | \;\;\;\; | \\ R_{12} \;\; R_{14} \end{array}$$

In General Formula (M), $R_{11}$ to $R_{14}$ each independently represent a side chain moiety.

Examples of $R_{11}$ to $R_{14}$ in the side chain moiety include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The resin (X) is preferably a resin including a repeating unit having the CH₃ partial structure in the side chain moiety thereof, and more preferably has, as such a repeating unit, at least one repeating unit (x) of the repeating units represented by General Formula (II) or a repeating unit represented by General Formula (III). In particular, in a case where KrF, EUV, or electron beams (EB) are used as an exposure light source, the resin (X) can suitably include the repeating unit represented by General Formula (III).

Hereinafter, the repeating unit represented by General Formula (II) will be described in detail.

(II)

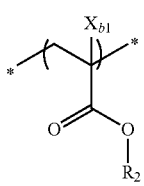

In General Formula (II), $X_{b1}$ represents a hydrogen atom, an alkyl group, a cyano group, or a halogen atom, and $R_2$ represents an organic group having one or more CH₃ partial structures, which is stable against an acid.

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more CH₃ partial structures. The cycloalkyl group, the alkenyl group, the cycloalkenyl group, the aryl group, and the aralkyl group may further have an alkyl group as a substituent.

$R_2$ is preferably an alkyl group or an alkyl-substituted cycloalkyl group, which has one or more CH₃ partial structures.

The number of the CH₃ partial structures contained in the organic group which has one or more CH₃ partial structures and is stable against an acid as $R_2$ is preferably from 2 to 10, more preferably from 2 to 8, and still more preferably from 3 to 8.

The alkyl group having one or more CH₃ partial structures in $R_2$ is preferably a branched alkyl group having 3 to 20 carbon atoms. Specific preferred examples of the alkyl group include an isopropyl group, an isobutyl group, a t-butyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group, and the alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

The cycloalkyl group having one or more CH₃ partial structures in $R_2$ may be monocyclic or polycyclic. Specific examples thereof include groups having a monocyclo, bicyclo, tricyclo, or tetracyclo structure having 5 or more carbon atoms. The number of carbon atoms is preferably 6 to 30, and particularly preferably 7 to 25. Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group, and the cycloalkyl group is more preferably an adamantyl group, a norbornyl group, a cyclohexyl group, a cyclopentyl group, a tetracyclododecanyl group, or a tricyclodecanyl group, and even more preferably a norbornyl group, a cyclopentyl group, or a cyclohexyl group.

The alkenyl group having one or more CH₃ partial structures in $R_2$ is preferably a linear or branched alkenyl group having 1 to 20 carbon atoms, and more preferably a branched alkenyl group.

The aryl group having one or more CH₃ partial structures in $R_2$ is preferably an aryl group having 6 to 20 carbon atoms, and examples thereof include a phenyl group and a naphthyl group, and the aryl group is preferably a phenyl group.

The aralkyl group having one or more CH₃ partial structures in $R_2$ is preferably an aralkyl group having 7 to 12 carbon atoms, and examples thereof include a benzyl group, a phenethyl group, and a naphthylmethyl group.

Specific examples of the hydrocarbon group having two or more CH₃ partial structures in $R_2$ include an isopropyl group, an isobutyl group, a t-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 3,5-ditert-butylcyclohexyl group, a 4-isopropylcyclohexyl group, a 4-t-butylcyclohexyl group, and an isobornyl group. The hydrocarbon group is more preferably an isobutyl group, a t-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 3,5-ditert-butylcyclohexyl group, a 4-isopropylcyclohexyl group, a 4-t-butylcyclohexyl group, or an isobornyl group.

Specific preferred examples of the repeating unit represented by General Formula (II) are shown below, but the present invention is not limited thereto.

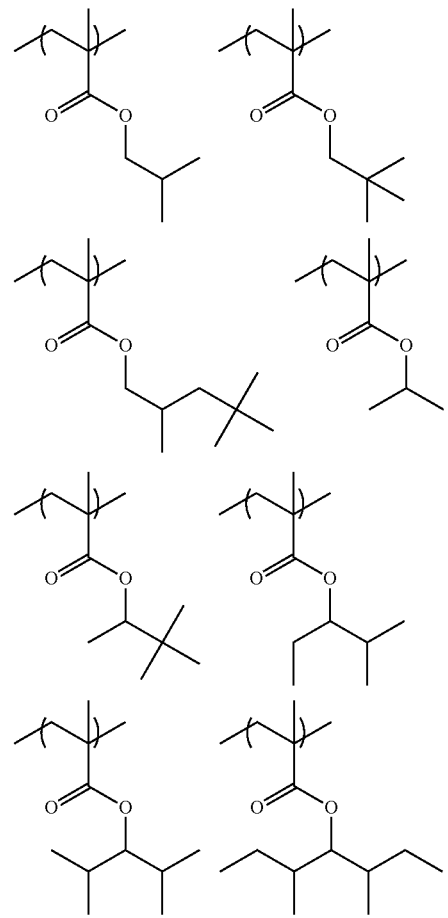

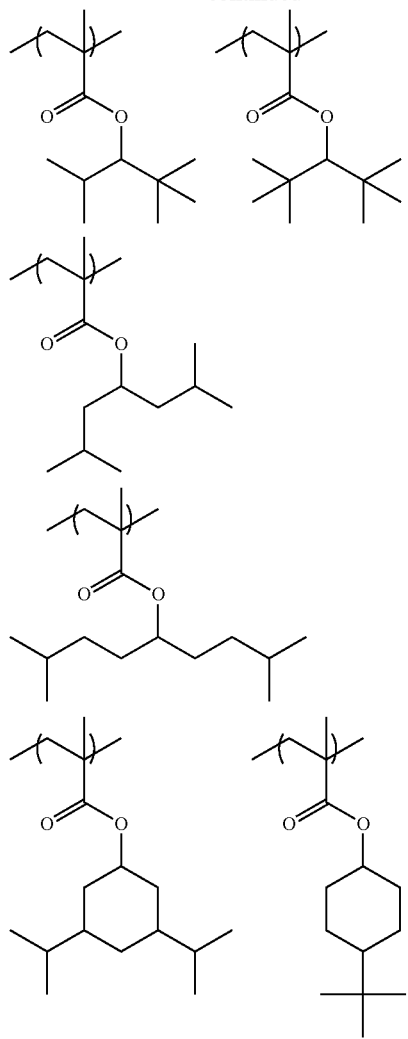
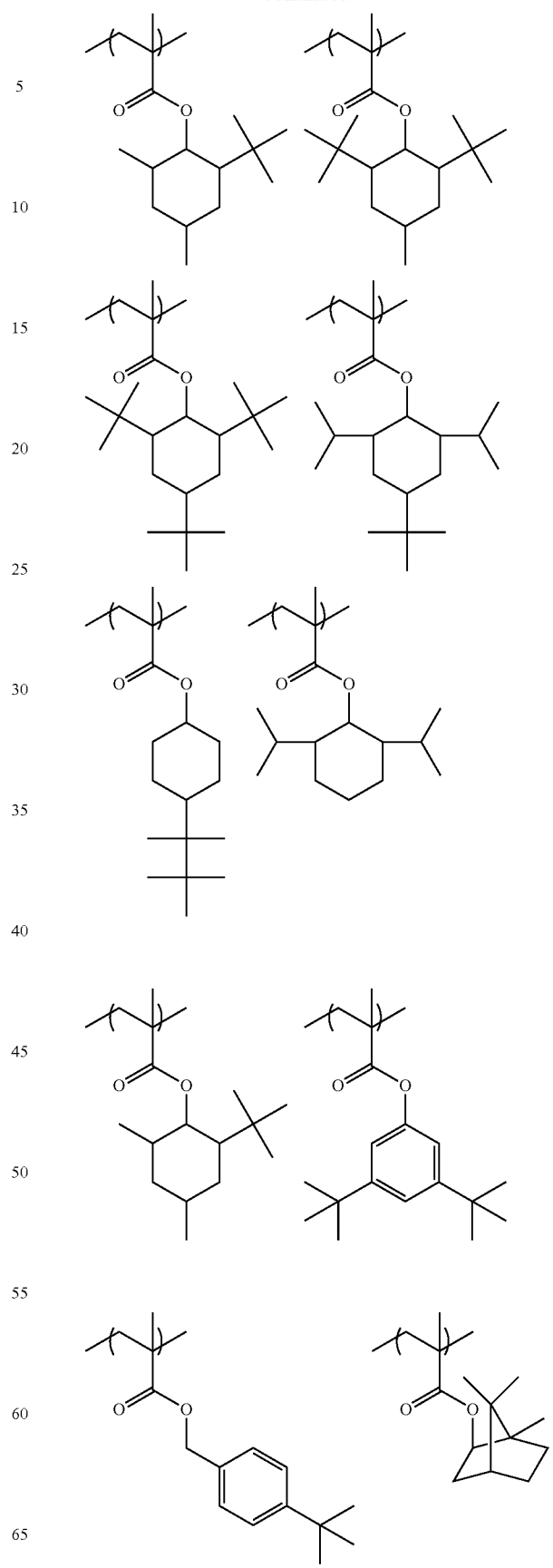

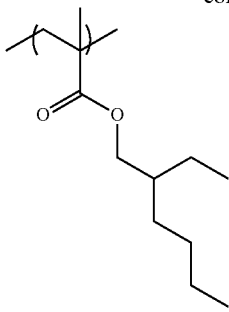

The repeating unit represented by General Formula (II) is preferably a repeating unit which is stable against an acid (non-acid-decomposable), and specifically, it is preferably a repeating unit not having a group capable of decomposing by the action of an acid to generate a polar group (alkali-soluble group).

Hereinafter, the repeating unit represented by General Formula (III) will be described in detail.

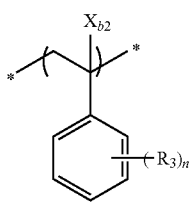

In General Formula (III), $X_{b2}$ represents a hydrogen atom, an alkyl group, a cyano group, or a halogen atom, $R_3$ represents an organic group having one or more $CH_3$ partial structures, which is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

$X_{b2}$ is preferably a hydrogen atom.

Since $R_3$ is an organic group which is stable against an acid, $R_3$ is preferably an organic group which does not a group capable of decomposing by the action of an acid to generate a polar group (alkali-soluble group).

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably from 1 to 10, more preferably from 1 to 8, and still more preferably from 1 to 4.

The alkyl group having one or more $CH_3$ partial structures in $R_3$ is preferably a branched alkyl group having 3 to 20 carbon atoms. Specific preferred examples of the alkyl group include an isopropyl group, an isobutyl group, a t-butyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

Specific examples of the alkyl group having two or more $CH_3$ partial structures in $R_3$ include an isopropyl group, an isobutyl group, a t-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably one having 5 to 20 carbon atoms, and is an isopropyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

n represents an integer of 1 to 5, preferably an integer of 1 to 3, and more preferably 1 or 2.

Specific preferred examples of the repeating unit represented by General Formula (III) are shown below, but the present invention is not limited thereto.

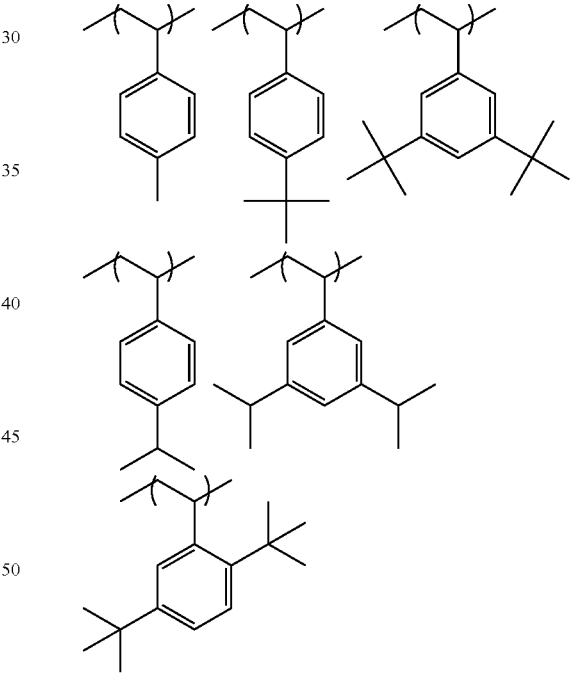

The repeating unit represented by General Formula (III) is preferably a repeating unit which is stable against an acid (non-acid-decomposable), and specifically, it is preferably a repeating unit which does not have a group capable of decomposing by the action of an acid to generate a polar group (alkali-soluble group).

In a case where the resin (X) includes a $CH_3$ partial structure in the side chain moiety, and has neither a fluorine atom nor a silicon atom, the content of at least one repeating unit (x) of the repeating unit represented by General Formula (II) or the repeating unit represented by General Formula (III) may be, for example, 20% by mole or more, and is preferably 30% by mole or more, more preferably 90% by mole or more, and still more preferably 95% by mole or more, with respect to all the repeating units of the resin (X). The upper limit is not particularly limited, and may be, for example, 100% by mole or less.

In a case where the resin (X) includes a $CH_3$ partial structure in the side chain moiety, and has a fluorine atom and/or a silicon atom, the content of at least one repeating unit (x) of the repeating unit represented by General Formula (II) or the repeating unit represented by General Formula (III) is preferably 20% by mole or more, and more preferably 30% by mole or more, with respect to all the repeating units of the resin (X). The upper limit is preferably 95% by mole less, and more preferably 90% by mole or less.

The resin (X) may contain a repeating unit (d) derived from a monomer having an alkali-soluble group. Thus, it is possible to control the solubility in an immersion liquid and the solubility in a coating solvent. Examples of the alkali-soluble group include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a group having a tris(alkylsulfonyl)methylene group.

As the monomer having an alkali-soluble group, a monomer having an acid dissociation constant pKa of 4 or more is preferable, a monomer having a pKa of 4 to 13 is more preferable, and a monomer having a pKa of 8 to 13 is the most preferable. By incorporation of a monomer having a pKa of 4 or more, swelling upon development of a negative tone and a positive tone is suppressed, and thus, not only good developability for an organic developer but also good developability in a case of using an alkali developer are obtained.

Moreover, the acid dissociation constant pKa in the present specification will be which will be described later, but represents a value determined by the calculation using a software package 1 (which will be described later).

The monomer having a pKa of 4 or more is not particularly limited, and examples thereof include a monomer containing an acid group (alkali-soluble group) such as a phenolic hydroxyl group, a sulfonamido group, —COCH$_2$CO—, a fluoroalcohol group, and a carboxylic acid group. A monomer containing a fluoroalcohol group is particularly preferable. The fluoroalcohol group is a fluoroalkyl group substituted with at least one hydroxyl group, preferably having 1 to 10 carbon atoms, and more preferably 1 to 5 carbon atoms. Specific examples of the fluoroalcohol group include —CF$_2$OH, —CH$_2$CF$_2$OH, —CH$_2$CF$_2$CF$_2$OH, —C(CF$_3$)$_2$OH, —CF$_2$CF(CF$_3$)OH, and —CH$_2$C(CF$_3$)$_2$OH. As a fluoroalcohol group, a hexafluoroisopropanol group is particularly preferable.

The total amount of the repeating unit derived from a monomer having an alkali-soluble group in the resin (X) is preferably 0% to 90% by mole, more preferably 0% to 80% by mole, and still more preferably 0% to 70% by mole, with respect to all the repeating units constituting the resin (X).

The monomer having an alkali-soluble group may contain only one or two or more acid groups. The repeating unit derived from the monomer preferably has two or more acid groups, more preferably 2 to 5 acid groups, and particularly preferably 2 or 3 acid groups, per one repeating unit.

Specific examples of the repeating unit derived from a monomer having an alkali-soluble group include, but not limited to, those described in paragraphs <0278> to <0287> of JP2008-309878A.

In one of preferred aspects, the resin (X) may be any one resin selected from (X-1) to (X-8) described in paragraph <0288> of JP2008-309878A.

The resin (X) is preferably solid at normal temperature (25° C.). Further, the glass transition temperature (Tg) is preferably 50° C. or higher, more preferably 70° C. or higher, and still more preferably 80° C. or higher.

In addition, the upper limit of Tg of the resin (X) is preferably, for example, 250° C. or less.

The resin (X) preferably has a repeating unit having a monocyclic or polycyclic cycloalkyl group. The monocyclic or polycyclic cycloalkyl group may be included in any one of the main chain and the side chain of the repeating unit. The resin (X) more preferably has a repeating unit having both of a monocyclic or polycyclic cycloalkyl group and a $CH_3$ partial structure, and still more preferably has a repeating unit having both of a monocyclic or polycyclic cycloalkyl group and a $CH_3$ partial structure in the side chain.

The resin being solid at 25° C. means that it has a melting point of 25° C. or higher.

The glass transition temperature (Tg) can be measured by a differential scanning calorimeter. For example, it can be determined by after heating a sample and then cooling, followed by analyzing the change in the specific volume in a case of heating the sample again at 5° C./min.

It is preferable that the resin (X) is insoluble in an immersion liquid (preferably water) and is soluble in an organic developer. From the viewpoint of the possibility of release by development using an alkali developer, it is preferable that the resin (X) is also soluble in an alkali developer.

In a case where the resin (X) has silicon atoms, the content of the silicon atoms is preferably 2% to 50% by mass, and more preferably 2% to 30% by mass, with respect to the molecular weight of the resin (X). Further, the amount of the repeating units containing silicon atoms is preferably 10% to 100% by mass, and more preferably 20% to 100% by mass, in the resin (X).

In a case where the resin (X) contains fluorine atoms, the content of fluorine atoms is preferably 5% to 80% by mass, and more preferably 10% to 80% by mass, with respect to the molecular weight of the resin (X). Further, the content of the repeating units containing fluorine atoms is preferably 10% to 100% by mass, and more preferably 30% to 100% by mass, in the resin (X).

On the other hand, particularly in a case where the resin (X) includes a $CH_3$ partial structure in the side chain moiety, an aspect in which the resin (X) does not substantially contain a fluorine atom is also preferable, and in this case, specifically, the content of the repeating unit having a fluorine atom in the resin (X) is preferably 0% to 20% by mole, more preferably 0% to 10% by mole, still more preferably 0% to 5% by mole, particularly preferably 0% to 3% by mole, and ideally 0% by mole, that is, containing no fluorine atom, with respect to all the repeating units.

Furthermore, the resin (X) preferably consists of substantially only a repeating unit formed of only atoms selected from a carbon atom, an oxygen atom, a hydrogen atom, a nitrogen atom, and a sulfur atom. More specifically, the repeating unit formed of only atoms selected from a carbon atom, an oxygen atom, a hydrogen atom, a nitrogen atom, and a sulfur atom preferably accounts for 95% by mole or more, more preferably 97% by mole or more, still more preferably 99% by mole or more, and ideally 100% by mole, with respect to all the repeating units in the resin (X).

The weight-average molecular weight of the resin (X), in terms of standard polystyrene, is preferably 1,000 to 100,000, more preferably 1,000 to 50,000, still more preferably 2,000 to 15,000, and particularly preferably 3,000 to 15,000.

In the resin (X), naturally, the content of impurities such as a metal is small, but the content of residual monomers is also preferably 0% to 10% by mass, more preferably 0% to 5% by mass, and still more preferably 0% to 1% by mass, from the viewpoint of reduction in elution from a topcoat to an immersion liquid. Further, the molecular weight distribution (Mw/Mn, hereinafter also referred to as "dispersity") is preferably in a range of 1 to 5, more preferably in a range of 1 to 3, and still more preferably in a range of 1 to 1.5.

Various commercially available products may be used as the resin (X), or the resin may be synthesized by a conventional method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethyl formamide and dimethyl acetamide; and solvents which dissolve the resist composition, such as propylene glycol monomethyl ether acetate, propylene glycol monomethyl ether, and cyclohexanone.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferable examples of the initiators include azobisisobutyronitrile, azobisdimethylvaleronitrile, and dimethyl 2,2'-azobis(2-methyl propionate). As desired, a chain transfer agent can also be used. The concentration of the reactant is usually 5% to 50% by mass, preferably 20% to 50% by mass, and more preferably 30% to 50% by mass. The reaction temperature is usually 10° C. to 150° C., preferably 30° C. to 120° C., and more preferably 60° C. to 100° C.

After the completion of the reaction, cooling is carried out to room temperature, and purification is carried out. A usual method such as a liquid-liquid extraction method in which a residual monomer or an oligomer component is removed by washing with water or combining suitable solvents, a purification method in a solution state such as ultrafiltration which extracts and removes only substances having a specific molecular weight or less, a re-precipitation method in which a residual monomer or the like is removed by adding a resin solution dropwise to a poor solvent to coagulate the resin in the poor solvent, or a purification method in a solid state in which filtered resin slurry is washed with a poor solvent can be applied to the purification. For example, by bringing into contact with a solvent (poor solvent), which poorly dissolves or does not dissolve the resin, corresponding to 10 times or less the volume amount of the reaction solution, or preferably 5 to 10 times the volume amount of the reaction solution, the resin is solidified and precipitated.

The solvent (precipitation or reprecipitation solvent) to be used in a case of precipitation or reprecipitation from the polymer solution may be an arbitrary one so long as it is a poor solvent to the polymer. Depending on the kind of the polymer, it may be appropriately selected from, for example, a hydrocarbon (for example, an aliphatic hydrocarbon such as pentane, hexane, heptane, and octane; an alicyclic hydrocarbon such as cyclohexane and methylcyclohexane; and an aromatic hydrocarbon such as benzene, toluene, and xylene), a halogenated hydrocarbon (for example, a halogenated aliphatic hydrocarbon such as methylene chloride, chloroform, and carbon tetrachloride; a halogenated aromatic hydrocarbon such as chlorobenzene and dichlorobenzene), a nitro compound (for example, nitromethane and nitroethane), a nitrile (for example, acetonitrile and benzonitrile), an ether (for example, a chain ether such as diethyl ether, diisopropyl ether, and dimethoxyethane; and a cyclic ether such as tetrahydrofuran and dioxane), a ketone (for example, acetone, methyl ethyl ketone, and diisobutyl ketone), an ester (for example, ethyl acetate, butyl acetate), a carbonate (for example, dimethyl carbonate, diethyl carbonate, ethylene carbonate, and propylene carbonate), an alcohol (for example, methanol, ethanol, propanol, isopropyl alcohol, and butanol), a carboxylic acid (for example, acetic acid), water, and a mixed solvent containing the same. Among these, the precipitation or reprecipitation solvent is preferably a solvent containing at least an alcohol (particularly methanol or the like) or water. In such a solvent containing at least a hydrocarbon, the ratio of the alcohol (particularly, methanol or the like) to other solvents (for example, an ester such as ethyl acetate, and ethers such as tetrahydrofuran) is approximately, for example, the former/the latter (volume ratio; 25° C.) ranging from 10/90 to 99/1, preferably the former/the latter (volume ratio; 25° C.) ranging from 30/70 to 98/2, more preferably the former/the latter (volume ratio; 25° C.) ranging from 50/50 to 97/3.

The amount of the precipitation or reprecipitation solvent to be used may be appropriately selected by taking into consideration efficiency, yield, or the like. In general, it is used in an amount of 100 to 10,000 parts by mass, preferably 200 to 2,000 parts by mass, and more preferably 300 to 1,000 parts by mass, with respect to 100 parts by mass of the polymer solution.

In a case of feeding the polymer solution into a precipitation or reprecipitation solvent (poor solvent), the nozzle pore diameter is preferably 4 mmφ or less (for example, 0.2 to 4 mmφ) and the feeding rate (dropwise addition rate) of the polymer solution into the poor solvent is, for example, in terms of a linear velocity, 0.1 to 10 m/sec, and preferably approximately 0.3 to 5 m/sec.

The precipitation or reprecipitation procedure is preferably carried out under stirring. Examples of the stirring blade which can be used for the stirring include a disc turbine, a fan turbine (including a paddle), a curved vane turbine, an arrow feather turbine, a Pfaudler type, a bull margin type, an angled vane fan turbine, a propeller, a multistage type, an anchor type (or horseshoe type), a gate type, a double ribbon type, and a screw type. It is preferable that the stirring is further carried out for 10 minutes or more, in particular, 20 minutes or more, after the completion of feeding of the polymer solution. In a case where the stirring time is too short, the monomer content in the polymer particles may not be sufficiently reduced in some cases. Further, the mixing and stirring of the polymer solution and the poor solvent may also be carried out by using a line mixer instead of the stirring blade.

Although the temperature in a case of the precipitation or reprecipitation may be appropriately selected by taking into consideration efficiency or operability, the temperature is usually approximately 0° C. to 50° C., preferably in the vicinity of room temperature (for example, approximately 20° C. to 35° C.). The precipitation or reprecipitation procedure may be carried out by using a commonly employed mixing vessel such as stirring tank according to a known method such as batch system and continuous system.

The precipitated or reprecipitated particulate polymer is usually subjected to commonly employed solid-liquid separation such as filtration and centrifugation and then dried before using. The filtration is carried out by using a solvent-resistant filter material preferably under elevated pressure. The drying is carried out under normal pressure or reduced pressure (preferably under reduced pressure) at a temperature of approximately 30° C. to 100° C., and preferably approximately 30° C. to 50° C.

Furthermore, after the resin is once precipitated and separated, it may be redissolved in a solvent and then brought into contact with a solvent in which the resin is sparingly soluble or insoluble.

That is, the method may include, after the completion of a radical polymerization reaction, precipitating a resin by bringing the polymer into contact with a solvent in which the polymer is sparingly soluble or insoluble (step A), separating the resin from the solution (step B), dissolving the resin in a solvent again to prepare a resin solution A (step C), then precipitating a resin solid by bringing the resin solution A into contact with a solvent in which the resin is sparingly soluble or insoluble and which is in a volume amount of less than 10 times (preferably a volume amount of 5 times or less) the resin solution A (step D), and separating the precipitated resin (step E).

As the solvent used in a case of the preparation of the resin solution A, the same solvent as the solvent for dissolving the monomer in a case of the polymerization reaction may be used, and the solvent may be the same as or different from each other from the solvent used in a case of the polymerization reaction.

The resin (X) may be used singly or in combination of two or more kinds thereof.

The blend amount of the resin (X) in the entire topcoat composition of the present invention is preferably 50% to 99.9% by mass, and more preferably 60% to 99.0% by mass, with respect to the total solid content.

Preferred examples of the resin (X) are shown below, but the present invention is not limited thereto.

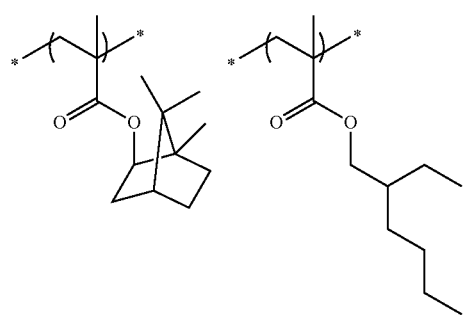

A-1

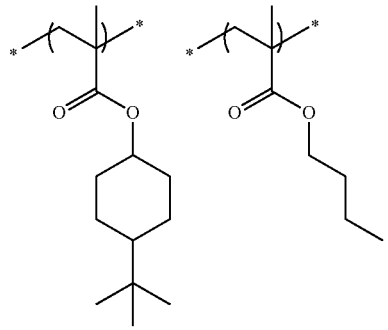

A-2

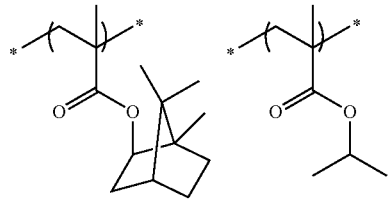

A-3

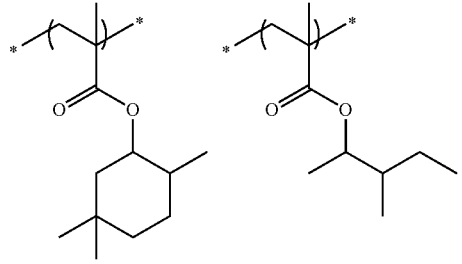

A-4

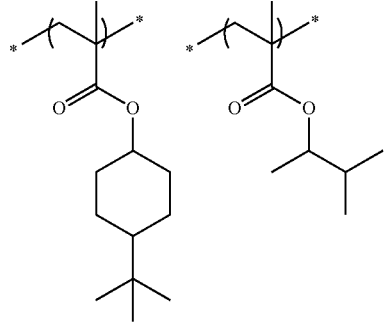

A-5

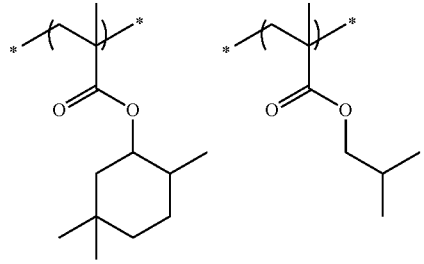

A-6

-continued
A-7
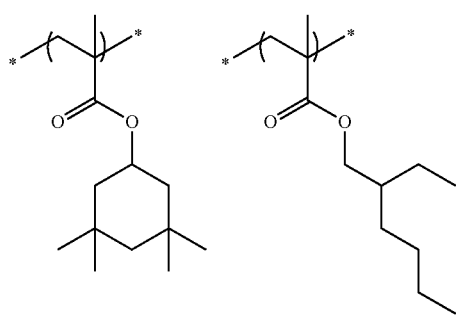
A-8
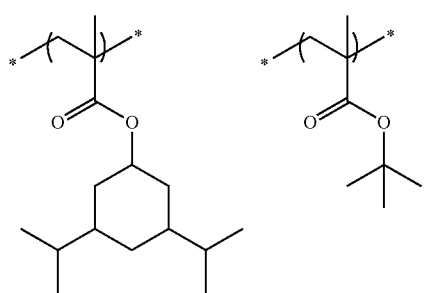
A-9
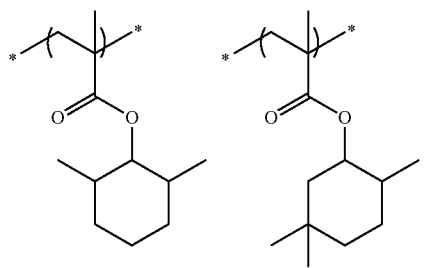
A-10
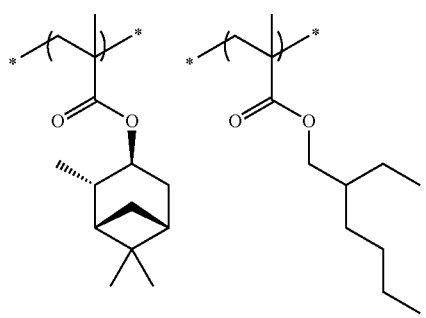
A-11
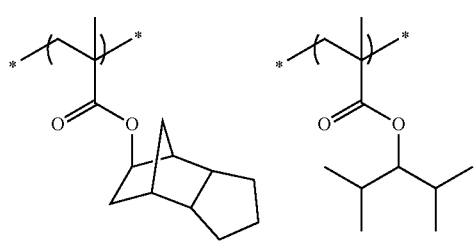
-continued
A-12
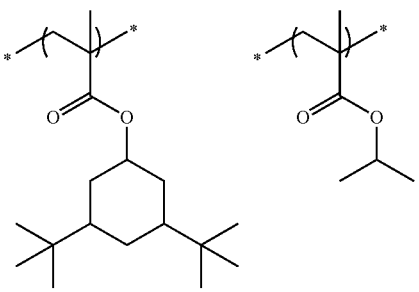
A-13
A-14
A-15
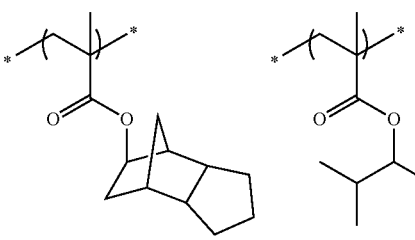
A-17
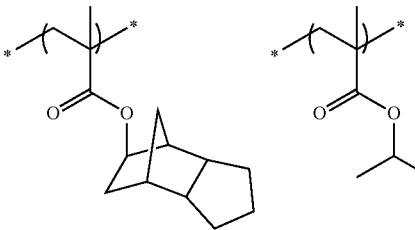
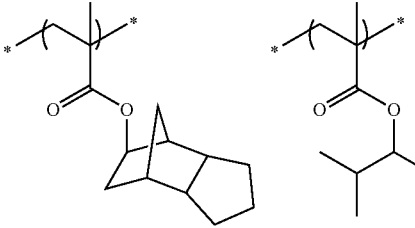
A-18
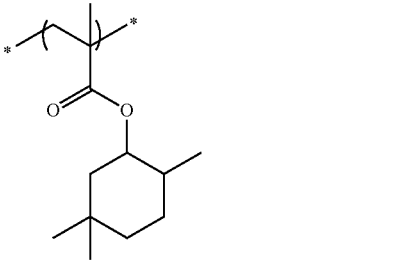

A-19 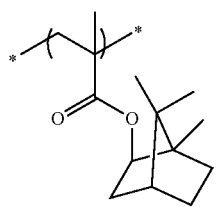
A-20 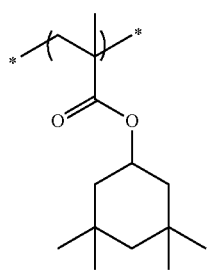
A-21 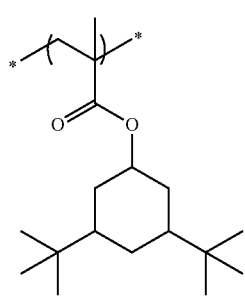
A-22 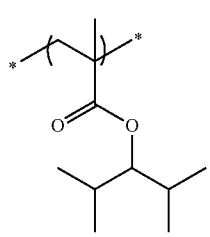
A-23 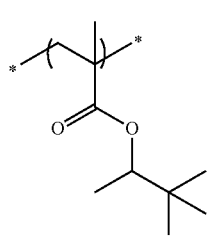
A-24 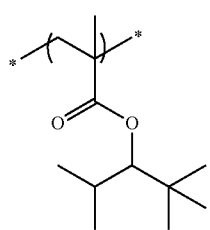
A-25 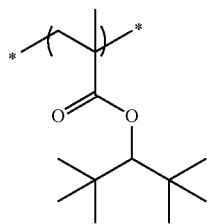
A-26 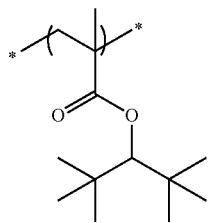
A-27 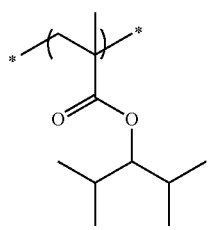 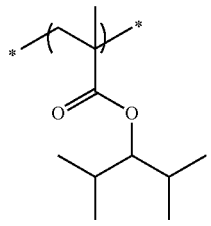
A-28 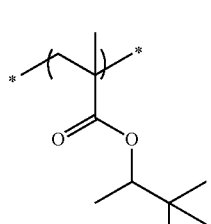 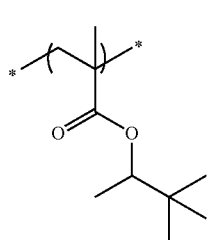
A-29 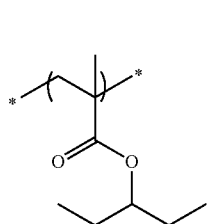 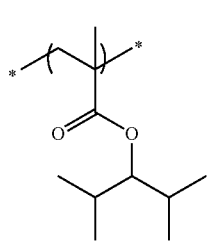
A-30 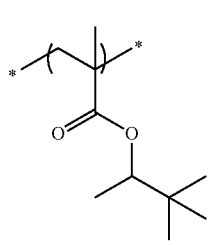

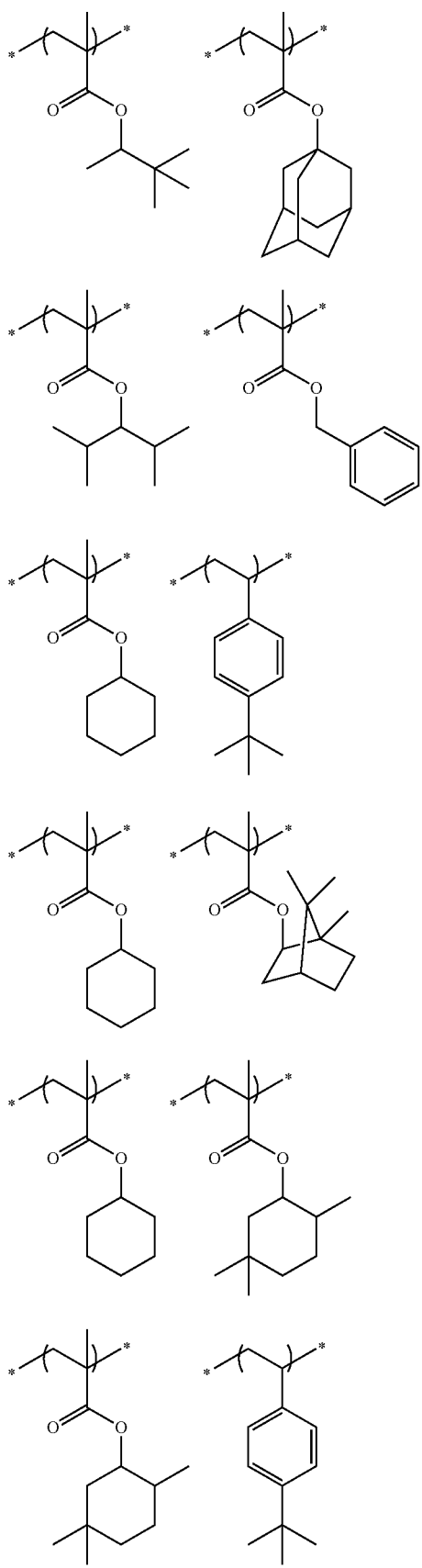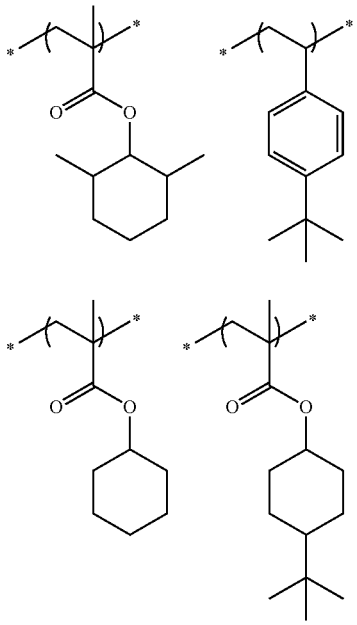

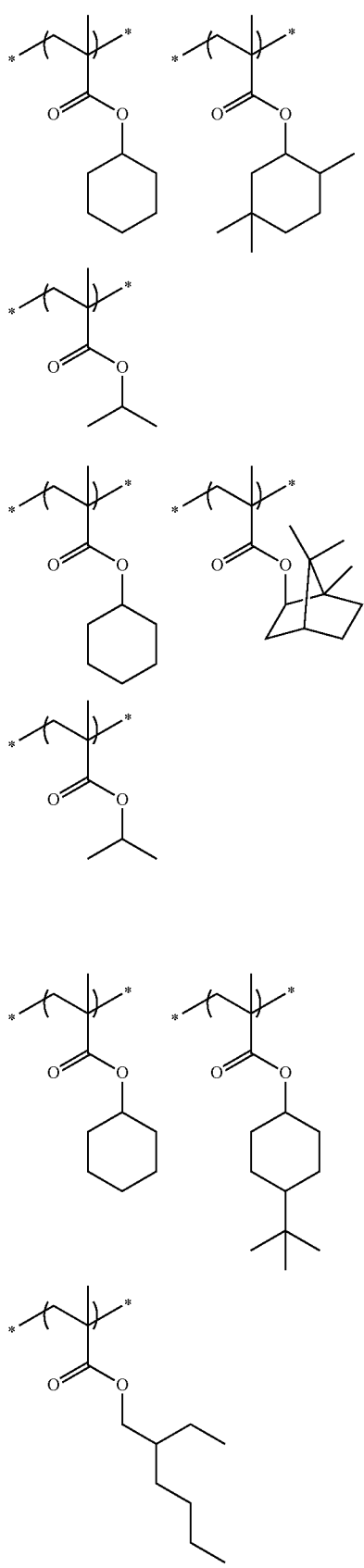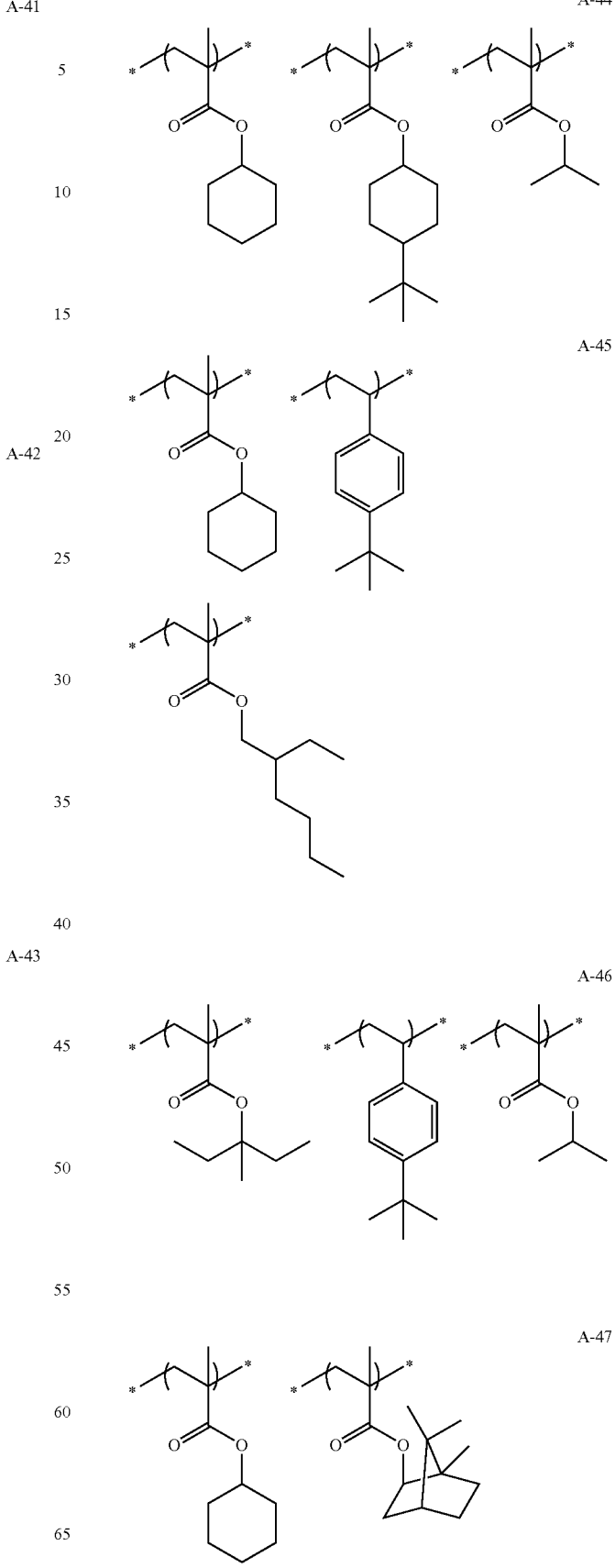

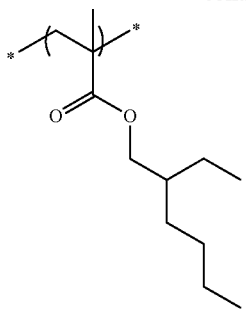
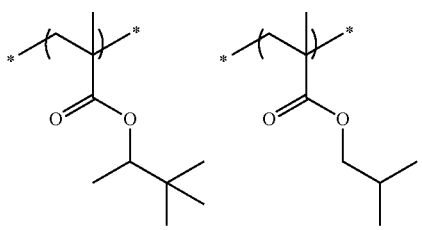
A-48
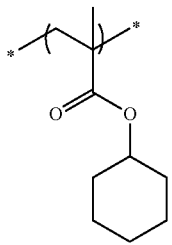
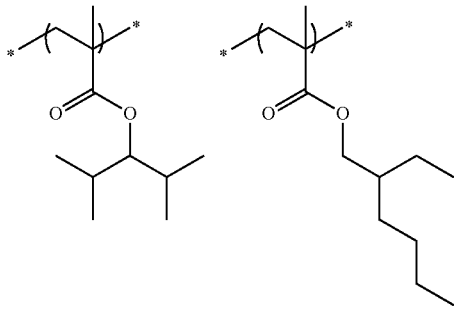
A-49
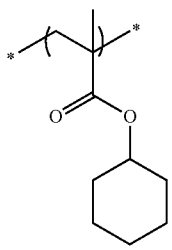
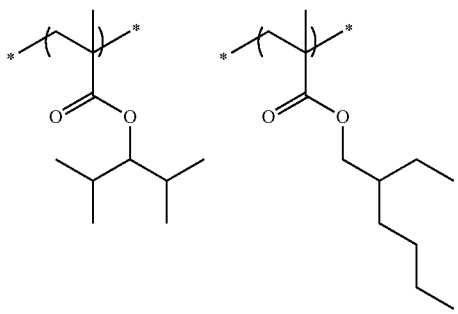
A-50
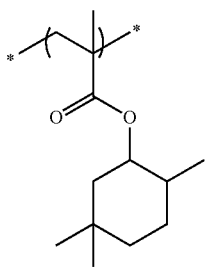
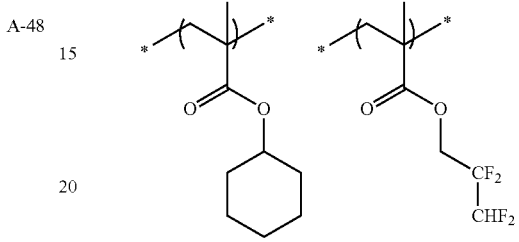
A-51
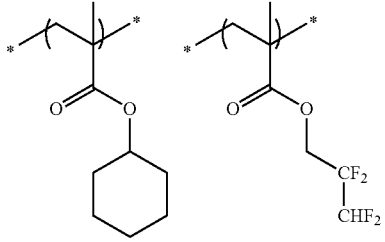
A-52
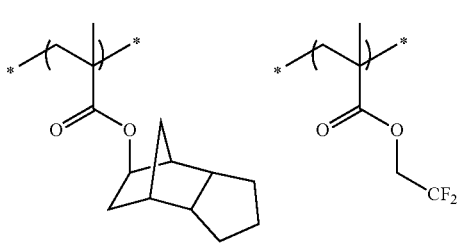
A-53
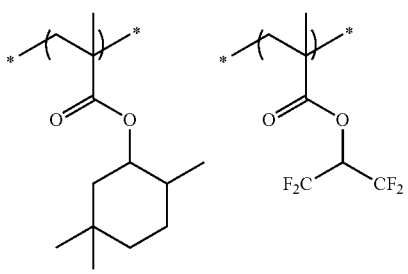
A-54
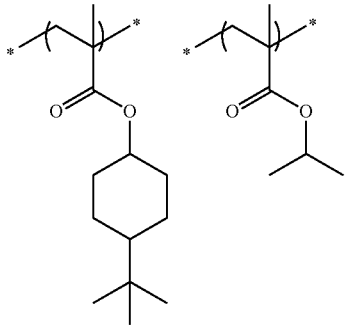
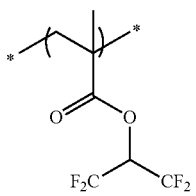

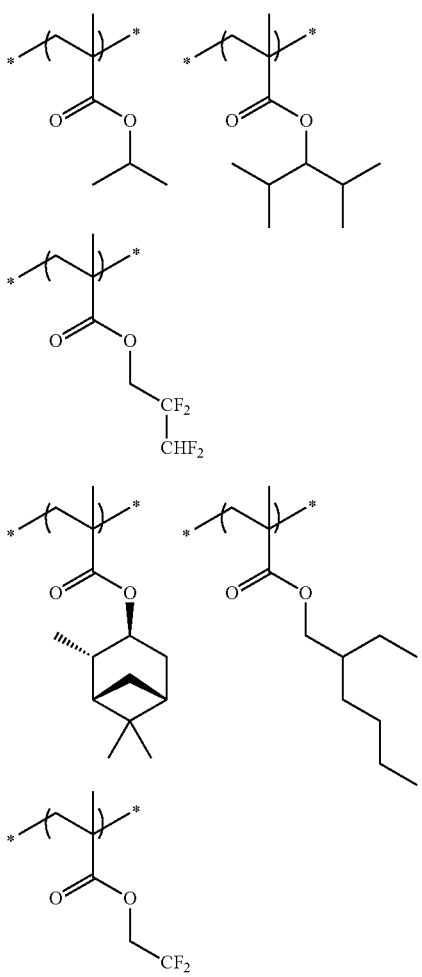

A-55

A-56

[Compound A Having Radical Trapping Group]

The topcoat composition of the present invention includes a compound A having a radical trapping group as an essential component.

The radical trapping group is a group that traps an active radical to stop a radical reaction. Examples of such a radical trapping group include a group that reacts with a radical and is converted to a stable free radical, and a group having a stable free radical.

Examples of such a compound A having a radical trapping group include hydroquinone, catechol, benzoquinone, a nitroxyl radical compound, an aromatic nitro compound, an N-nitroso compound, benzothiazole, dimethylaniline, phenothiazine, vinylpyrene, and derivatives thereof.

Furthermore, specific suitable examples of the radical trapping group not having basicity include at least one group selected from the group consisting of a hindered phenol group, a hydroquinone group, an N-oxyl-free radical group, a nitroso group, and a nitrone group.

The number of the radical trapping groups contained in the compound A is not particularly limited, but in a case where the compound A is a compound other than the high molecular compound, the number of radical trapping groups within one molecule is preferably 1 to 10, more preferably 1 to 5, and still more preferably 1 to 3.

On the other hand, in a case where the compound A is a high molecular compound having a repeating unit, the repeating unit having radical trapping groups preferably has 1 to 5 radical trapping groups, and more preferably has 1 to 3 radical trapping groups. Further, the compositional ratio of the repeating units having a radical trapping group in the high molecular compound is preferably 1% to 100% by mole, more preferably 10% to 100% by mole, and still more preferably 30% to 100% by mole.

As the compound A having a radical trapping group, a compound having a nitrogen-oxygen bond is preferable for a reason that the effect of the present invention is more excellent, and a compound represented by any one of General Formulae (1) to (3) is more preferable for a reason that the effect of the present invention is more excellent.

Moreover, a compound represented by General Formula (1) corresponds to a compound having an N-oxyl-free radical group, a compound represented by General Formula (2) corresponds to a compound having a nitroso group, and a compound represented by General Formula (3) corresponds to a compound having a nitrone group.

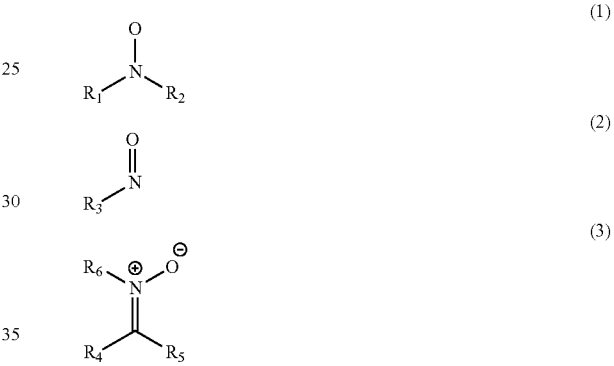

In General Formulae (1) to (3), $R_1$ to $R_6$ each independently represent an alkyl group, a cycloalkyl group, or an aryl group. In Formula (1), $R_1$ and $R_2$ may be bonded to each other to form a ring, and in Formula (3), at least two of $R_4, \ldots,$ or $R_6$ may be bonded to each other to form a ring.

The alkyl group, the cycloalkyl group, and the aryl group, represented by one of $R_1$ to $R_6$, the ring formed by the mutual bonding of $R_1$ and $R_2$, and the ring formed by the mutual bonding of at least two of $R_4, \ldots,$ or $R_6$ may have a substituent.

Examples of the alkyl group represented by one of $R_1$ to $R_6$ include a linear or branched alkyl group having 1 to 10 carbon atoms, and specific examples thereof include a methyl group, an ethyl group, an n-propyl group, an i-propyl group, an n-butyl group, a 2-methylpropyl group, a 1-methylpropyl group, a t-butyl group, an n-pentyl group, a neopentyl group, and an n-hexyl group, and among those, a methyl group, an ethyl group, an n-butyl group, or a t-butyl group is preferable.

Examples of the cycloalkyl group represented by one of $R_1$ to $R_6$ include cycloalkyl groups having 3 to 15 carbon atoms, and specific suitable examples thereof include a cyclopropyl group, a cyclobutyl group, a cyclopentyl group, a cyclohexyl group, a cycloheptyl group, a cyclooctyl group, a norbornyl group, and an adamantyl group.

Examples of the aryl group represented by one of $R_1$ to $R_6$ include aryl groups having 6 to 14 carbon atoms, and specific suitable examples thereof include a phenyl group, tolyl group, and a naphthyl group.

The ring which may be formed by $R_1$ and $R_2$, and the ring which may be formed by $R_4$ to $R_6$ are each preferably a 5- to 10-membered ring, and more preferably a 5- or 6-membered ring.

Examples of the substituent which can be contained in the alkyl group, the cycloalkyl group, and the aryl group represented by one of $R_1$ to $R_6$, the ring formed by the bonding of $R_1$ and $R_2$, and the ring which may be formed by the bonding of at least two of $R_4$, . . . , or $R_6$ include a halogen atom (for example, a fluorine atom), a hydroxyl group, a carboxyl group, a cyano group, a nitro group, an amino group, oxy group, an alkoxy group, an alkoxyalkyl group, an alkoxycarbonyl group, an alkoxycarbonyloxy group, an acylamide group (RCONH—: R is a substituted or unsubstituted alkyl group or phenyl group), —$SO_2Na$, and —$P(=O)(OC_2H5)_2$.

Examples of the substituent which can be contained in the cycloalkyl group and the aryl group represented by one of $R_1$ to $R_6$ further include an alkyl group.

Furthermore, the compound represented by any one of General Formulae (1) to (3) may be in a form of a resin, and in this case, at least one of $R_1$, . . . , or $R_6$ may be bonded to the main chain or the side chain of the resin.

Specific examples of the compound A having a radical trapping group are shown below, but the present invention is not limited thereto.

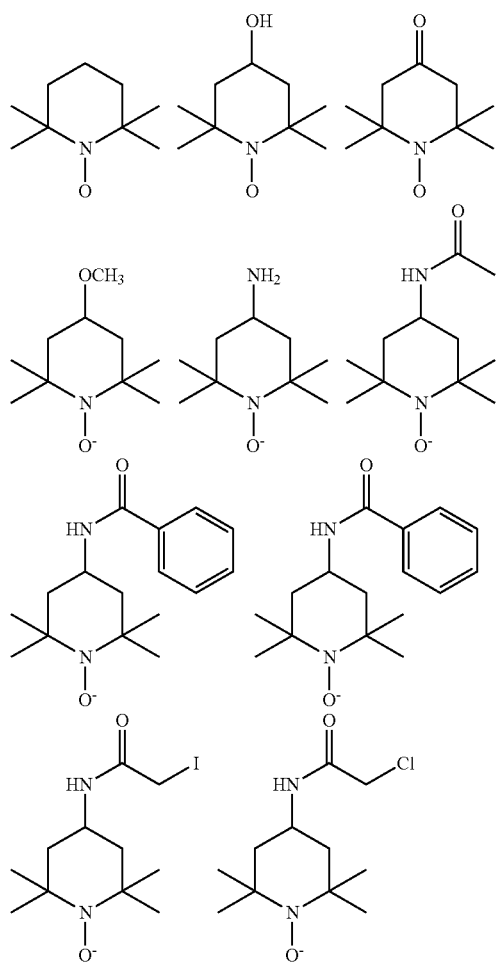

-continued

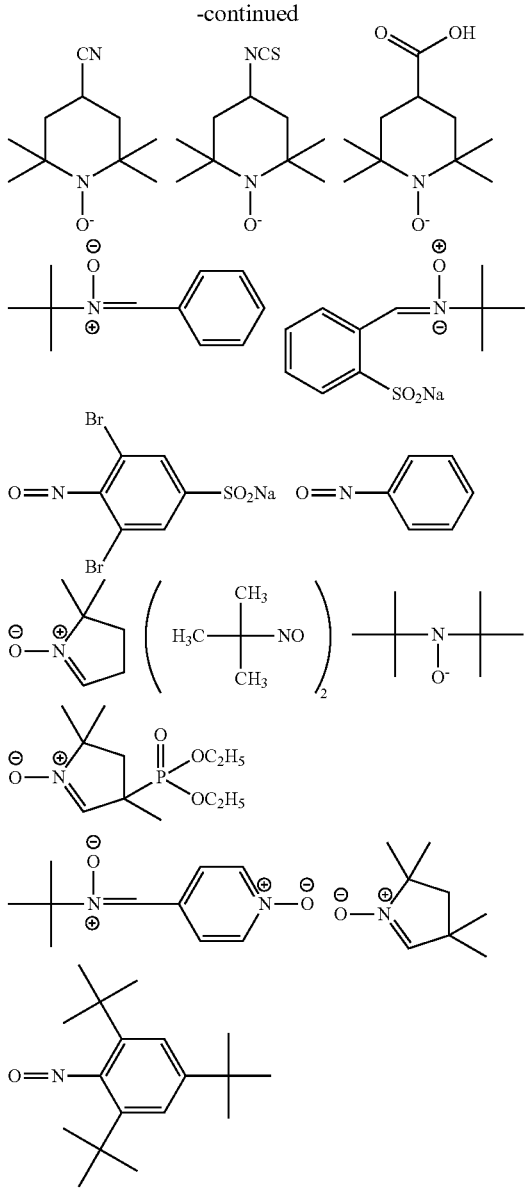

Furthermore, as described above, the compound A may be a high molecular compound having a repeating unit. Specific examples of the repeating unit contained in the compound A which is a high molecular compound are shown below, but the present invention is not limited thereto.

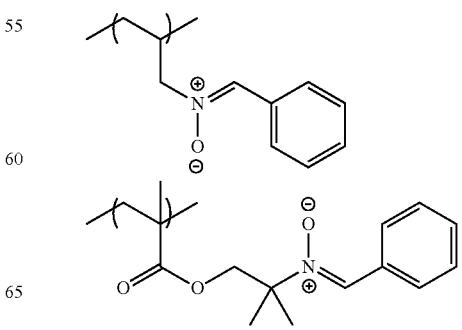

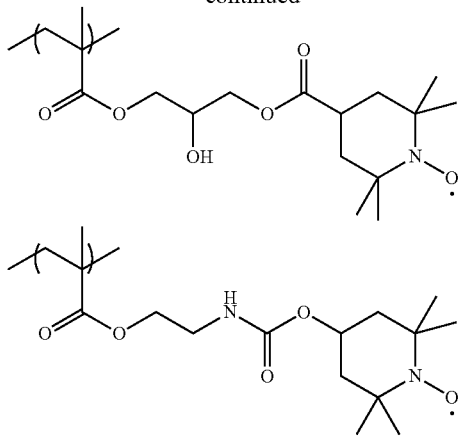

The molecular weight of the compound A (low molecular compound) having a radical trapping group is not particularly limited, and is preferably 100 to 5,000, more preferably 100 to 2,000, and still more preferably 100 to 1,000.

Furthermore, in a case where the compound A having a radical trapping group is a high molecular compound having a repeating unit, the weight-average molecular weight is preferably 5,000 to 20,000, and more preferably 5,000 to 10,000.

The pH of the compound A (low molecular compound) having a radical trapping group is not particularly limited, and is preferably 4.0 to 10.0, more preferably 5.0 to 9.0, still more preferably 6.0 to 8.0, and particularly preferably 6.5 to 7.5.

As the compound A having a radical trapping group, a compound that is a commercially available product may be used, and a compound synthesized by a known method may be used. Further, the compound A may be synthesized by the reaction of a commercially available low molecular compound having a radical trapping group with a high molecular compound having a reactive group such as an epoxy group, a halogenated alkyl group, an acid halide group, a carboxyl group, and an isocyanate group.

The content of the compound A having a radical trapping group is usually 0.001% to 10% by mass, and preferably 0.01% to 5% by mass, with respect to the total solid content of the topcoat composition of the present invention.

The compound A having a radical trapping group can be used singly or in combination of two or more kinds thereof.

[Solvent]

The topcoat composition of the present invention may include a solvent. In order to form a good pattern while not dissolving the resist film, it is preferable that the topcoat composition in the present invention contains a solvent in which the resist film is not dissolved, and it is more preferable that a solvent with components different from an organic developer is used.

Furthermore, from the viewpoint of the prevention of elution into an immersion liquid, low solubility in an immersion liquid is preferred, and low solubility in water is more preferable. In the present specification, the description of "having low solubility in an immersion liquid" represents insolubility in an immersion liquid. Similarly, "having low solubility in water" means insolubility in water. Further, from the viewpoints of volatility and coatability, the boiling point of the solvent is preferably 90° C. to 200° C. The solvent vapor pressure is preferably 0.05 kPa to 0.6 kPa, and more preferably 0.1 kPa to 0.4 kPa.

The description of "having low solubility in an immersion liquid" indicates that in an example of the solubility in water, in a case where a topcoat composition is coated on a silicon wafer and dried to form a film, and then the film is immersed in pure water at 23° C. for 10 minutes, the decrease rate in the film thickness after drying is within 3% of the initial film thickness (typically 50 nm).

In the present invention, from the viewpoint of uniformly applying the topcoat, a solvent having a concentration of the solid contents of 0.01% to 20% by mass, more preferably 0.1% to 15% by mass, and most preferably 1% to 10% by mass is used.

The solvent that can be used is not particularly limited as long as it can dissolve the resin (X) and does not dissolve the resist film, but suitable examples thereof include an alcohol-based solvent, an ether-based solvent, an ester-based solvent, a fluorine-based solvent, and a hydrocarbon-based solvent, with a non-fluorinated alcohol-based solvent being more preferably used. Thus, the non-dissolving property for the resist film is further enhanced and in a case where the topcoat composition is coated on the resist film, a topcoat can be more uniformly formed without dissolving the resist film. The viscosity of the solvent is preferably 5 centipoises (cP) or less, more preferably 3 cP or less, still more preferably 2 cP or less, and particularly preferably 1 cP or less. Further, centipoises can be converted into pascal seconds according to the following formula: 1,000 cP=1 Pa·s.

From the viewpoint of coatability, the alcohol-based solvent is preferably a monohydric alcohol, and more preferably a monohydric alcohol having 4 to 8 carbon atoms. As the monohydric alcohol having 4 to 8 carbon atoms, a linear, branched, or cyclic alcohol may be used, but a linear or branched alcohol is preferable. As such an alcohol-based solvent, for example, alcohols such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycols such as ethylene glycol, propylene glycol, diethylene glycol, and triethylene glycol; glycol ethers such as ethylene glycol monomethyl ether, propylene glycol monomethyl ether, diethylene glycol monomethyl ether, triethylene glycol monoethyl ether, and methoxymethylbutanol; or the like can be used. Among those, alcohol and glycol ether are preferable, and 1-butanol, 1-hexanol, 1-pentanol, 3-methyl-1-butanol, 4-methyl-1-pentanol, 4-methyl-2-pentanol, and propylene glycol monomethyl ether are more preferable.

Examples of the ether-based solvent include, in addition to the glycol ether-based solvents, dioxane, tetrahydrofuran, isoamyl ether, and diisoamyl ether. Among the ester-based solvents, an ether-based solvent having a branched structure is preferable.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, butyl propionate, ethyl 3,5,5-trimethylhexanoate, and isoamyl valerate.

Among the ester-based solvents, an ester-based solvent having a branched structure is preferable.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine. Among these, a fluorinated alcohol and a fluorinated hydrocarbon-based solvent can be suitably used.

Examples of the hydrocarbon-based solvent include aromatic hydrocarbon-based solvents such as toluene, xylene, and anisole; and aliphatic hydrocarbon-based solvents such as n-heptane, n-nonane, n-octane, n-decane, 2-methylheptane, 3-methylheptane, 3,3-dimethylhexane, and 2,3,4-trimethylpentane.

These solvents are used singly or as a mixture of a plurality of kinds thereof. For example, a mixed solvent including an alcohol-based solvent and a hydrocarbon-based solvent, a mixed solvent including an alcohol-based solvent and an ester-based solvent, or the like may also be used. In a case where the mixed solvent includes the hydrocarbon-based solvent, the content of the hydrocarbon-based solvent is preferably 5% to 30% by mass, and more preferably 10% to 20% by mass.

The topcoat composition of the present invention may also include a solvent other than the above-mentioned solvents. By mixing a solvent other than the above-mentioned solvents, the solubility for the resist film, the solubility of the resin in the topcoat composition of the present invention, the elution characteristics from the resist film, or the like can be appropriately adjusted.

[Other Compounds]

The topcoat composition of the present invention may further contain at least one compound selected from the group consisting of the following (B1) and (B2), in addition to the compound A having a radical trapping group.

(B1) A basic compound or base generator (B2) A compound containing at least one bond or group selected from the group consisting of an ether bond, a thioether bond, a hydroxyl group, a thiol group, a carbonyl bond, and an ester bond The content of (B1) and (B2) is preferably 25% by mass or less, and more preferably 20% by mass or less, with respect to the total solid content of the topcoat composition of the present invention. The lower limit is not particularly limited, but is preferably 0.01% by mass or more, and more preferably 0.1% by mass or more.

<(B1) Basic Compound and Base Generator>

(Basic Compound)

As the basic compound which can be contained in the topcoat composition, an organic basic compound is preferable, and a nitrogen-containing basic compound is more preferable. For example, those described above as a basic compound which may be contained in the resist composition of the present invention can be used, and specific suitable examples thereof include the above-mentioned compounds having the structures represented by Formulae (A) to (E).

In addition, for example, the compounds which are classified into the following (1) to (5), and (7) can be used.

(1) Compound Represented by General Formula (BS-1)

In General Formula (BS-1),

R's each independently represent a hydrogen atom or an organic group. Here, at least one of three R's is an organic group. This organic group is a linear or branched alkyl group, a monocyclic or polycyclic cycloalkyl group, an aryl group, or an aralkyl group.

The number of carbon atoms in the alkyl group as R is not particularly limited, but is normally 1 to 20, and preferably 1 to 12.

The number of carbon atoms in the cycloalkyl group as R is not particularly limited, but is normally 3 to 20, and preferably 5 to 15.

The number of carbon atoms in the aryl group as R is not particularly limited, but is normally 6 to 20, and preferably 6 to 10. Specific examples thereof include a phenyl group and a naphthyl group.

The number of carbon atoms in the aralkyl group as R is not particularly limited, but is normally 7 to 20, and preferably 7 to 11. Specifically, examples thereof include a benzyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxyl group, a carboxy group, an alkoxy group, an aryloxy group, an alkylcarbonyloxy group, and an alkyloxycarbonyl group.

Furthermore, it is preferable that at least two of R's in the compound represented by General Formula (BS-1) are organic groups.

Specific examples of the compound represented by General Formula (BS-1) include tri-n-butylamine, tri-isopropylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyl octadecylamine, dimethylundecylamine, N,N-dimethyldodecylamine, methyl dioctadecylamine, N,N-dibutylaniline, N,N-dihexylaniline, 2,6-diisopropylaniline, and 2,4,6-tri(t-butyl)aniline.

In addition, as the preferable basic compound represented by General Formula (BS-1), an alkyl group in which at least one R is substituted with a hydroxyl group is exemplified. Specific examples thereof include triethanolamine and N,N-dihydroxyethylaniline.

Moreover, the alkyl group as R may have an oxygen atom in the alkyl chain. That is, an oxyalkylene chain may be formed. As the oxyalkylene chain, —$CH_2CH_2O$— is preferable. Specific examples thereof include tris(methoxyethoxyethyl)amine and a compound disclosed after line 60 of column 3 in the specification of U.S. Pat. No. 6,040,112A.

Examples of the basic compound represented by General Formula (BS-1) include the following ones.

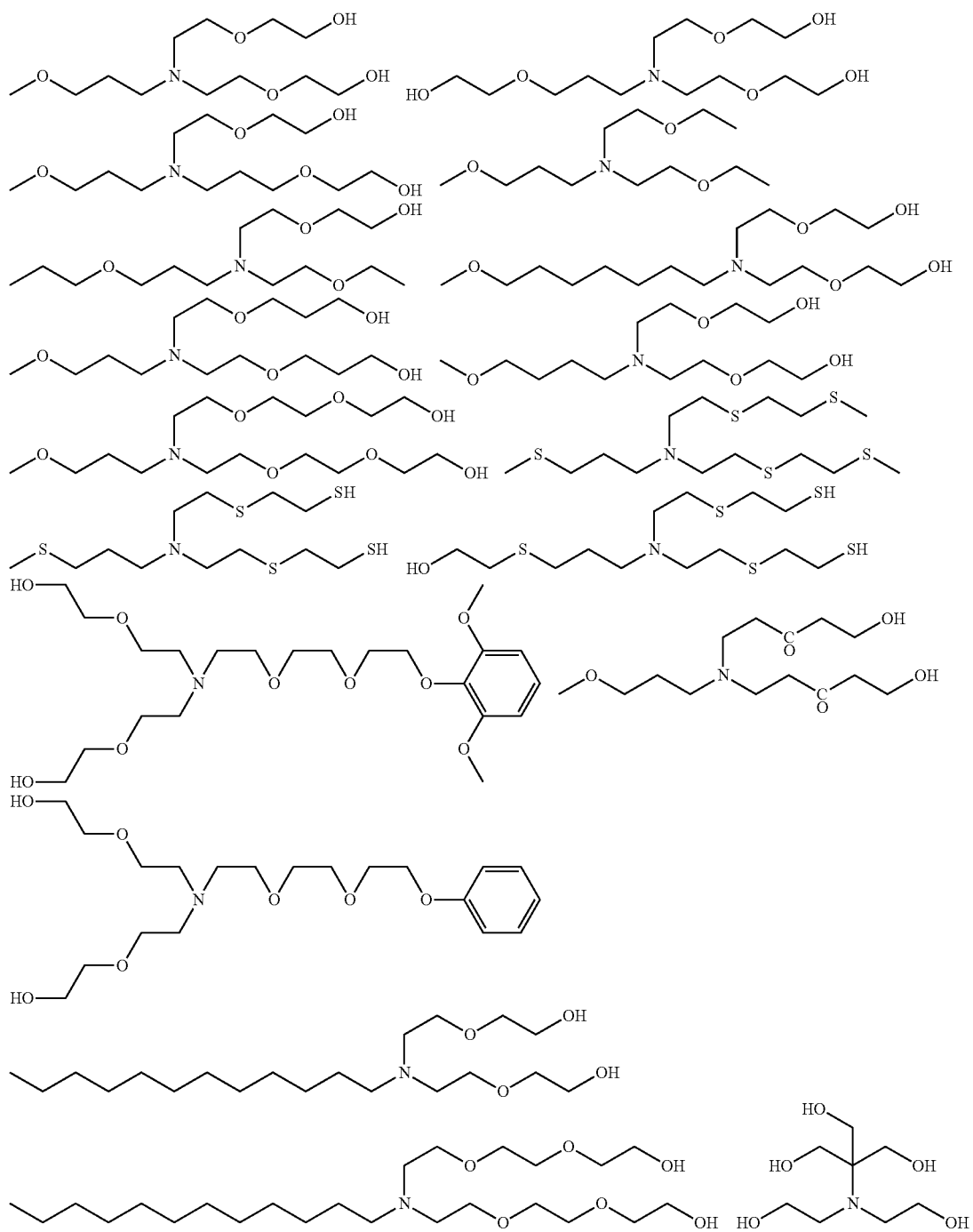

(2) Compound Having Nitrogen-Containing Heterocyclic Structure

The nitrogen-containing heterocycle may have aromatic properties, or may not have aromatic properties. The nitrogen-containing heterocycle may have a plurality of nitrogen atoms. Furthermore, the nitrogen-containing heterocycle may contain heteroatoms other than the nitrogen atom. Specific examples thereof include a compound having an imidazole structure (2-phenylbenzimidazole, 2,4,5-triphenylimidazole and the like), a compound having a piperidine structure [N-hydroxyethylpiperidine, bis(1,2,2,6,6-pentamethyl-4-piperidyl)sebacate, and the like], a compound having a pyridine structure (4-dimethylaminopyridine and the like), and a compound having an antipyrine structure (antipyrine, hydroxyantipyrine, and the like).

Furthermore, a compound having two or more ring structures is suitably used. Specific examples thereof include 1,5-diazabicyclo[4.3.0]non-5-ene and 1,8-diazabicyclo[5.4.0]undec-7-ene.

(3) Amine Compound Having Phenoxy Group

An amine compound having a phenoxy group is a compound having a phenoxy group at the terminal on the opposite side to the N atom of the alkyl group which is contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, or an aryloxy group.

This compound more preferably has at least one oxyalkylene chain between the phenoxy group and the nitrogen atom. The number of oxyalkylene chains in one molecule is preferably 3 to 9, and more preferably 4 to 6. Among oxyalkylene chains, —CH$_2$CH$_2$O— is particularly preferable.

Specific examples thereof include 2-[2-{2-(2,2-dimethoxyphenoxyethoxy)ethyl}-bis-(2-methoxyethyl)]amine and the compounds (C1-1) to (C3-3) exemplified in paragraph <0066> in the specification of US2007/0224539A1.

An amine compound having a phenoxy group is obtained by, for example, heating a mixture of a primary or secondary amine having a phenoxy group and an haloalkyl ether to be reacted, by adding an aqueous solution of a strong base such as sodium hydroxide, potassium hydroxide, or tetraalkylammonium thereto, and by extracting the resultant product with an organic solvent such as ethyl acetate and chloroform. In addition, an amine compound having a phenoxy group can also be obtained by heating a mixture of a primary or secondary amine and an haloalkyl ether having a phenoxy group at the terminal to be reacted, by adding an aqueous solution of a strong base such as sodium hydroxide, potassium hydroxide, or tetraalkylammonium thereto, and by extracting the resultant product with an organic solvent such as ethyl acetate and chloroform.

(4) Ammonium Salt

An ammonium salt can also be appropriately used as the basic compound. Examples of the anion of the ammonium salt include halide, sulfonate, borate, and phosphate. Among these, halide and sulfonate are particularly preferable.

As the halide, chloride, bromide, or iodide is particularly preferable.

As the sulfonate, an organic sulfonate having 1 to 20 carbon atoms is particularly preferable. Examples of the organic sulfonate include alkyl sulfonate and aryl sulfonate having 1 to 20 carbon atoms.

The alkyl group included in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate.

Examples of the aryl group included in the aryl sulfonate include a phenyl group, a naphthyl group, and an anthryl group. These aryl groups may have a substituent. As the substituent, for example, a linear or branched alkyl group having 1 to 6 carbon atoms or a cycloalkyl group having 3 to 6 carbon atoms is preferable. Specifically, for example, a methyl group, an ethyl group, an n-propyl group, an isopropyl group, an n-butyl group, an i-butyl group, a t-butyl group, an n-hexyl group, or a cyclohexyl group is preferable. Examples of other substituents include an alkoxy group having 1 to 6 carbon atoms, a halogen atom, a cyano group, a nitro group, an acyl group, and an acyloxy group.

The ammonium salt may be a hydroxide or a carboxylate. In this case, the ammonium salt is particularly preferably tetraalkylammonium hydroxide (tetraalkylammonium hydroxide such as tetramethylammonium hydroxide, tetraethylammonium hydroxide, or tetra-(n-butyl)ammonium hydroxide) having 1 to 8 carbon atoms.

Preferred examples of the basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine. These may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Particularly preferred examples of the basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

(5) Compound (PA) That Has Proton-Accepting Functional Group and Generates Compound in Which Proton-Accepting Properties Are Reduced or Lost, or Which Is Changed from Having Proton Accepting Properties to Be Acidic, by Being Decomposed upon Irradiation with Actinic Rays or Radiation The topcoat composition of the present invention may further include, as a basic compound, a compound [hereinafter also referred to as a compound (PA)] that has a functional group with proton acceptor properties and generates a compound in which proton acceptor properties are reduced or lost, or which is changed from having proton accepting properties to be acidic, by decomposing upon irradiation with actinic rays or radiation.

The functional group with proton acceptor properties refers to a functional group having a group or electron which is capable of electrostatically interacting with a proton, and for example, means a functional group with a macrocyclic structure, such as a cyclic polyether; or a functional group containing a nitrogen atom having an unshared electron pair not contributing to 1-conjugation. The nitrogen atom having an unshared electron pair not contributing to 7-conjugation is, for example, a nitrogen atom having a partial structure represented by the following general formula.

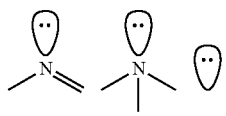

Unshared electron pair

Preferred examples of the partial structure of the functional group with proton acceptor properties include crown ether, azacrown ether, primary to tertiary amines, pyridine, imidazole, and pyrazine structures.

The compound (PA) decomposes upon irradiation with actinic rays or radiation to generate a compound exhibiting deterioration in proton acceptor properties, no proton acceptor properties, or a change from the proton acceptor properties to acid properties. Here, exhibiting deterioration in proton acceptor properties, no proton acceptor properties, or a change from the proton acceptor properties to acid properties means a change of proton acceptor properties due to the proton being added to the functional group with proton acceptor properties, and specifically a decrease in the equilibrium constant at chemical equilibrium in a case where a proton adduct is generated from the compound (PA) having the functional group with proton acceptor properties and the proton.

The proton acceptor properties can be confirmed by carrying out pH measurement. In the present invention, the acid dissociation constant pKa of the compound generated by the decomposition of the compound (PA) upon irradiation with actinic rays or radiation preferably satisfies pKa<−1, more preferably −13<pKa<−1, and still more preferably −13<pKa<−3.

In the present invention, the acid dissociation constant pKa indicates an acid dissociation constant pKa in an aqueous solution, and is described, for example, in Chemical Handbook (II) (Revised 4$^{th}$ Edition, 1993, compiled by the Chemical Society of Japan, Maruzen Inc.), and a lower value thereof indicates higher acid strength. Specifically, the acid dissociation constant pKa in an aqueous solution may be measured by using an infinite-dilution aqueous solution and measuring the acid dissociation constant at 25° C., or a value based on the Hammett substituent constants and the database of publicly known literature value data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

The compound (PA) generates a compound represented by General Formula (PA-1), for example, as the proton adduct generated by decomposition upon irradiation with actinic rays or radiation. The compound represented by General Formula (PA-1) is a compound exhibiting deterioration in proton acceptor properties, no proton acceptor properties, or a change from the proton acceptor properties to acid properties since the compound has a functional group with proton acceptor properties as well as an acidic group, as compared with the compound (PA).

In General Formula (PA-1),

Q represents —SO$_3$H, —CO$_2$H, or —X$_1$NHX$_2$Rf, in which Rf represents an alkyl group, a cycloalkyl group, or an aryl group, and X$_1$ and X$_2$ each independently represent —SO$_2$— or —CO—.

A represents a single bond or a divalent linking group.

X represents —SO$_2$— or —CO—.

n is 0 or 1.

B represents a single bond, an oxygen atom, or —N(Rx)Ry-, in which Rx represents a hydrogen atom or a monovalent organic group, and Ry represents a single bond or a divalent organic group, provided that Rx may be bonded to Ry to form a ring or may be bonded to R to form a ring.

R represents a monovalent organic group having a functional group with proton acceptor properties.

Specific examples of the compound (PA) include, but not limited to, the compounds described in paragraphs <0743> to <0750> of JP2013-83966A.

Furthermore, in the present invention, compounds (PA) other than a compound capable of generating the compound represented by General Formula (PA-1) can also be appropriately selected. For example, a compound containing a proton acceptor moiety at its cationic moiety may be used as an ionic compound. More specific examples thereof include a compound represented by General Formula (7).

In the formula, A represents a sulfur atom or an iodine atom.

m represents 1 or 2 and n represents 1 or 2, provided that m+n=3 in a case where A is a sulfur atom and that m+n=2 in a case where A is an iodine atom.

R represents an aryl group.

R$_N$ represents an aryl group substituted with the functional group with proton acceptor properties.

X$^-$ represents a counter anion.

Specific examples of X$^-$ include the same ones as Z$^-$ in General Formula (ZI).

Specific preferred examples of the aryl group of R and R$_N$ include a phenyl group.

Specific examples of the functional group with proton acceptor properties, contained in R$_N$, are the same as the functional groups with proton acceptor properties described above in Formula (PA-1).

(7) Low Molecular Compound Having Nitrogen Atom and Group Capable of Leaving by Action of Acid The topcoat composition of the present invention can include a low molecular compound (hereinafter referred to as a "low molecular compound (D)" or a "compound (D)") which has a nitrogen atom and a group capable of leaving by the action of an acid. The low molecular compound (D) preferably has basicity after the group capable of leaving by the action of an acid leaves.

The group capable of leaving by the action of an acid is not particularly limited, but an acetal group, a carbonate group, a carbamate group, a tertiary ester group, a tertiary hydroxyl group, or a hemiaminal ether group is preferable, and a carbamate group or a hemiaminal ether group is particularly preferable.

The molecular weight of the low molecular compound (D) having a group capable of leaving by the action of an acid is preferably 100 to 1,000, more preferably 100 to 700, and particularly preferably 100 to 500.

As the compound (D), an amine derivative having a group capable of leaving by the action of an acid on a nitrogen atom is preferable.

The compound (D) may also have a carbamate group having a protecting group on a nitrogen atom. The protecting group constituting the carbamate group can be represented by General Formula (d-1).

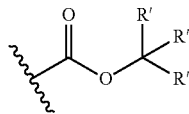

(d-1)

In General Formula (d-1),

R''s each independently represent a hydrogen atom, linear or branched alkyl group, a cycloalkyl group, an aryl group, an aralkyl group, or an alkoxyalkyl group. R''s may be bonded to each other to form a ring.

R' is preferably a linear or branched alkyl group, a cycloalkyl group, or an aryl group, and more preferably a linear or branched alkyl group or a cycloalkyl group.

The compound (D) is particularly preferably a compound having a structure represented by General Formula (A).

Incidentally, the compound (D) may be a compound corresponding to various basic compounds described above as long as it is a low molecular compound having a group capable of leaving by the action of an acid.

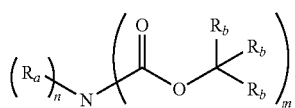

(A)

In General Formula (A), $R_a$ represents a hydrogen atom, an alkyl group, a cycloalkyl group, an aryl group, or an aralkyl group. Further, with n=2, two Ra's may be the same as or different from each other, and two $R_a$'s may be bonded to each other to form a divalent heterocyclic hydrocarbon group (preferably having 20 or less carbon atoms) or a derivative thereof.

$R_b$'s each independently represent a hydrogen atom, an alkyl group, a cycloalkyl group, an aryl group, an aralkyl group, or an alkoxyalkyl group, provided that in a case where one or more $R_b$ in —C($R_b$)($R_b$)($R_b$) are hydrogen atoms, at least one of the remaining $R_b$'s is a cyclopropyl group, a 1-alkoxyalkyl group, or an aryl group.

At least two $R_b$'S may be bonded to each other to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

Specific examples of the particularly preferred compound (D) in the present invention include the compounds described in paragraphs <0786> to <0788> of JP2013-83966A, but the present invention is not limited thereto.

The compound represented by General Formula (A) can be synthesized in accordance with JP2007-298569A, JP2009-199021A, or the like.

In the present invention, the low molecular compound (D) may be used singly or as a mixture of two or more kinds thereof.

Other examples of the low molecular compound which can be used include the compounds synthesized in Examples of JP2002-363146A and the compounds described in paragraph 0108 of JP2007-298569A.

A photosensitive basic compound may also be used as the basic compound. As the photosensitive basic compound, for example, the compounds described in JP2003-524799A, J. Photopolym. Sci. & Tech., Vol. 8, pp. 543 to 553 (1995), or the like can be used.

As the basic compound, a compound called a so-called photodisintegrating base may also be used. Examples of the photodisintegrating base include an onium salt of carboxylic acid, and an onium salt of sulfonic acid having the α-position which is not fluorinated. Specific examples of the photodisintegrating base include those in paragraph 0145 of WO2014/133048A1, JP2008-158339A, and JP399146B.

(Base Generator)

Examples of the base generator (photobase generator) which can be included in the topcoat composition of the present invention include compounds described in JP1992-151156A (JP-H04-151156A), JP1992-162040A (JP-H04-162040A), JP1993-197148A (JP-H05-197148A), JP1993-5995A (JP-H05-5995A), JP1994-194834A (JP-H06-194834A), JP1996-146608A (JP-H08-146608A), JP1998-83079A (JP-H10-83079A), and EP622682B.

Furthermore, the compounds described in JP2010-243773A are also appropriately used.

Specific suitable examples of the photobase generator include 2-nitrobenzyl carbamate, 2,5-dinitrobenzylcyclohexyl carbamate, N-cyclohexyl-4-methylphenylsulfonamide, and 1,1-dimethyl-2-phenylethyl-N-isopropyl carbamate, but are not limited thereto.

<(B2) Compound Containing Bond or Group Selected from Group Consisting of Ether Bond, Thioether Bond, Hydroxyl Group, Thiol Group, Carbonyl Bond, and Ester Bond>

A compound (hereinafter also referred to as a "compound (B2)" or an "additive (B2)") including at least one group or bond selected from the group consisting of an ether bond, a thioether bond, a hydroxyl group, a thiol group, a carbonyl bond, and an ester bond will be described below.

As described above, the compound (B2) is a compound including at least one group or bond selected from the group consisting of an ether bond, a thioether bond, a hydroxyl group, a thiol group, a carbonyl bond, and an ester bond.

As described above, the compound (B2) includes at least one group or bond selected from the group consisting of an ether bond, a thioether bond, a hydroxyl group, a thiol group, a carbonyl bond, and an ester bond. In one aspect of the present invention, the compound (B2) preferably has 2 or more groups or bonds selected from the group, more preferably has 3 or more groups or bonds selected from the group, and still more preferably 4 or more groups or bonds selected from the group. In this case, groups or bonds selected from the group consisting of ether bonds, thioether bonds, hydroxyl groups, thiol groups, carbonyl bonds, and ester bonds included in plural numbers in the compound (B2) may be the same as or different from each other.

In one aspect of the present invention, the compound (B2) preferably has a molecular weight of 3,000 or less, more preferably has a molecular weight of 2,500 or less, still more preferably has a molecular weight of 2,000 or less, and particularly preferably has a molecular weight of 1,500 or less.

Furthermore, in one aspect of the present invention, the number of carbon atoms included in the compound (B2) is preferably 8 or more, more preferably 9 or more, and still more preferably 10 or more.

Moreover, in one aspect of the present invention, the number of carbon atoms included in the compound (B2) is preferably 30 or less, more preferably 20 or less, and still more preferably 15 or less.

Furthermore, in one aspect of the present invention, the compound (B2) is preferably a compound having a boiling point of 200° C. or higher, more preferably a compound having a boiling point of 220° C. or higher, and still more preferably a compound having a boiling point of 240° C. or higher.

Moreover, in one aspect of the present invention, the compound (B2) is preferably a compound having an ether bond, preferably a compound having 2 or more ether bonds, more preferably a compound having 3 or more ether bonds, and still more preferably a compound having 4 or more ether bonds.

In one aspect of the present invention, the compound (B2) still more preferably has a repeating unit containing an oxyalkylene structure represented by General Formula (1).

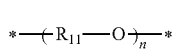
(1)

In the formula,
$R_{11}$ represents an alkylene group which may have a substituent,
n represents an integer of 2 or more, and
* represents a bonding arm.

The number of carbon atoms in the alkylene group represented by $R_{11}$ in General Formula (1) is not particularly limited, but is preferably 1 to 15, more preferably 1 to 5, still more preferably 2 or 3, and particularly preferably 2. In a case where this alkylene group has a substituent, the substituent is not particularly limited, but is preferably for example, an alkyl group (preferably having 1 to 10 carbon atoms).

n is preferably an integer of 2 to 20, among which an integer of 10 or less is more preferable due to an increase in DOF.

The average value of n's is preferably 20 or less, more preferably 2 to 10, still more preferably 2 to 8, and particularly preferably 4 to 6 due to an increase in DOF. Here, "the average value of n's" means the value of n determined in a case where the weight-average molecular weight of the compound (B2) is measured by GPC, and the obtained weight-average molecular weight is allowed to match the general formula. In a case where n is not an integer, it is a value rounded off to the nearest integer of the specified numerical value.

$R_{11}$'s which are present in plural numbers may be the same as or different from each other.

Furthermore, a compound having a partial structure represented by General Formula (1) is preferably a compound represented by General Formula (1-1) due to an increase in DOF.

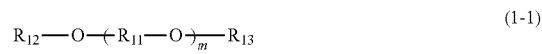
(1-1)

In the formula,
the definition, specific examples, and suitable aspects of $R_{11}$ are the same as those of $R_{11}$ in General Formula (1) as described above, respectively.

$R_{12}$ and $R_{13}$ each independently represent a hydrogen atom or an alkyl group. The number of carbon atoms in the alkyl group is not particularly limited, but is preferably 1 to 15. $R_{12}$ and $R_{13}$ may be bonded to each other to form a ring.

m represents an integer of 1 or more. m is preferably an integer of 1 to 20, and above all, is more preferably an integer of 10 or less due to an increase in DOF.

The average value of m's is preferably 20 or less, more preferably 1 to 10, still more preferably 1 to 8, and particularly preferably 4 to 6 due to an increase in DOF. Here, "the average value of m's" has the same definition as the "average value of n's" as described above.

In a case where m is 2 or more, $R_{11}$'s present in plural numbers may be the same as or different from each other.

In one aspect of the present invention, the compound having a partial structure represented by General Formula (1) is preferably alkylene glycol including at least two ether bonds.

The compound (B2) may be used as a commercially available product or may be synthesized according to a known method.

Specific examples of the compound (B2) are shown below but the present invention is not limited thereto.

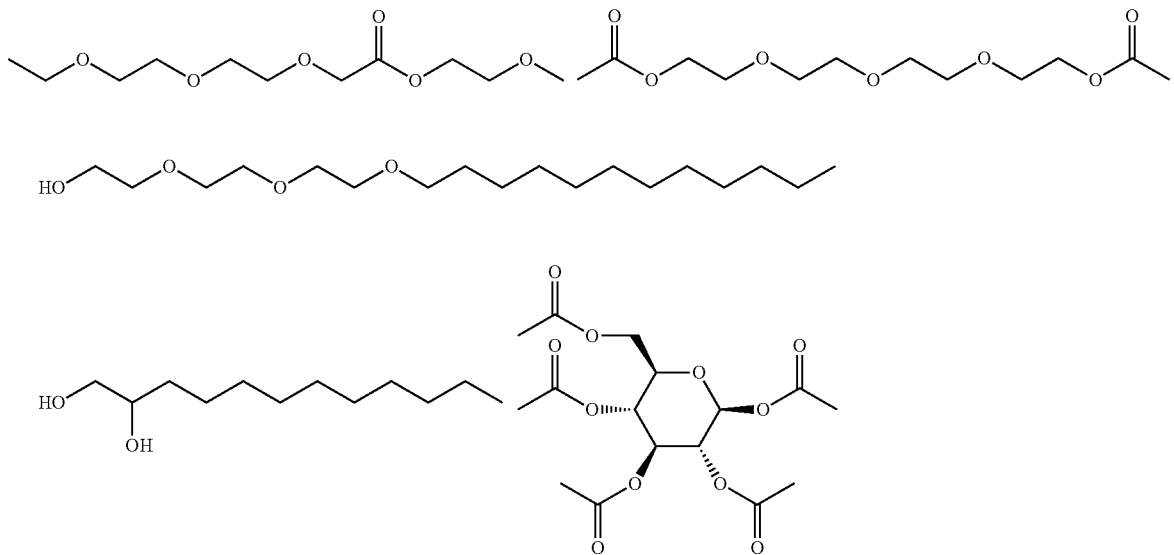

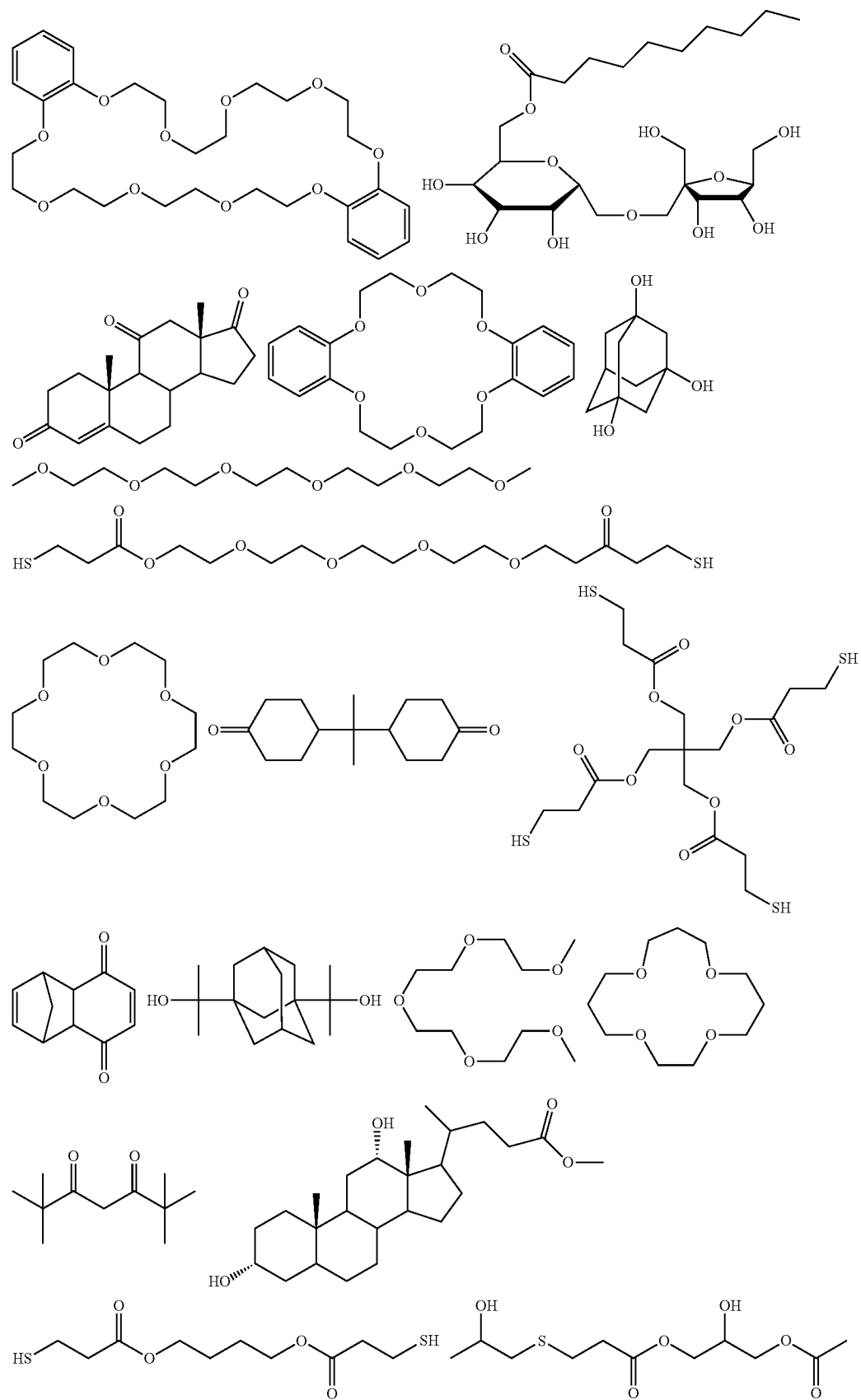

-continued

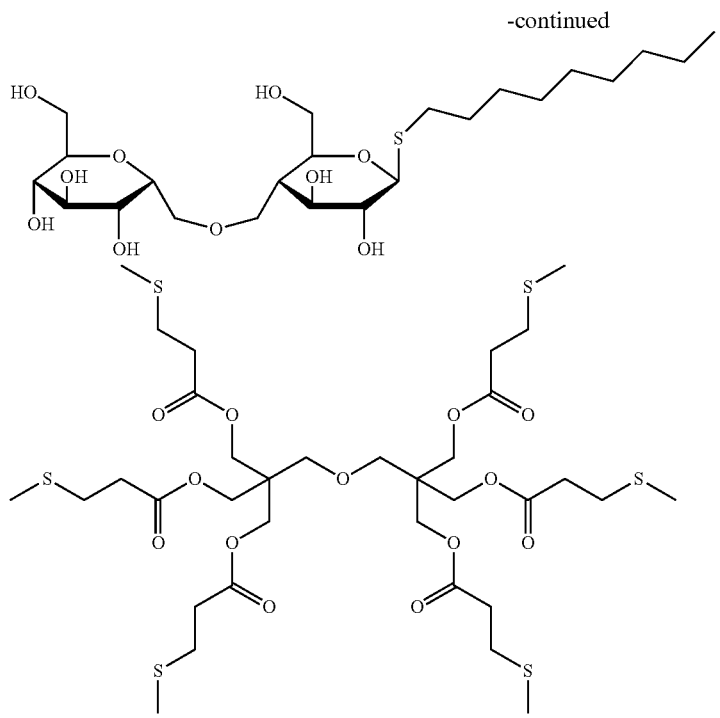

[Surfactant]

The surfactant is not particularly limited, and for example, those mentioned as the surfactant which may be included in the actinic ray-sensitive or radiation-sensitive resin composition can be used. Preferred aspects thereof are also the same as the examples mentioned as the surfactant which may be included in the actinic ray-sensitive or radiation-sensitive resin composition.

[Method for Preparing Topcoat Composition]

It is preferable that the topcoat composition of the present invention is used by dissolving the respective components described above in a solvent, and filtering the solution through a filter. The pore diameter of the filter is, for example, 20 nm or less, more preferably 5 nm or less, and still more preferably 3 nm or less. The lower limit value of the pore diameter is not particularly limited, and may be, for example, 1 nm or more. Here, the "pore diameter" refers to a nominal diameter value of the manufacturer or a value equivalent thereto.

The material of the filter is not particularly limited, and examples thereof include a polyolefin resin (polyethylene, polypropylene, and the like), a polyamide resin (Nylon 6, Nylon 66, Nylon 46, and the like), and a fluorine-containing resin (PTFE and the like). The filter may be a composite material formed by combination of this material with an ion exchange medium.

Furthermore, the filter may be used by connecting a plurality of kinds of filters in series or in parallel. In addition, the composition may be filtered in plural times, and the step of performing filtration in plural times may be a circular filtration step. Further, the composition may be subjected to a deaeration treatment or the like before and after the filtration through a filter.

In a case of using a plurality of kinds of filters, it is preferable to use filters formed of different materials. For example, it is preferable that the first filter is a polyolefin resin-made filter and the second filter is a polyamide resin-made filter. For the polyolefin resin-made filter, its pore diameter usually contributes to removal of impurities, but for the polyamide resin-made filter, in addition to the pore diameter, the adsorption ability of the amide moiety of the resin is mentioned to contribute to removal of impurities. By using a combination of filters having different characteristics, it is possible to remove impurities more efficiently.

It is preferable that impurities such as solvent metals and peroxides contained in the topcoat composition are not included. The content of the impurities included in these materials is preferably 1 ppm or less, more preferably 10 ppb or less, still more preferably 100 ppt or less, and particularly preferably 10 ppt or less, and most preferably, the impurities are substantially not contained (no higher than the detection limit of a measurement apparatus).

In addition, it is preferable to reduce impurities to be carried over from a manufacturing apparatus as well as impurities to be carried over raw materials from raw materials as much as possible. For example, in a case where the manufacturing apparatus is washed with a washing liquid, it is possible to increase the cleanliness of the manufacturing apparatus to a desired level by monitoring the components of the washing liquid after washing and repeating the washing until the amount of the nonvolatile components is reduced to a level equal to or less than a predetermined amount. The amount of the nonvolatile components contained in washing liquid after washing is preferably 1 ppm or less, more preferably 10 ppb or less, still more preferably 100 ppt or less, and particularly preferably 10 ppt or less, and most preferably, the nonvolatile components are substantially not contained (no higher than the detection limit of a measurement apparatus).

[Resist Pattern]

The present invention also relates to a resist pattern formed by the pattern forming method of the present invention as described above.

[Method for Manufacturing Electronic Device, and Electronic Device]

Moreover, the present invention also relates to a method for manufacturing an electronic device, including the pattern forming method of the present invention as described above, and an electronic device manufactured by this manufacturing method.

The electronic device of the present invention is suitably mounted in electrical or electronic equipments (household electronic appliance, Office Automation (OA)/media-related equipment, optical equipment, telecommunication equipment, and the like).

EXAMPLES

Hereinafter, the present invention will be described in more detail with reference to Examples, but the contents of the present invention are not limited thereto.

Synthesis Example 1: Synthesis of Resin (1)

102.3 parts by mass of cyclohexanone was heated at 80° C. under a nitrogen stream. While stirring this liquid, a mixed solution of 22.2 parts by mass of a monomer represented by Structural Formula LM-2m, 22.8 parts by mass of a monomer represented by Structural Formula PM-1m, 6.6 parts by mass of a monomer represented by Structural Formula PM-9m, 189.9 parts by mass of cyclohexanone, and 2.40 parts by mass of dimethyl 2,2'-azobisisobutyrate [V-601, manufactured by Wako Pure Chemical Industries, Ltd.] was added dropwise to the liquid for 5 hours. After completion of the dropwise addition, the solution was further stirred at 80° C. for 2 hours. The obtained reaction solution was left to be cooled, then reprecipitated with a large amount of hexane/ethyl acetate (mass ratio of 9:1) and filtered, and the obtained solid was dried in vacuum to obtain 41.1 parts by mass of a resin (1).

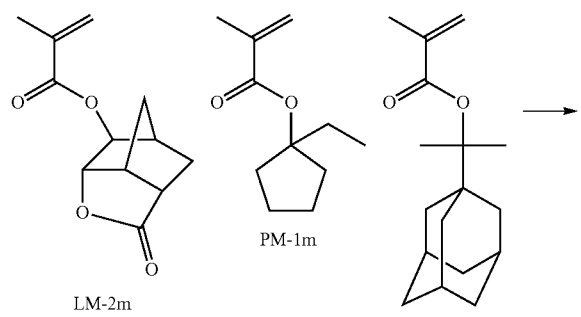

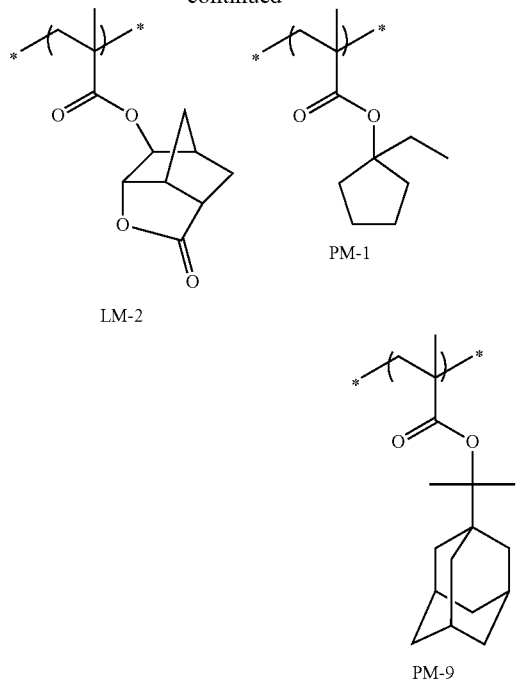

The weight-average molecular weight (Mw) of the obtained resin (1), as determined by GPC (with regard to the measurement method and the like, refer to the above description), was 9,500, and the dispersity (Mw/Mn) was 1.62. The compositional ratio measured by $^{13}$C-NMR (Nuclear Magnetic Resonance) was 40/50/10 in terms of a molar ratio.

Synthesis Example 2: Synthesis of Resins (2) to (13)

The same procedure as in Synthesis Example 1 was carried out to synthesize the resins (2) to (13) described below as an acid-decomposable resin.

Hereinbelow, the compositional ratios (molar ratios; corresponding to the repeating units in order from the left side), the weight-average molecular weights (Mw), and the dispersities (Mw/Mn) of the respective repeating units in the resins (1) to (13) are summarized in Table 1.

TABLE 1

| | Repeating unit | | | | Compositional ratio (molar ratio) | | | | Weight-average molecular weight (Mw) | Dispersity (Mw/Mn) |
|---|---|---|---|---|---|---|---|---|---|---|
| Resin (1) | LM-2 | PM-1 | PM-9 | — | 40 | 50 | 10 | — | 9,500 | 1.62 |
| Resin (2) | LM-2 | PM-12 | PM-13 | — | 40 | 40 | 20 | — | 17,000 | 1.70 |
| Resin (3) | LM-4 | IM-2 | PM-2 | — | 45 | 5 | 50 | — | 11,000 | 1.63 |
| Resin (4) | LM-2 | PM-10 | — | — | 40 | 60 | — | — | 15,000 | 1.66 |
| Resin (5) | LM-2 | PM-3 | PM-9 | IM-3 | 40 | 40 | 10 | 10 | 10,500 | 1.62 |
| Resin (6) | LM-1 | PM-10 | IM-4 | — | 40 | 50 | 10 | — | 15,500 | 1.68 |
| Resin (7) | LM-2 | PM-15 | — | — | 40 | 60 | — | — | 11,000 | 1.65 |
| Resin (8) | LM-3 | PM-3 | PM-10 | — | 40 | 40 | 20 | — | 10,000 | 1.64 |
| Resin (9) | LM-4 | PM-12 | PM-15 | — | 40 | 50 | 10 | — | 9,000 | 1.60 |
| Resin (10) | LM-2 | PM-13 | — | — | 40 | 60 | — | — | 8,000 | 1.63 |

TABLE 1-continued
| Repeating unit | | | | Compositional ratio (molar ratio) | | | | Weight-average molecular weight (Mw) | Dispersity (Mw/Mn) |
|---|---|---|---|---|---|---|---|---|---|
| Resin (11) | LM-3 | PM-13 | IM-1 | — | 40 | 50 | 10 | — | 9,500 | 1.70 |
| Resin (12) | LM-2 | PM-12 | PM-9 | — | 40 | 50 | 10 | — | 17,000 | 1.65 |
| Resin (13) | LM-2 | PM-3 | PM-9 | — | 30 | 30 | 40 | — | 14,000 | 1.71 |
The repeating units in Table 1 are as follows.
LM-1
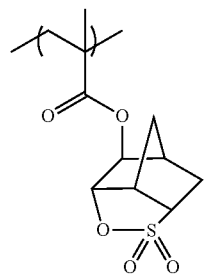
LM-2
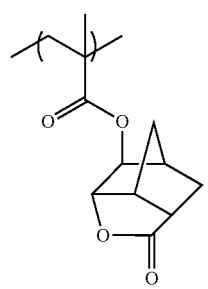
LM-3
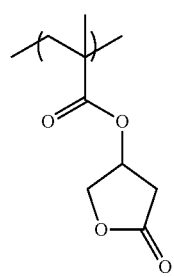
LM-4
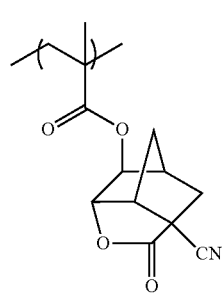
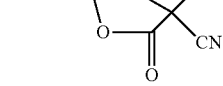
IM-1
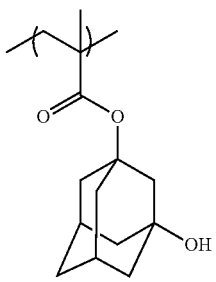
IM-2
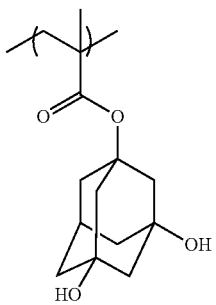
IM-3
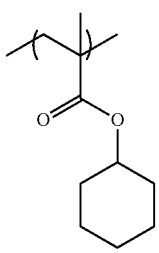
IM-4
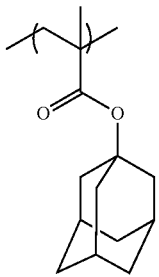
PM-1
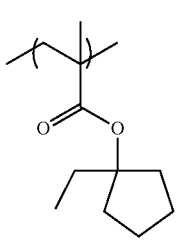

PM-2

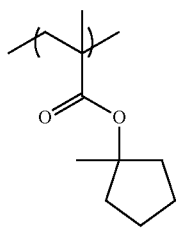

PM-3

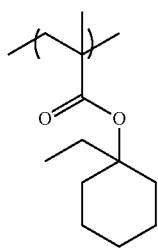

PM-4

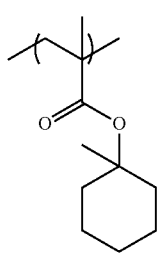

PM-9

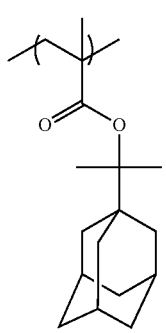

PM-10

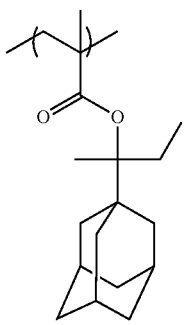

PM-12

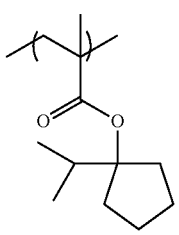

PM-13

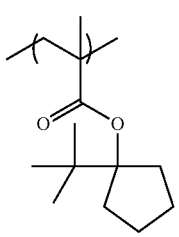

PM-15

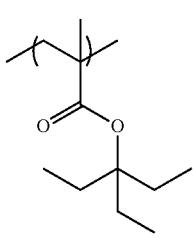

<Preparation of Resist Composition>

The components shown in Table 2 were dissolved in the solvents shown in Table 2 to prepare solutions having a concentration of the solid contents of 3.5% by mass, and the solutions were filtered through a polyethylene filter having a pore size of 0.04 μm to prepare resist compositions Re-1 to Re-16.

In addition, the mass ratio described under the solvent in Table 2 represents the mass ratio of each component with respect to the total mass of the solvent.

TABLE 2

| | Resin | | Acid generator | | Basic compound | | Hydrophobic resin | | Solvent | | | | |
|---|---|---|---|---|---|---|---|---|---|---|---|---|---|
| | | Parts by mass | | Parts by mass | | Parts by mass | | Parts by mass | | Mass ratio | | Mass ratio | | Mass ratio |
| Re-1 | Resin (1) | 85.5 | A1 | 12.0 | D-1 | 1.5 | E-1 | 1.0 | SL-1 | 70 | SL-2 | 30 | — | — |
| Re-2 | Resin (2) | 87.2 | A2 | 10.0 | D-1 | 1.3 | E-1 | 1.5 | SL-1 | 95 | SL-4 | 5 | — | — |
| Re-3 | Resin (3) | 84.7 | A3 | 9.5 | D-1 | 4.5 | E-1 | 1.3 | SL-1 | 60 | SL-2 | 40 | — | — |
| Re-4 | Resin (4) | 82.2 | A4 | 15.5 | D-3 | 1.8 | E-1 | 0.5 | SL-1 | 60 | SL-3 | 40 | — | — |
| Re-5 | Resin (5) | 89.9 | A5 | 8.5 | D-4 | 0.8 | E-1 | 0.8 | SL-1 | 90 | SL-3 | 10 | — | — |
| Re-6 | Resin (6) | 86.2 | A6 | 10.5 | D-5 | 1.3 | E-1 | 2.0 | SL-2 | 100 | — | — | — | — |
| Re-7 | Resin (7) | 86.1 | A7 | 11.0 | D-6 | 1.2 | E-1 | 1.7 | SL-1 | 90 | SL-2 | 5 | SL-4 | 5 |

TABLE 2-continued

| | Resin | Parts by mass | Acid generator | Parts by mass | Basic compound | Parts by mass | Hydrophobic resin | Parts by mass | Solvent | Mass ratio | | Mass ratio | | Mass ratio |
|---|---|---|---|---|---|---|---|---|---|---|---|---|---|---|
| Re-8 | Resin (8) | 81.9 | A8 | 10.5 | D-2 | 6.0 | E-1 | 1.6 | SL-1 | 80 | SL-2 | 20 | — | — |
| Re-9 | Resin (9) | 84.0 | A2/A5 | 4.0/5.0 | D-1 | 3.5 | E-2 | 3.5 | SL-1 | 75 | SL-2 | 25 | — | — |
| Re-10 | Resin (1)/Resin (10) | 42.2/39.1 | A3 | 16.0 | D-1 | 0.9 | E-2 | 1.8 | SL-1 | 80 | SL-3 | 20 | — | — |
| Re-11 | Resin (1) | 87.3 | A1 | 10.0 | D-5 | 1.0 | E-1 | 1.7 | SL-1 | 70 | SL-2 | 30 | — | — |
| Re-12 | Resin (10) | 85.1 | A1/A9 | 8.0/4.0 | D-3 | 1.5 | E-1 | 1.4 | SL-1 | 70 | SL-2 | 30 | — | — |
| Re-13 | Resin (11) | 86.1 | A1 | 10.0 | D-3 | 1.3 | E-2 | 2.6 | SL-1 | 95 | SL-4 | 5 | — | — |
| Re-14 | Resin (12) | 84.1 | A3 | 9.5 | D-1 | 4.5 | E-2 | 1.9 | SL-1 | 60 | SL-2 | 40 | — | — |
| Re-15 | Resin (13) | 86.5 | A1 | 10.5 | D-5 | 1.3 | E-1 | 1.7 | SL-2 | 100 | — | — | — | — |
| Re-16 | Resin (10) | 85.6 | A10 | 10.5 | D-3 | 1.3 | E-1 | 2.6 | SL-1 | 60 | SL-2 | 40 | — | — |

The abbreviations in Table 2 are as follows.
<Acid Generator>

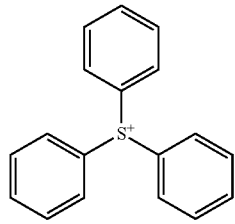

A1

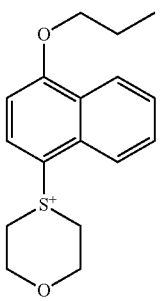

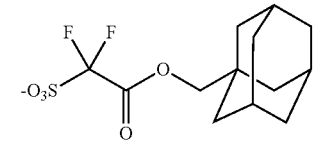

(Mol. Wt.: 612.75)

A3

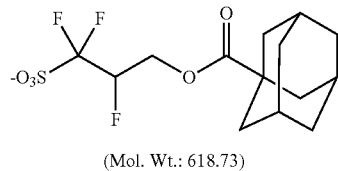

(Mol. Wt.: 618.73)

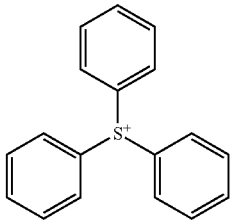

A4

A2

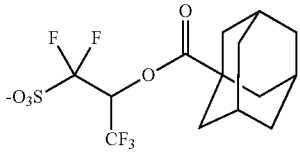

(Mol. Wt.: 654.71)

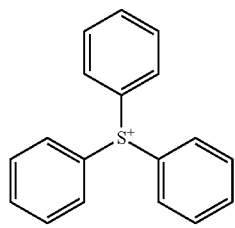

(Mol. Wt.: 586.71)

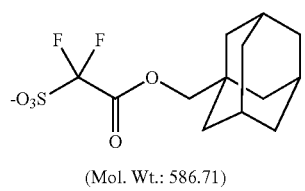

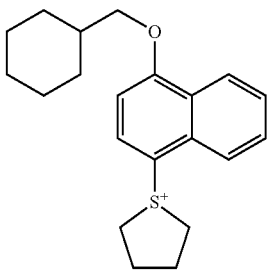

A5

-continued (Mol. Wt.: 650.84)

(Mol. Wt.: 674.86)

(Mol. Wt.: 670.80)

(Mol. Wt.: 751.86)

-continued (Mol. Wt.: 586.71)

A6

(Mol. Wt.: 632.78)

A7

<Basic Compound>

D-1

A8

D-2

D-3

A9

D-4

A10

D-5

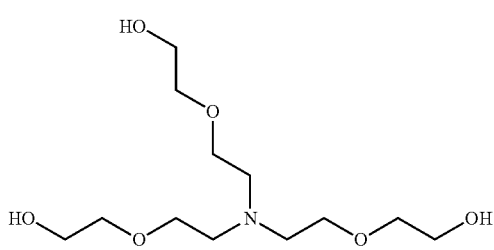

D-6

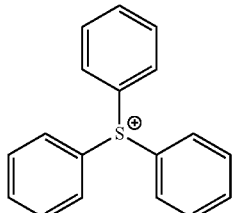

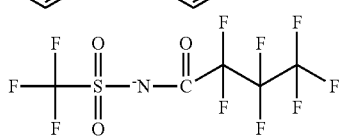

<Hydrophobic Resin>

In the following hydrophobic resins, the compositional ratio (molar ratio) is denoted in each repeating unit.

E-1

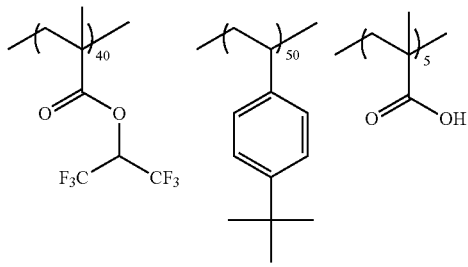

E-2

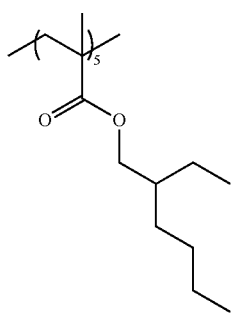

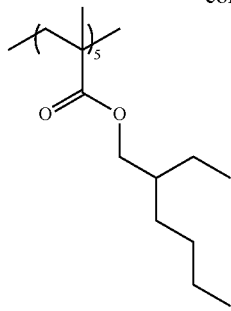

<Solvent>

SL-1: Propylene glycol monomethyl ether acetate (PGMEA)

SL-2: Cyclohexanone

SL-3: Propylene glycol monomethyl ether (PGME)

SL-4: γ-Butyrolactone

Synthesis Example 3: Synthesis of Resin X-11

57.0 g of cyclohexanone was put into a three-neck flask and heated at 85° C. under a nitrogen stream. A solution of 17.4 g of a monomer represented by Structural Formula XM-2, 11.7 g of a monomer represented by Structural Formula XM-3, and a polymerization initiator, V-601 (manufactured by Wako Pure Chemical Industries, Ltd., 2.76 g), which had been dissolved in 107.2 g of cyclohexanone, was added dropwise thereto for 4 hours. The solution after the dropwise addition was further stirred at 85° C. for 2 hours to perform a reaction. The reaction solution was left to be cooled, and then 1,360 g of methanol was added dropwise thereto for 20 minutes. The precipitated powder was collected by filtration, and dried to obtain a resin X-11 (24.1 g). The weight-average molecular weight in terms of standard polystyrene and the dispersity (Mw/Mn) of the obtained resin X-11 were 9,600 and 1.68, respectively.

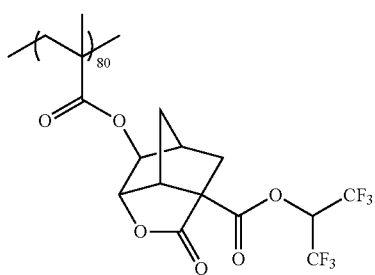

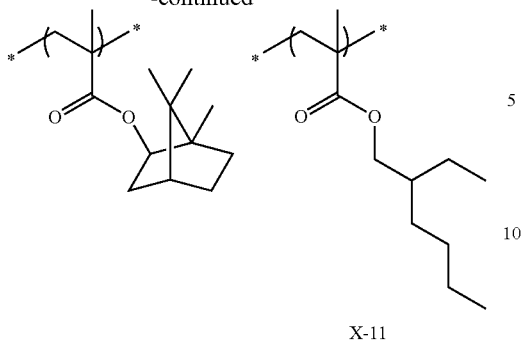

X-11

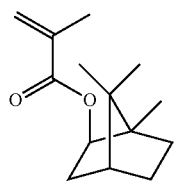

XM-2

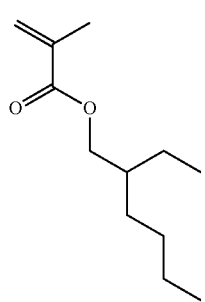

XM-3

Synthesis Example 4: Synthesis of Resins X-1 to X-10 and Resins X-12 to X-21

The same procedure as in Synthesis Example 3 was carried out to synthesize resins X-1 to X-10 and resins X-12 to X-21.

Hereinafter, the compositional ratios (molar ratios), the weight-average molecular weights (Mw), and the dispersities (Mw/Mn) of the monomers corresponding to the respective repeating units in the resins X-1 to X-21 are shown in Table 3.

TABLE 3

| | Compositional ratio (molar ratio) | | | | | | | | | | | | | | | | | | |
|---|---|---|---|---|---|---|---|---|---|---|---|---|---|---|---|---|---|---|---|
| | XM-1 | XM-2 | XM-3 | XM-4 | XM-5 | XM-6 | XM-7 | XM-8 | XM-9 | XM-10 | XM-11 | XM-12 | XM-13 | XM-14 | XM-15 | XM-16 | XM-17 | Mw | Mw/Mn |
| X-1 | | 40 | 30 | | | | | 30 | | | | | | | | | | 8,000 | 1.69 |
| X-2 | | 89 | 9 | | | | | | | | | | | 2 | | | | 16,000 | 1.71 |
| X-3 | | | 30 | 70 | | | | | | | | | | | | | | 10,000 | 1.68 |
| X-4 | | | 18 | | 80 | | | | | | | | | 2 | | | | 9,500 | 1.65 |
| X-5 | | | | | | | 98 | | | | | | | 2 | | | | 12,000 | 1.68 |
| X-6 | 80 | | | | | | | 18 | | | | | | | 2 | | | 14,500 | 1.63 |
| X-7 | | 38 | | | 60 | | | | | | | | | 2 | | | | 9,000 | 1.75 |
| X-8 | 50 | | | | | | | 30 | 20 | | | | | | | | | 10,000 | 1.73 |
| X-9 | | 39 | 29 | | | | | 30 | | | | | | | 2 | | | 8,000 | 1.63 |
| X-10 | | | | | 65 | | | | | | | | 30 | | 5 | | | 27,000 | 2.05 |
| X-11 | | 60 | 40 | | | | | | | | | | | | | | | 9,600 | 1.68 |
| X-12 | | 80 | | | | | | | | 18 | | | | 2 | | | | 11,000 | 1.59 |
| X-13 | | | | | | 40 | 55 | | | 5 | | | | | | | | 9,500 | 1.70 |
| X-14 | | | | 50 | | | | 40 | | | 10 | | | | | | | 15,000 | 1.65 |
| X-15 | | 40 | | | 60 | | | | | | | | | | | | | 8,500 | 1.63 |
| X-16 | | 39 | 29 | | | | | 30 | | | | | | 2 | | | | 8,000 | 1.64 |
| X-17 | | | 40 | 50 | | | | | | | | | | | | | 10 | 9,000 | 1.67 |
| X-18 | | | | | | | | | | | | | 50 | | 50 | | | 10,000 | 1.72 |
| X-19 | | 60 | 30 | | | | | 10 | | | | | | | | | | 10,000 | 1.70 |
| X-20 | | 40 | 40 | | | | | 20 | | | | | | | | | | 8,000 | 1.53 |
| X-21 | | 40 | 39 | | | | | 19 | | | | | | 2 | | | | 8,000 | 1.42 |

The monomers in Table 3 are as follows.

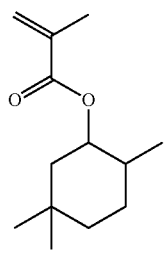

XM-1

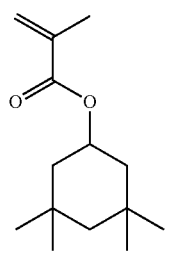

XM-4

-continued
XM-5
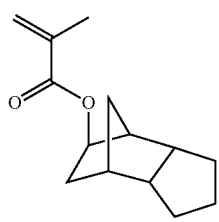
XM-6
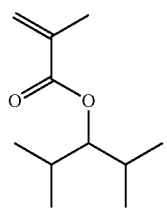
XM-7
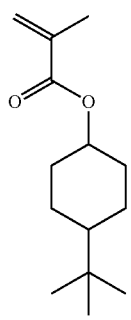
XM-8
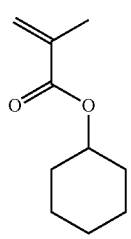
XM-9
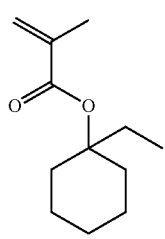
XM-10
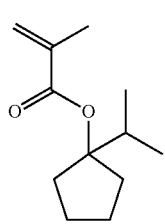
-continued
XM-11
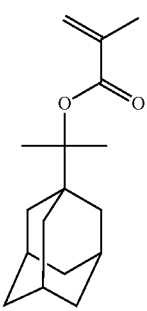
XM-12
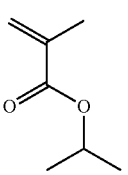
XM-13
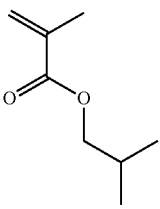
XM-14
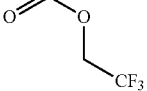
XM-15
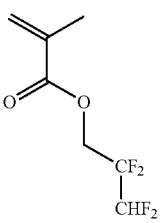
XM-16
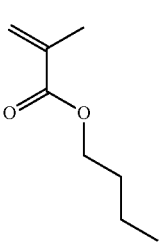
XM-17
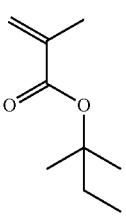
<Preparation of Topcoat Composition>
The components shown in Table 4 were dissolved in the solvents shown in Table 4 to prepare solutions, each having a concentration of the solid contents of 3.0% by mass. The solutions were filtered through a polyethylene filter having a pore size of 0.04 μm to prepare topcoat compositions T-1 to T-52, and TC-1.

In Table 4, the contents (unit: % by mass) of the compounds (A) and (B) are based on a total solid content of the topcoat composition. Further, as the compounds (A) and (B), a compound as a commercially available product or a compound synthesized by a known method was appropriately used.

Furthermore, in Table 4, the content of the surfactant was set to 0.5% by mass, based on the solid content.

TABLE 4

|  | Resin (mass ratio) | Compound (A) | | Compound (B) | | Surfactant | Solvent (mass ratio) |
|---|---|---|---|---|---|---|---|
|  |  | Type | Content [% by mass] | Type | Content [% by mass] |  |  |
| T-1 | X-16 | A-9 | 0.7% | B-3 | 12.0% | — | 4-Methyl-2-pentanol |
| T-2 | X-16 | A-9 | 5.2% | B-3 | 20.0% | — | Diisoamyl ether/4-methyl-2-pentanol (80/20) |
| T-3 | X-11 | A-9 | 0.8% | — | — | — | 4-Methyl-2-pentanol |
| T-4 | X-16 | A-9 | 3.6% | B-3 | 12.0% | W-1 | 4-Methyl-2-pentanol |
| T-5 | X-16 | A-9 | 0.9% | B-3 | 14.0% | — | Diisoamyl ether |
| T-6 | X-6 | A-1 | 4.2% | B-5 | 0.3% | — | 4-Methyl-2-pentanol |
| T-7 | X-7 | A-2 | 1.1% | B-3 | 10.0% | — | 4-Methyl-2-pentanol |
| T-8 | X-8 | A-3 | 0.90% | B-3 | 22.0% | — | 4-Methyl-2-pentanol |
| T-9 | X-9 | A-4 | 5.10% | B-3 | 11.0% | — | 4-Methyl-2-pentanol |
| T-10 | X-10 | A-5 | 0.80% | — | — | — | 4-Methyl-2-pentanol |
| T-11 | X-8 | A-6 | 2.00% | B-3 | 14.0% | — | Isobutyl isobutyrate/4-Methyl-2-pentanol (60/40) |
| T-12 | X-9 | A-7 | 1.40% | B-3 | 12.0% | — | 4-Methyl-2-pentanol |
| T-13 | X-15 | A-8 | 1.50% | B-5 | 0.4% | — | 4-Methyl-2-pentanol |
| T-14 | X-16 | A-9 | 1.20% | B-3 | 16.0% | — | 4-Methyl-2-pentanol |
| T-15 | X-17 | A-10 | 3.20% | B-3 | 10.0% | — | 4-Methyl-2-pentanol |
| T-16 | X-12 | A-11 | 0.80% | B-3 | 8.0% | — | 4-Methyl-2-pentanol |
| T-17 | X-16 | A-12 | 0.70% | B-3 | 7.0% | — | 4-Methyl-2-pentanol |
| T-18 | X-1 | A-13 | 1.00% | B-2 | 0.3% | — | 4-Methyl-2-pentanol |
| T-19 | X-2 | A-14 | 1.20% | — | — | W-2 | 4-Methyl-2-pentanol |
| T-20 | X-3 | A-15 | 0.80% | B-3 | 12.0% | — | 4-Methyl-2-pentanol |
| T-21 | X-4 | A-16 | 1.30% | B-3 | 16.0% | — | 4-Methyl-2-pentanol |
| T-22 | X-5 | A-17 | 8.60% | — | — | — | 4-Methyl-2-pentanol |
| T-23 | X-6 | A-18 | 0.40% | B-3 | 10.0% | — | 4-Methyl-2-pentanol |
| T-24 | X-7 | A-19 | 0.70% | B-5 | 0.4% | — | 4-Methyl-2-pentanol |
| T-25 | X-8 | A-20 | 0.40% | — | — | — | 4-Methyl-2-pentanol |
| T-26 | X-9 | A-21 | 0.40% | B-3 | 12.0% | — | 4-Methyl-2-pentanol |
| T-27 | X-10 | A-22 | 1.20% | B-4 | 10.0% | — | n-Decane/4-methyl-2-pentanol (30/70) |
| T-28 | X-6 | A-23 | 0.70% | — | — | — | 4-Methyl-2-pentanol |
| T-29 | X-7 | A-24 | 6.80% | B-3 | 14.0% | — | 4-Methyl-2-pentanol |
| T-30 | X-8 | A-25 | 0.70% | B-3 | 5.0% | — | 4-Methyl-2-pentanol |
| T-31 | X-9 | A-26 | 1.20% | B-5 | 0.4% | W-3 | 4-Methyl-2-pentanol |
| T-32 | X-12 | A-27 | 4.90% | B-3 | 6.0% | — | 4-Methyl-2-pentanol |
| T-33 | X-16 | A-28 | 1.20% | B-3 | 8.0% | — | 4-Methyl-2-pentanol |
| T-34 | X-17 | A-29 | 0.70% | B-3 | 6.0% | — | 4-Methyl-2-pentanol |
| T-35 | X-18 | A-30 | 0.80% | — | — | — | 4-Methyl-2-pentanol |
| T-36 | X-12 | A-31 | 0.70% | B-3 | 10.0% | — | 4-Methyl-2-pentanol |
| T-37 | X-13 | A-32 | 9.30% | — | — | — | 4-Methyl-2-pentanol |
| T-38 | X-14 | A-33 | 0.70% | B-3 | 12.0% | — | 4-Methyl-2-pentanol |
| T-39 | X-16/X-2 (70/30) | A-9/ A-6 | 0.7%/ 0.2% | B-3 | 12.0% | — | 4-Methyl-2-pentanol |
| T-40 | X-20 | A-34 | 0.7% | B-3 | 12.0% | — | 4-Methyl-2-pentanol/n-decane (90/10) |
| T-41 | X-21 | A-35 | 0.6% | B-5 | 0.4% | W-1 | 4-Methyl-2-pentanol/n-decane/isobutyl isobutyrate (80/10/10) |
| T-42 | X-20 | A-36 | 1.2% | B-3 | 12.0% | W-1 | 4-Methyl-2-pentanol/n-decane (80/20) |
| T-43 | X-15 | A-37 | 1.0% | B-5 | 0.4% | — | 4-Methyl-2-pentanol |
| T-44 | X-16 | A-34 | 1.4% | B-4 | 12.4% | — | 4-Methyl-2-pentanol/n-decane/isobutyl isobutyrate (80/10/10) |
| T-45 | X-6 | A-35 | 2.0% | B-1 | 0.3% | W-1 | 4-Methyl-2-pentanol/n-decane (90/10) |
| T-46 | X-8 | A-11 | 1.6% | B-2 | 0.4% | — | 4-Methyl-2-pentanol |
| T-47 | X-9 | A-38 | 2.0% | B-5 | 0.4% | W-1 | 4-Methyl-2-pentanol |
| T-48 | X-10 | A-7 | 1.8% | B-4 | 10.0% | — | 4-Methyl-2-pentanol/n-decane/isobutyl isobutyrate (80/10/10) |
| T-49 | X-8 | A-16 | 2.4% | B-1 | 0.3% | — | 4-Methyl-2-pentanol/n-decane (80/20) |
| T-50 | X-19 | A-34 | 1.4% | B-4 | 8.0% | W-1 | Ethyl 3,5,5-trimethylhexanoate/isobutyl isobutyrate (90/10) |
| T-51 | X-19 | A-35 | 2.0% | — | — | — | Ethyl 3,5,5-trimethylhexanoate/isoamyl isovalerate (90/10) |
| T-52 | X-21 | A-34 | 0.7% | B-3 | 12.0% | — | 4-Methyl-2-pentanol/n-decane (90/10) |
| TC-1 | X-17 | — | — | B-1 | 4.80% | — | 4-Methyl-2-pentanol |

The abbreviations in Table 4 are as follows.
<(Compound (A))>
A-1
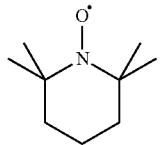
A-2
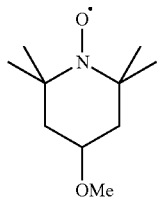
A-3
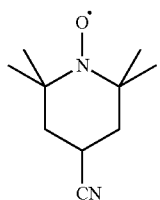
A-4
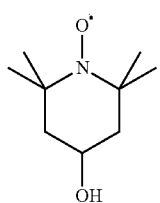
A-5
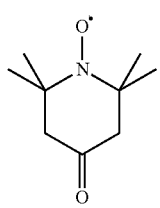
A-6
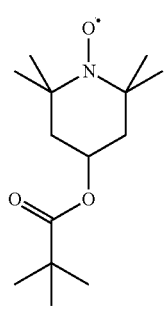
A-7
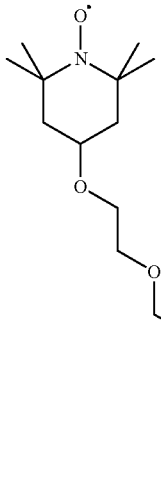
A-8
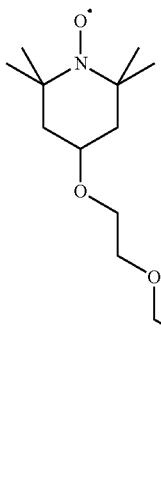
A-9
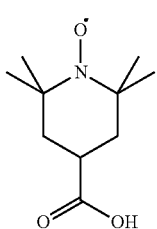
A-10
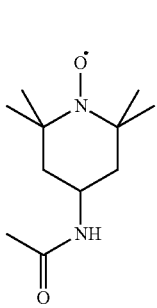

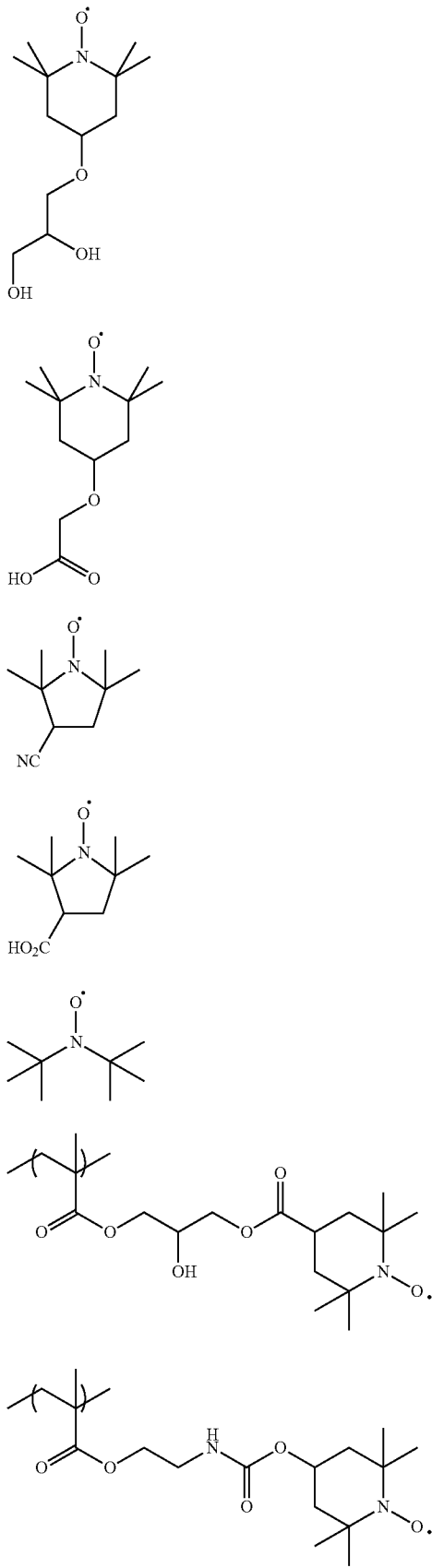
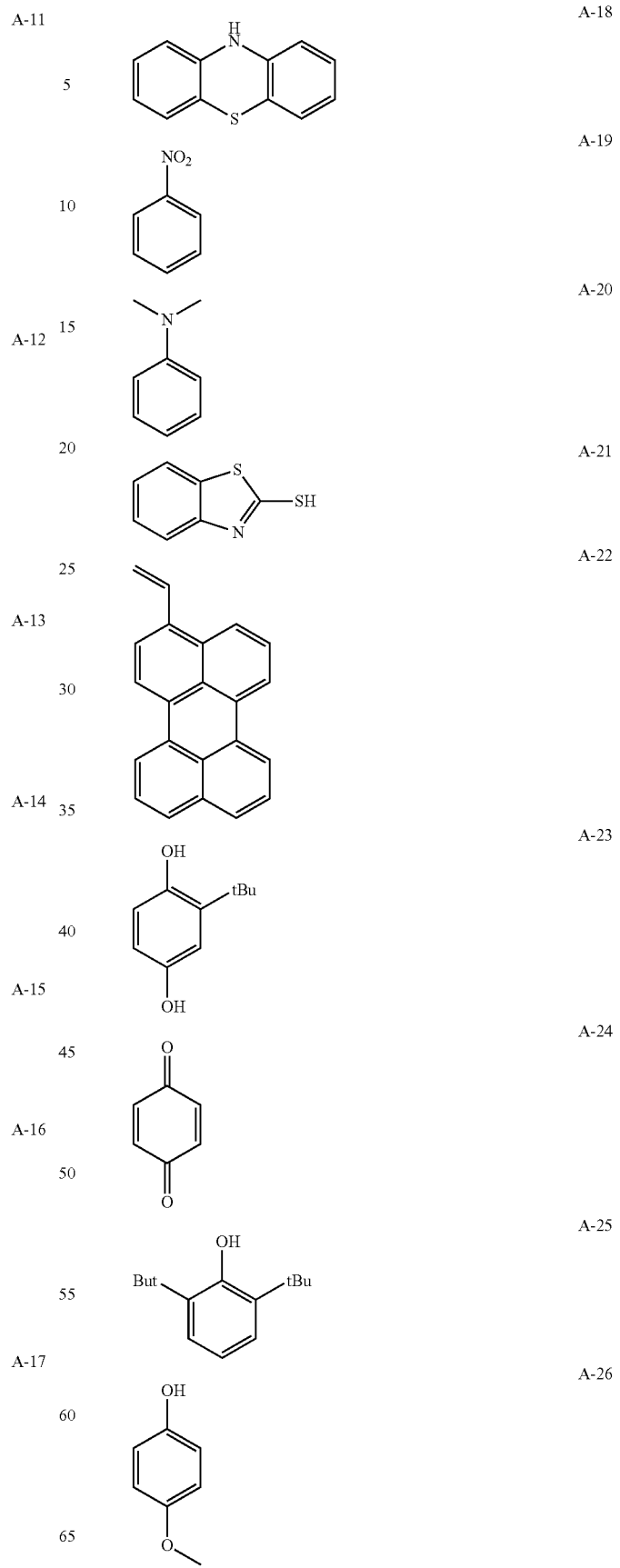

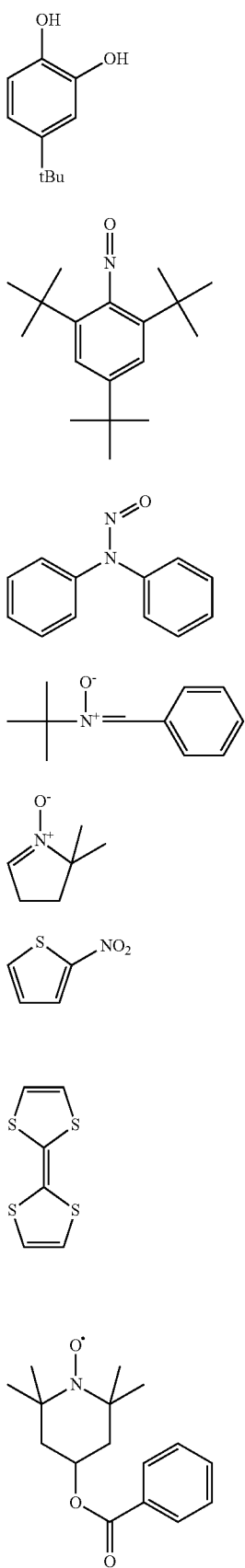

-continued

B-4

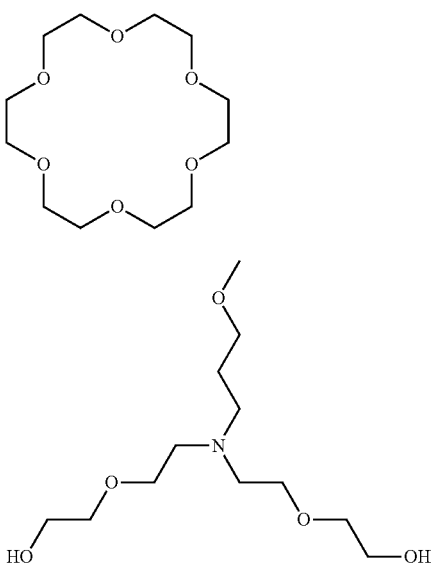

B-5

<Surfactant>

W-1: PF6320 (manufactured by OMNOVA Solutions Inc.) (fluorine-based)

W-2: TROYSOL S-366 (manufactured by Troy Chemical Corp.)

W-3: Polysiloxane Polymer KP-341 (manufactured by Shin-Etsu Chemical COMPANY LIMITED, silicon-based)

Examples 1 to 54 and Comparative Example 1

Using the resist compositions and topcoat compositions prepared above, resist patterns were formed and evaluated by the following methods.

(Formation of Trench Pattern)

A composition for forming an organic antireflection film, ARC29SR (manufactured by Brewer Science, Inc.), was applied onto a silicon wafer having an opening diameter of 300 mm, and baking was carried out at 205° C. for 60 seconds to form an organic antireflection film having a film thickness of 86 nm. A resist composition shown in Table 5 was applied onto the organic antireflection film, and baking was carried out at 100° C. for 60 seconds to form a resist film having a film thickness shown in Table 5.

In addition, a topcoat composition shown in Table 5 was applied onto the resist film, and then heating (PB: Prebake) was carried out at a PB temperature shown in Table 5 over 60 seconds to form a topcoat having a film thickness shown in Table 5.

Then, pattern exposure was carried out via a halftone mask with a thickness of a light-shielding portion corresponding to a trench of 50 nm and pitches between the light-shielding portions of 250 nm, using an ArF excimer laser liquid immersion scanner (manufactured by ASML; XT1700i, NA1.20, C-Quad, outer sigma 0.900, inner sigma 0.790, and Y deflection). Ultrapure water was used as the immersion liquid. Thereafter, heating (Post Exposure Bake: PEB) was carried out at a PEB temperature described in Table 5 for 60 seconds. Then, development was carried out by paddling for 30 seconds using an organic developer described in Table 5, and rinsing was carried out by paddling for 30 seconds using a rinsing liquid described in Table 5.

Subsequently, a trench pattern with a trench width of 50 nm was obtained by rotating the wafer at a rotation speed of 2,000 rpm for 30 seconds.

(Formation of Line-and-Space Pattern)

An organic antireflection film, a resist film, and a topcoat were formed in this order on a silicon wafer in the same manner as in the formation of the trench pattern. Before forming a topcoat, the resist film was subjected to a pre-wetting treatment for applying 4-methyl-2-heptanol.

Then, pattern exposure was carried out via a halftone mask with a line width of 50 nm and a space width of 50 nm, using an ArF excimer laser liquid immersion scanner (manufactured by ASML; XT1700i, NA1.20, Dipole, outer sigma 0.800, inner sigma 0.564, and Y deflection). Ultrapure water was used as the immersion liquid. Thereafter, the silicon wafer was heated (Post Exposure Bake: PEB) at a PEB temperature described in Table 5 for 60 seconds. Then, the silicon wafer was developed by paddling for 30 seconds using an organic developer described in Table 5, and rinsed by paddling for 30 seconds using a rinsing liquid described in Table 5. Subsequently, a 1:1 line-and-space pattern with a line width of 50 nm was obtained by rotating the wafer at a rotation speed of 2,000 rpm for 30 seconds.

(Exposure Latitude (EL))

In the formation of the line-and-space pattern, the line-and-space pattern was observed using a critical dimension scanning electron microscope (S-9380II, Hitachi, Ltd.), and the optimum exposure dose (Eopt, unit: $mJ/cm^2$) in a case where the line pattern with a line width of 50 nm was resolved was determined. Based on the determined optimum exposure dose (Eopt), the exposure dose (unit: $mJ/cm^2$) at which the line width became ±10% of 50 nm (that is, 45 nm and 55 nm) which were target values was determined. Further, the exposure latitude (EL, unit: %) defined by the following equation was calculated. As the value of EL was higher, the change in performance due to a change in the exposure dose was smaller, which is thus favorable. The results are shown in Table 5.

EL=[(Exposure dose at which the line width becomes 45 nm)−(Exposure dose at which the line width becomes 55 nm)]/Eopt×100

(Focus Latitude (DOF))

In the formation of the trench pattern, exposure and development were carried out by changing the conditions of the exposure focus at an interval of 20 nm in the focus direction. The trench width of each of the obtained patterns was measured using a line-width critical dimension scanning electron microscope SEM (S-9380, Hitachi, Ltd.), and a focus corresponding to the minimum value or the maximum value in a curve obtained by plotting the respective trench widths was defined as the best focus. In a case where the focus was changed around the center of the best focus, a variation width of the focus tolerating a trench width of 50 nm±10% was determined, and the determined variation width was taken as a focus latitude (DOF, unit: nm) was calculated. A larger value thereof indicates better performance. The results are shown in Table 5.

(Sensitivity)

In the formation of the line-and-space pattern, the line-and-space pattern was observed using a critical dimension scanning electron microscope (S-9380II, Hitachi, Ltd.), and the minimum exposure dose (unit: $mJ/cm^2$) at which the line pattern with a line width of 50 nm was resolved was taken as sensitivity. A larger value indicates better performance. The results are shown in Table 5.

TABLE 5

| | Resist composition | Thickness [nm] of resist film | Topcoat composition | PB temperature [° C.] | Thickness [nm] of topcoat | PEB temperature [° C.] | Organic developer (mass ratio) | Rinsing liquid (mass ratio) | EL [%] | DOF [nm] | Sensitivity [mJ/cm²] |
|---|---|---|---|---|---|---|---|---|---|---|---|
| Example 1 | Re-15 | 90 | T-1 | 90 | 90 | 90 | Butyl acetate | 4-Methyl-2-heptanol | 19.1 | 122 | 32 |
| Example 2 | Re-5 | 90 | T-2 | 90 | 60 | 95 | Butyl acetate | 4-Methyl-2-heptanol | 19.0 | 120 | 35 |
| Example 3 | Re-9 | 90 | T-3 | 90 | 70 | 80 | Butyl acetate | 4-Methyl-2-heptanol | 18.6 | 121 | 33 |
| Example 4 | Re-13 | 90 | T-4 | 100 | 30 | 95 | Butyl acetate | 4-Methyl-2-heptanol | 18.1 | 122 | 36 |
| Example 5 | Re-15 | 85 | T-5 | 90 | 60 | 90 | Butyl acetate | 4-Methyl-2-heptanol | 18.5 | 123 | 32 |
| Example 6 | Re-11 | 90 | T-6 | 90 | 50 | 95 | Butyl acetate | 4-Methyl-2-heptanol | 17.9 | 120 | 33 |
| Example 7 | Re-15 | 70 | T-7 | 100 | 70 | 80 | Butyl acetate | 4-Methyl-2-heptanol | 18.0 | 119 | 35 |
| Example 8 | Re-12 | 90 | T-8 | 90 | 50 | 90 | Butyl acetate | 4-Methyl-2-heptanol | 17.6 | 118 | 31 |
| Example 9 | Re-6 | 90 | T-9 | 90 | 90 | 90 | Butyl acetate | 4-Methyl-2-heptanol | 17.9 | 120 | 36 |
| Example 10 | Re-1 | 90 | T-10 | 90 | 90 | 90 | Butyl acetate | 4-Methyl-2-heptanol | 18.3 | 118 | 32 |
| Example 11 | Re-5 | 85 | T-11 | 90 | 60 | 95 | Butyl acetate | 4-Methyl-2-heptanol | 18.6 | 123 | 35 |
| Example 12 | Re-13 | 90 | T-12 | 90 | 70 | 80 | 2-Heptanone | Diisobutyl ether | 18.9 | 119 | 36 |
| Example 13 | Re-2 | 90 | T-13 | 100 | 30 | 90 | Butyl acetate | 4-Methyl-2-heptanol | 17.8 | 117 | 33 |
| Example 14 | Re-15 | 90 | T-14 | 90 | 60 | 90 | Butyl acetate | 4-Methyl-2-heptanol | 18.2 | 123 | 31 |
| Example 15 | Re-2 | 90 | T-15 | 100 | 60 | 90 | Butyl acetate | 4-Methyl-2-heptanol | 18.3 | 121 | 33 |
| Example 16 | Re-14 | 85 | T-16 | 90 | 50 | 80 | Butyl acetate | 4-Methyl-2-heptanol | 18.7 | 119 | 34 |
| Example 17 | Re-13 | 70 | T-17 | 90 | 50 | 90 | Butyl acetate | 4-Methyl-2-heptanol/diisobutyl ether (50/50) | 17.8 | 122 | 32 |
| Example 18 | Re-7 | 85 | T-18 | 100 | 100 | 90 | Butyl acetate | 4-Methyl-2-heptanol | 18.1 | 120 | 35 |
| Example 19 | Re-7 | 100 | T-19 | 90 | 90 | 90 | Butyl acetate | 4-Methyl-2-heptanol | 17.6 | 124 | 33 |
| Example 20 | Re-17 | 90 | T-20 | 90 | 60 | 95 | Butyl acetate | n-Decane | 17.9 | 118 | 31 |
| Example 21 | Re-3 | 90 | T-21 | 80 | 70 | 80 | Butyl acetate | 4-Methyl-2-heptanol | 18.1 | 121 | 32 |
| Example 22 | Re-1 | 90 | T-22 | 100 | 30 | 95 | Butyl acetate | 4-Methyl-2-heptanol | 18.0 | 120 | 33 |
| Example 23 | Re-1 | 90 | T-23 | 90 | 60 | 90 | Butyl propionate | 4-Methyl-2-heptanol | 16.7 | 107 | 35 |
| Example 24 | Re-8 | 90 | T-24 | 90 | 50 | 90 | Butyl acetate | 4-Methyl-2-heptanol | 17.0 | 115 | 31 |
| Example 25 | Re-11 | 90 | T-25 | 90 | 70 | 90 | Butyl acetate | 4-Methyl-2-heptanol | 16.0 | 104 | 32 |
| Example 26 | Re-4 | 90 | T-26 | 90 | 50 | 95 | Butyl acetate | n-Decane | 16.3 | 103 | 33 |
| Example 27 | Re-15 | 90 | T-27 | 100 | 90 | 90 | Butyl acetate | 4-Methyl-2-heptanol | 16.2 | 103 | 34 |
| Example 28 | Re-10 | 90 | T-28 | 90 | 90 | 80 | 2-Heptanone | 4-Methyl-2-heptanol | 16.5 | 105 | 31 |
| Example 29 | Re-14 | 90 | T-29 | 90 | 90 | 90 | Butyl acetate | 4-Methyl-2-heptanol | 16.1 | 103 | 35 |
| Example 30 | Re-9 | 90 | T-30 | 90 | 70 | 80 | Butyl acetate | 4-Methyl-2-heptanol | 15.9 | 105 | 35 |
| Example 31 | Re-15 | 85 | T-31 | 90 | 85 | 90 | Butyl acetate | 4-Methyl-2-heptanol | 16.2 | 104 | 34 |
| Example 32 | Re-6 | 90 | T-32 | 90 | 95 | 80 | Butyl acetate/2-heptanone (70/30) | 4-Methyl-2-heptanol | 16.4 | 105 | 33 |
| Example 33 | Re-15 | 90 | T-33 | 90 | 70 | 95 | Butyl acetate | 4-Methyl-2-heptanol | 17.9 | 120 | 36 |
| Example 34 | Re-6 | 90 | T-34 | 90 | 90 | 90 | Butyl acetate | 4-Methyl-2-heptanol | 18.1 | 123 | 33 |
| Example 35 | Re-15 | 90 | T-35 | 90 | 90 | 90 | Butyl acetate | 4-Methyl-2-heptanol | 18.1 | 119 | 31 |
| Example 36 | Re-15 | 90 | T-36 | 90 | 85 | 80 | Butyl acetate | 4-Methyl-2-heptanol | 17.9 | 117 | 37 |
| Example 37 | Re-6 | 85 | T-37 | 100 | 70 | 80 | Butyl acetate | 4-Methyl-2-heptanol | 17.2 | 113 | 35 |
| Example 38 | Re-15 | 90 | T-38 | 110 | 95 | 90 | Butyl acetate | 4-Methyl-2-heptanol | 15.9 | 105 | 34 |
| Example 39 | Re-9 | 90 | T-39 | 90 | 70 | 80 | Butyl acetate | 4-Methyl-2-heptanol | 18.8 | 120 | 32 |
| Example 40 | Re-15 | 90 | T-1 | 90 | 90 | 95 | Butyl acetate/butyl propionate (70/30) | 4-Methyl-2-heptanol | 19.0 | 119 | 33 |
| Example 41 | Re-13 | 70 | T-17 | 90 | 50 | 90 | Butyl acetate | 4-Methyl-2-heptanol/n-decane (50/50) | 18.1 | 122 | 34 |
| Example 42 | Re-15 | 90 | T-40 | 90 | 90 | 90 | Butyl acetate | 4-Methyl-2-heptanol | 19.1 | 122 | 32 |
| Example 43 | Re-5 | 85 | T-41 | 80 | 90 | 90 | Butyl acetate | 4-Methyl-2-heptanol | 18.9 | 123 | 34 |

TABLE 5-continued

| | Resist composition | Thickness [nm] of resist film | Topcoat composition | PB temperature [° C.] | Thickness [nm] of topcoat | PEB temperature [° C.] | Organic developer (mass ratio) | Rinsing liquid (mass ratio) | EL [%] | DOF [nm] | Sensitivity [mJ/cm$^2$] |
|---|---|---|---|---|---|---|---|---|---|---|---|
| Example 44 | Re-9 | 95 | T-42 | 60 | 100 | 90 | Butyl acetate | 4-Methyl-2-heptanol | 19.0 | 118 | 33 |
| Example 45 | Re-11 | 90 | T-43 | 70 | 110 | 95 | Butyl acetate | 4-Methyl-2-heptanol | 17.8 | 118 | 36 |
| Example 46 | Re-15 | 90 | T-44 | 70 | 90 | 95 | Butyl acetate | 4-Methyl-2-heptanol | 17.6 | 124 | 33 |
| Example 47 | Re-1 | 90 | T-45 | 50 | 90 | 90 | Butyl acetate | 4-Methyl-2-heptanol | 17.9 | 118 | 31 |
| Example 48 | Re-8 | 85 | T-46 | 100 | 100 | 80 | Butyl propionate | 4-Methyl-2-heptanol | 18.1 | 121 | 32 |
| Example 49 | Re-11 | 90 | T-47 | 90 | 90 | 90 | Butyl acetate | n-Decane | 17.8 | 118 | 36 |
| Example 50 | Re-4 | 90 | T-48 | 60 | 90 | 80 | Butyl acetate | 4-Methyl-2-heptanol | 17.7 | 117 | 35 |
| Example 51 | Re-15 | 95 | T-49 | 90 | 90 | 90 | Butyl acetate | 4-Methyl-2-heptanol | 18.0 | 120 | 33 |
| Example 52 | Re-14 | 90 | T-50 | 90 | 90 | 85 | Butyl acetate | 4-Methyl-2-heptanol | 17.9 | 119 | 33 |
| Example 53 | Re-9 | 90 | T-51 | 85 | 90 | 90 | Butyl acetate | 4-Methyl-2-heptanol | 18.1 | 120 | 36 |
| Example 54 | Re-15 | 90 | T-52 | 90 | 90 | 90 | Butyl acetate | 4-Methyl-2-heptanol | 19.0 | 121 | 32 |
| Comparative Example 1 | Re-11 | 90 | TC-1 | 90 | 90 | 90 | Butyl acetate | 4-Methyl-2-heptanol | 15.3 | 102 | 42 |

As shown in Table 5, in Examples 1 to 54, EL, DOF, and the sensitivity were good, as compared with Comparative Example 1.

Furthermore, in a case where Examples 1 to 54 are compared with each other, in Examples 1 to 22, 24, 33 to 37, and 39 to 54 in which the compounds A-1 to A-17, A-19, A-28 to A-32, and A-34 to A-38 were used in the topcoat composition, EL and DOF were better, as compared with Examples 23, 25 to 32, and 38 in which the compounds A-18, A-20 to A-27, and A-33 were used.

Moreover, in a case where Examples 1 to 22, 24, 33 to 37, and 39 to 54 in which EL and DOF were better are compared with each other in Examples 1 to 22, 33 to 36, and 39 to 54 in which the compounds A-1 to A-17, and A-28 to A-31, A-34 to A-38 were used, EL and DOF were better, as compared with Example 24 in which the compound A-19 was used and Example 37 in which the compound A-32 was used.

In addition, even in a case where the developer was changed to a 2.38%-by-mass aqueous tetramethylammonium hydroxide solution under the same condition as in Examples 1 to 54, it was found that a good resist pattern was formed. Here, evaluation was carried out after providing a step of releasing the topcoat with butyl acetate immediately before the development.

What is claimed is:

1. A composition for forming an upper layer film, which is applied onto a resist film formed using an actinic ray-sensitive or radiation-sensitive resin composition, the composition for forming an upper layer film comprising:
   a resin X including a repeating unit represented by formula (II); and
   a compound A having a nitrogen-oxygen bond and a radical trapping group, the compound A being represented by any one of General Formulae (1) to (3),

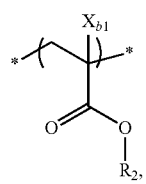
(II)

wherein in formula (II), $X_{b1}$ represents a hydrogen atom, an alkyl group, a cyano group, or a halogen atom, and $R_2$ represents a group selected from the group consisting of a branched alkyl group having 3 to 20 carbon atoms, a monocyclic cycloalkyl group and a polycyclic cycloalkyl group,

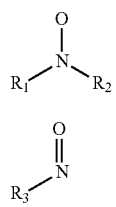
(1)

(2)

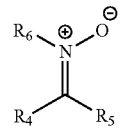
(3)

wherein in General Formulae (1) to (3), $R_1$ to $R_6$ each independently represents an alkyl group, a cycloalkyl group, or an aryl group, in Formula (1), $R_1$ and $R_2$ may be bonded to each other to form a ring, and in Formula (3), at least two of $R_4$, $R_5$ or $R_6$ may be bonded to each other to form a ring.

2. The composition for forming an upper layer film according to claim 1,
   wherein the compound A having a nitrogen-oxygen bond and a radical trapping group is a compound having at least one group selected from the group consisting of a hindered phenol group, a hydroquinone group, an N-oxyl-free radical group, a nitroso group, and a nitrone group.

3. The composition for forming an upper layer film according to claim 1,
   wherein the resin X includes a repeating unit having at least three $CH_3$ partial structures in the side chain moiety.

4. The composition for forming an upper layer film according to claim 2,
   wherein the resin X includes a repeating unit having at least three $CH_3$ partial structures in the side chain moiety.

5. A composition for forming an upper layer film, which is applied onto a resist film formed using an actinic ray-sensitive or radiation-sensitive resin composition, the composition for forming an upper layer film comprising:
   a resin X including a repeating unit represented by formula (II);
   a compound A having a nitrogen-oxygen bond and a radical trapping group, the compound A being represented by any one of General Formulae (1) to (3), and
   a compound being any one of
      a low molecular compound having a nitrogen atom and a group capable of leaving by an action of an acid,
      a compound represented by formula (BS-1), and
      a compound containing at least one bond or group selected from the group consisting of an ether bond, a thioether bond, and a hydroxyl group,

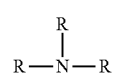
(BS-1)

wherein in formula (BS-1),
   each R independently represents a hydrogen atom or an organic group, and
   at least one of three R's is an organic group, the organic group being a linear or branched alkyl group, a monocyclic or polycyclic cycloalkyl group, an aryl group, or an aralkyl group,

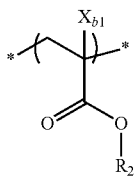

wherein in formula (II), $X_{b1}$ represents a hydrogen atom, an alkyl group, a cyano group, or a halogen atom, and $R_2$ represents a group selected from the group consisting of a branched alkyl group having 3 to 20 carbon atoms, a monocyclic cycloalkyl group and a polycyclic cycloalkyl group,

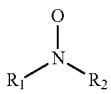

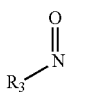

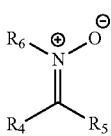

wherein in General Formulae (1) to (3), $R_1$ to $R_6$ each independently represents an alkyl group, a cycloalkyl group, or an aryl group, in Formula (1), $R_1$ and $R_2$ may be bonded to each other to form a ring, and in Formula (3), at least two of $R_4$, $R_5$ or $R_6$ may be bonded to each other to form a ring.

6. The composition for forming an upper layer film according to claim 1, wherein the resin X includes two or more of the repeating units represented by formula (II).

7. The composition for forming an upper layer film according to claim 1, wherein the resin X further includes a fluorine atom.

8. The composition for forming an upper layer film according to claim 1, wherein the resin X further includes a repeating unit having an monocyclic or polycyclic cycloalkyl group, and wherein in formula (II), $R_2$ represents a branched alkyl group having 3 to 20 carbon atoms.

9. The composition for forming an upper layer film according to claim 5, wherein the resin X further includes a repeating unit having an monocyclic or polycyclic cycloalkyl group, and wherein in formula (II), $R_2$ represents a branched alkyl group having 3 to 20 carbon atoms.

10. The composition for forming an upper layer film according to claim 5, wherein in formula (BS-1), each R independently represents a linear or branched alkyl group or a monocyclic or polycyclic cycloalkyl group.

11. A pattern forming method comprising:
applying an actinic ray-sensitive or radiation-sensitive resin composition onto a substrate to form a resist film;
applying the composition for forming an upper layer film according to claim 1 onto the resist film to form an upper layer film on the resist film;
exposing the resist film having the upper layer film formed thereon; and
developing the exposed resist film using a developer including an organic solvent to form a pattern.

12. A resist pattern formed by the pattern forming method according to claim 11.

13. A method for manufacturing an electronic device, comprising:
the pattern forming method according to claim 11.

\* \* \* \* \*